United States Patent
Kimura et al.

(10) Patent No.: US 11,727,873 B2
(45) Date of Patent: Aug. 15, 2023

(54) SEMICONDUCTOR DEVICE AND METHOD FOR OPERATING SEMICONDUCTOR DEVICE

(71) Applicant: Semiconductor Energy Laboratory Co., Ltd., Atsugi (JP)

(72) Inventors: Kiyotaka Kimura, Isehara (JP); Hidetomo Kobayashi, Isehara (JP); Takayuki Ikeda, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 124 days.

(21) Appl. No.: 17/440,811

(22) PCT Filed: Apr. 28, 2020

(86) PCT No.: PCT/IB2020/053962
§ 371 (c)(1),
(2) Date: Sep. 20, 2021

(87) PCT Pub. No.: WO2020/229920
PCT Pub. Date: Nov. 19, 2020

(65) Prior Publication Data
US 2022/0189398 A1 Jun. 16, 2022

(30) Foreign Application Priority Data
May 10, 2019 (JP) .................. 2019-089656

(51) Int. Cl.
*G09G 3/32* (2016.01)
*H03G 3/00* (2006.01)
(Continued)

(52) U.S. Cl.
CPC ....... *G09G 3/3233* (2013.01); *H01L 27/1225* (2013.01); *G09G 3/3275* (2013.01);
(Continued)

(58) Field of Classification Search
CPC ............... G09G 3/3233; G09G 3/3275; G09G 2300/0465; G09G 2310/0291;
(Continued)

(56) References Cited

U.S. PATENT DOCUMENTS 6,414,619 B1 * 7/2002 Swanson ............... H03M 1/187
341/139
7,750,881 B2 7/2010 Yen
(Continued)

FOREIGN PATENT DOCUMENTS

CN 104966479 A 10/2015
CN 105007051 A 10/2015
(Continued)

OTHER PUBLICATIONS

International Search Report (Application No. PCT/IB2020/053962) dated Jul. 28, 2020.
(Continued)

*Primary Examiner* — Pegeman Karimi
(74) *Attorney, Agent, or Firm* — Robinson Intellectual Property Law Office; Eric J. Robinson

(57) ABSTRACT

A semiconductor device with low power consumption is provided. A semiconductor device that operates at high speed is provided. A semiconductor device with a small circuit area is provided. A novel semiconductor device is provided. In the semiconductor device, a signal line is electrically connected to a plurality of pixels between a first node and a second node; an amplifier circuit has a function of amplifying a supplied current and supplying the amplified current to the first node; an analog-to-digital converter circuit has a function of converting a potential of the first node into a first signal, and a function of converting a potential of the second node into a second signal; a sensing circuit has a function of comparing the first signal and the second signal and generating a third signal; and the current amplification factor of the amplifier circuit is determined in accordance with the third signal.

7 Claims, 26 Drawing Sheets

(51) Int. Cl.
  *G09G 3/3233* (2016.01)
  *H01L 27/12* (2006.01)
  *G09G 3/3275* (2016.01)
  *H10K 59/12* (2023.01)

(52) U.S. Cl.
  CPC ............... *G09G 2300/0465* (2013.01); *G09G 2310/0291* (2013.01); *G09G 2320/0252* (2013.01); *G09G 2320/041* (2013.01); *G09G 2330/021* (2013.01); *H10K 59/12* (2023.02)

(58) Field of Classification Search
  CPC ..... G09G 2320/0252; G09G 2320/041; G09G 2330/021; G09G 3/3648; G09G 3/20; G09G 3/3674; H01L 27/1225; H01L 29/78648; H01L 29/7869; H01L 29/78696; H10K 59/12; H05B 33/02
  See application file for complete search history.

(56) References Cited

U.S. PATENT DOCUMENTS

| | | | |
|---|---|---|---|
| 9,496,408 B2 | 11/2016 | Yamazaki et al. | |
| 9,692,374 B2 | 6/2017 | Saeki | |
| 10,235,960 B2 | 3/2019 | Kim | |
| 10,878,750 B2 | 12/2020 | Kimura et al. | |
| 2008/0094267 A1* | 4/2008 | Yen | H03G 1/0088 341/155 |
| 2015/0310822 A1* | 10/2015 | Saeki | G09G 3/3688 330/253 |
| 2017/0154577 A1* | 6/2017 | Lee | G09G 3/3275 |
| 2017/0358269 A1* | 12/2017 | Kim | H02N 2/04 |
| 2018/0166009 A1 | 6/2018 | Sun et al. | |
| 2021/0295780 A1 | 9/2021 | Ikeda et al. | |

FOREIGN PATENT DOCUMENTS

| | | |
|---|---|---|
| CN | 107507550 A | 12/2017 |
| JP | 2005-115144 A | 4/2005 |
| JP | 2008-104140 A | 5/2008 |
| JP | 2014-007399 A | 1/2014 |
| JP | 2015-211266 A | 11/2015 |
| JP | 2017-223948 A | 12/2017 |
| KR | 10-1731032 | 4/2017 |
| TW | 200820630 | 5/2008 |
| WO | WO-2017/008491 | 1/2017 |

OTHER PUBLICATIONS

Written Opinion (Application No. PCT/IB2020/053962) dated Jul. 28, 2020.

* cited by examiner

FIG. 13A
FIG. 13B
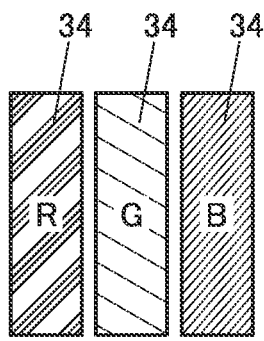
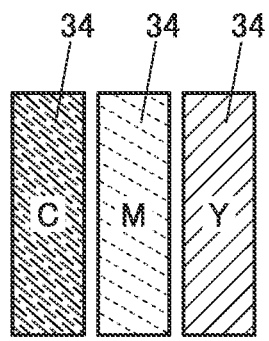
FIG. 13C
FIG. 13D
FIG. 13E
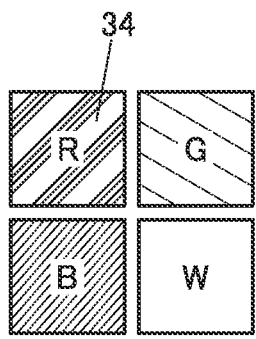
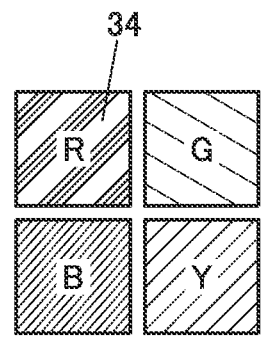
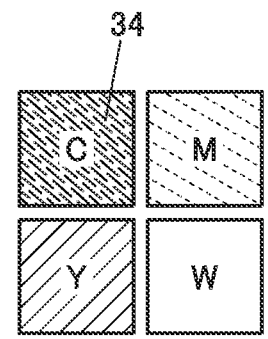

SEMICONDUCTOR DEVICE AND METHOD FOR OPERATING SEMICONDUCTOR DEVICE

TECHNICAL FIELD

One embodiment of the present invention relates to a semiconductor device and a method for operating the same, and an electronic device. One embodiment of the present invention relates to a display device and a method for operating the same. One embodiment of the present invention relates to a method for manufacturing a display device. One embodiment of the present invention relates to a transistor and a method for manufacturing the transistor.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof. A semiconductor device generally means a device that can function by utilizing semiconductor characteristics.

BACKGROUND ART

As a semiconductor material that can be used in a transistor, an oxide semiconductor using a metal oxide has been attracting attention. For example, Patent Document 1 discloses a semiconductor device that achieves increased field-effect mobility (simply referred to as mobility or µFE in some cases) by stacking a plurality of oxide semiconductor layers, containing indium and gallium in an oxide semiconductor layer serving as a channel in the plurality of oxide semiconductor layers, and making the proportion of indium higher than the proportion of gallium.

A metal oxide that can be used for a semiconductor layer can be formed by a sputtering method or the like, and thus can be used for a semiconductor layer of a transistor included in a large display device. In addition, capital investment can be reduced because part of production equipment for a transistor using polycrystalline silicon or amorphous silicon can be retrofitted and utilized. A transistor using a metal oxide has field-effect mobility higher than that in the case where amorphous silicon is used; hence, a high-performance display device provided with driver circuits can be obtained.

In addition, as display devices for augmented reality (AR) or virtual reality (VR), wearable display devices and stationary display devices are becoming increasingly common. Examples of wearable display devices include a head mounted display (HMD) and an eyeglass-type display device. Examples of stationary display devices include a head-up display (HUD).

REFERENCE

Patent Document

[Patent Document 1] Japanese Published Patent Application No. 2014-7399

SUMMARY OF THE INVENTION

Problems to be Solved by the Invention

An object of one embodiment of the present invention is to provide a semiconductor device with low power consumption. Another object of one embodiment of the present invention is to provide a semiconductor device that operates at high speed. Another object of one embodiment of the present invention is to provide a semiconductor device with a small circuit area. Another object of one embodiment of the present invention is to provide a semiconductor device including highly dense display elements. Another object of one embodiment of the present invention is to provide a semiconductor device including a large number of display elements. Another object of one embodiment of the present invention is to provide a display device including a large number of pixels. Another object of one embodiment of the present invention is to provide a high-definition display device. Another object of one embodiment of the present invention is to provide an inexpensive semiconductor device. Another object of one embodiment of the present invention is to provide a highly reliable semiconductor device. Another object of one embodiment of the present invention is to provide a small semiconductor device. Another object of one embodiment of the present invention is to provide a display device that can display a high-resolution image. Another object of one embodiment of the present invention is to provide a display device that can display a high-quality image. Another object of one embodiment of the present invention is to provide a display device that can display a highly realistic image. Another object of one embodiment of the present invention is to provide a display device that can display a high-luminance image. Another object of one embodiment of the present invention is to provide a display device with a high dynamic range. Another object of one embodiment of the present invention is to provide a display device with a narrow frame. Another object of one embodiment of the present invention is to provide a novel semiconductor device. Another object of one embodiment of the present invention is to provide a novel method for operating a semiconductor device. Another object of one embodiment of the present invention is to provide a novel display device. Another object of one embodiment of the present invention is to provide a novel method for operating a display device. Another object of one embodiment of the present invention is to provide a novel electronic device.

Note that the description of these objects does not preclude the existence of other objects. One embodiment of the present invention does not have to achieve all these objects. Note that other objects can be derived from the description of the specification, the drawings, the claims, and the like.

Means for Solving the Problems

One embodiment of the present invention is a semiconductor device including a signal line, a plurality of pixels, an analog-to-digital converter circuit, a sensing circuit, and an amplifier circuit. The signal line includes a first node and a second node. The signal line is electrically connected to the plurality of pixels between the first node and the second node. The amplifier circuit has a function of amplifying a supplied current and supplying the amplified current to the first node. The analog-to-digital converter circuit has a function of converting a potential of the first node into a first signal, and a function of converting a potential of the second node into a second signal. The sensing circuit has a function of comparing the first signal and the second signal and generating a third signal. The current amplification factor of the amplifier circuit is determined in accordance with the third signal.

In the above structure, it is preferred that each of the plurality of pixels include a transistor including a metal oxide in a channel formation region, and that the metal oxide contain an element M (M is Al, Ga, Y, or Sn) and Zn.

In the above structure, each of the plurality of pixels preferably includes a display element.

In the above structure, at least one of the analog-to-digital converter circuit, the sensing circuit, and the amplifier circuit preferably includes a transistor including silicon in a channel formation region.

In the above structure, at least one of the analog-to-digital converter circuit, the sensing circuit, and the amplifier circuit preferably includes a region overlapping with at least one of the plurality of pixels.

Another embodiment of the present invention is a semiconductor device in which a first layer and a second layer are stacked. The first layer includes n source driver circuits arranged in a matrix (n is an integer greater than or equal to 2). The second layer includes n blocks arranged in a matrix. Each of the n blocks includes a signal line and a plurality of pixels electrically connected to the signal line. The j-th source driver circuit (j is an integer greater than or equal to 1 and less than or equal to n) is electrically connected to one end and the other end of the signal line included in the j-th block. The j-th source driver circuit has a function of amplifying supplied image data with a desired amplification factor and supplying the amplified image data to the one end of the signal line included in the j-th block. The j-th source driver circuit has a function of comparing potentials of the one end and the other end of the signal line included in the j-th block, and determining the amplification factor in accordance with a result of the comparison.

In the above structure, it is preferred that each of the plurality of pixels include a transistor including a metal oxide in a channel formation region, and that the metal oxide contain an element M (M is Al, Ga, Y, or Sn) and Zn.

In the above structure, each of the n source driver circuits preferably includes a transistor including silicon in a channel formation region.

The above structure preferably includes a region where a distance seen from above between the j-th source driver circuit and the j-th block is less than or equal to 30 μm.

Another embodiment of the present invention is a semiconductor device including a signal line, a plurality of pixels each including a wiring, an analog-to-digital converter circuit, a sensing circuit, and an amplifier circuit. The signal line includes a first region and a second region. Each of the wirings included in the plurality of pixels includes a region overlapping with the signal line, between the first region and the second region of the signal line. The amplifier circuit includes a first input terminal supplied with an image signal, a second input terminal supplied with a signal determining an amplification factor of the amplifier circuit, and a first output terminal that outputs the amplified image signal and is electrically connected to the first region. The analog-to-digital converter circuit includes a third input terminal electrically connected to the first region, a fourth input terminal electrically connected to the second region, and a second output terminal electrically connected to the sensing circuit. The sensing circuit includes a third output terminal electrically connected to the second input terminal.

In the above structure, the analog-to-digital converter circuit preferably has a function of outputting a signal corresponding to a potential difference between the first region and the second region.

Another embodiment of the present invention is an imaging device including a finder including a display portion using the semiconductor device described in any of the above embodiments, and a lens.

Another embodiment of the present invention is a head-mounted display including a display portion including the semiconductor device described in any of the above embodiments, a lens, and a band-shaped fixing unit.

In the head-mounted display having the above structure, the display portion is preferably curved.

Another embodiment of the present invention is a method for operating a semiconductor device in which a first layer and a second layer are stacked. The first layer includes an analog-to-digital converter circuit, a sensing circuit, an amplifier circuit, a current adjustment portion, and a current generator circuit. The second layer includes a signal line and a plurality of pixels. The amplifier circuit includes a first input terminal, a second input terminal, and an output terminal. The signal line includes a first node and a second node. The signal line is electrically connected to the plurality of pixels between the first node and the second node. The first node and the second node are electrically connected to the analog-to-digital converter circuit. The analog-to-digital converter circuit is electrically connected to the sensing circuit. The output terminal of the amplifier circuit is electrically connected to the first node. The first input terminal of the amplifier circuit is supplied with an image signal. The second input terminal of the amplifier circuit is electrically connected to the current adjustment portion. The current generator circuit is electrically connected to the current adjustment portion. The method includes a first step of supplying a potential of the first node and a potential of the second node to the analog-to-digital converter circuit; a second step in which the analog-to-digital converter circuit converts the potential of the first node and the potential of the second node into a first signal and a second signal, respectively, and supplies the first signal and the second signal to the sensing circuit; a third step in which the sensing circuit compares the first signal and the second signal and supplies a third signal corresponding to a result of the comparison to the current adjustment portion; a fourth step of supplying a current to the second input terminal of the amplifier circuit from the current generator circuit through the current adjustment portion; and a fifth step of supplying an amplified image signal to the first node from the output terminal of the amplifier circuit.

In the above structure, it is preferred that the image signal be a signal obtained by converting a k-bit digital signal (k is an integer greater than or equal to 2) into an analog value, the first signal and the second signal be each an m-bit digital signal (m is an integer greater than or equal to 1), and k be larger than m.

In the above structure, it is preferred that the first signal and the second signal match in the third step, and that the current supplied to the second input terminal be reduced in the fourth step.

In the above structure, it is preferred that each of the plurality of pixels include a transistor including a metal oxide in a channel formation region, and that the metal oxide contain an element M (M is Al, Ga, Y, or Sn) and Zn.

In the above structure, each of the plurality of pixels preferably includes a display element.

In the above structure, at least one of the analog-to-digital converter circuit, the sensing circuit, and the amplifier circuit preferably includes a transistor including silicon in a channel formation region.

Effect of the Invention

According to one embodiment of the present invention, a semiconductor device with low power consumption can be provided. According to one embodiment of the present invention, a semiconductor device that operates at high speed can be provided. According to one embodiment of the present invention, a semiconductor device with a small circuit area can be provided. According to one embodiment of the present invention, a semiconductor device including highly dense display elements can be provided. According to one embodiment of the present invention, a semiconductor device including a large number of display elements can be provided. According to one embodiment of the present invention, a display device including a large number of pixels can be provided. According to one embodiment of the present invention, a high-definition display device can be provided. According to one embodiment of the present invention, an inexpensive semiconductor device can be provided. According to one embodiment of the present invention, a highly reliable semiconductor device can be provided. According to one embodiment of the present invention, a small semiconductor device can be provided. According to one embodiment of the present invention, a display device that can display a high-resolution image can be provided. According to one embodiment of the present invention, a display device that can display a high-quality image can be provided. According to one embodiment of the present invention, a display device that can display a highly realistic image can be provided. According to one embodiment of the present invention, a display device that can display a high-luminance image can be provided. According to one embodiment of the present invention, a display device with a high dynamic range can be provided. According to one embodiment of the present invention, a display device with a narrow frame can be provided. According to one embodiment of the present invention, a novel semiconductor device can be provided. According to one embodiment of the present invention, a novel method for operating a semiconductor device can be provided. According to one embodiment of the present invention, a novel display device can be provided. According to one embodiment of the present invention, a novel method for operating a display device can be provided. According to one embodiment of the present invention, a novel electronic device can be provided.

Note that the description of these effects does not preclude the existence of other effects. One embodiment of the present invention does not have to have all of these effects. Other effects can be derived from the description of the specification, the drawings, the claims, and the like.

BRIEF DESCRIPTION OF THE DRAWINGS

FIG. 13A, FIG. 13B, FIG. 13C, FIG. 13D, and FIG. 13E show examples of pixels.

MODE FOR CARRYING OUT THE INVENTION

Figure 1A:
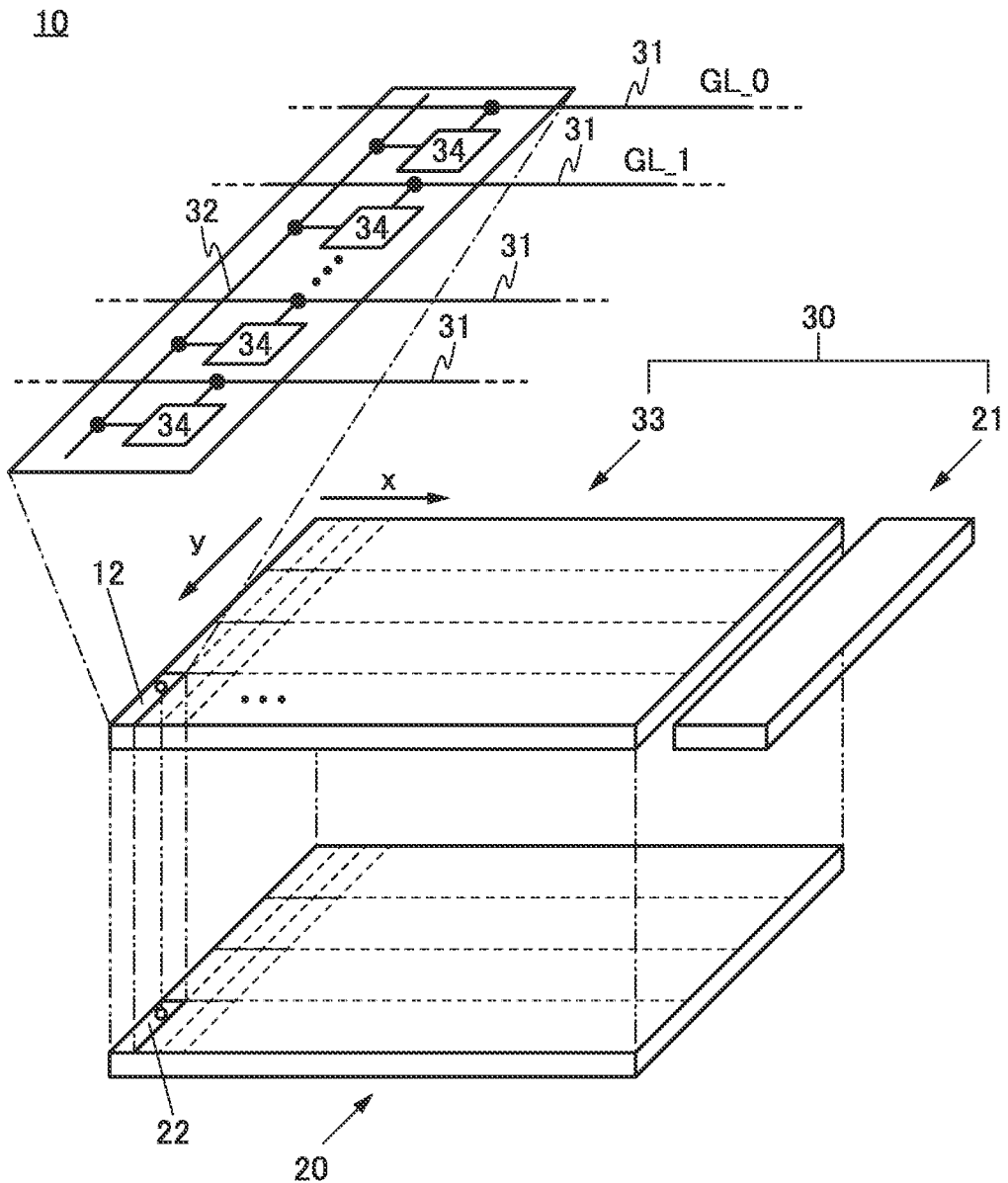
FIG. 1A is a diagram illustrating an example of a semiconductor device.

Hereinafter, embodiments will be described with reference to the drawings. Note that the embodiments can be implemented with many different modes, and it is readily understood by those skilled in the art that modes and details thereof can be changed in various ways without departing from the spirit and scope thereof. Thus, the present invention should not be interpreted as being limited to the description of the embodiments below.

In each drawing described in this specification, the size, the layer thickness, or the region of each component is exaggerated for clarity in some cases.

Furthermore, ordinal numbers such as "first," "second," and "third" used in this specification are used in order to avoid confusion among components and do not limit the components numerically.

In this specification and the like, terms for describing arrangement, such as "over" and "under", are used for convenience in describing a positional relation between components with reference to drawings. The positional relation between components is changed as appropriate in accordance with a direction in which the components are described. Thus, without limitation to terms described in this specification, the description can be changed appropriately depending on the situation.

In this specification and the like, functions of a source and a drain of a transistor are sometimes switched from each other depending on the polarity of the transistor, the case where the direction of current flow is changed in circuit operation, or the like. Therefore, the terms "source" and "drain" can be used interchangeably.

In this specification and the like, "electrically connected" includes the case where connection is made through an "object having any electric function". There is no particular limitation on the "object having any electric function" as long as electric signals can be transmitted and received between components that are connected through the object. Examples of the "object having any electric function" include a switching element such as a transistor, a resistor, an inductor, a capacitor, and other elements with a variety of functions as well as an electrode and a wiring.

In this specification and the like, the term "film" and the term "layer" can be interchanged with each other. For example, in some cases, the term "conductive layer" and the term "insulating layer" can be interchanged with the term "conductive film" and the term "insulating film," respectively.

Furthermore, unless otherwise specified, an off-state current in this specification and the like refers to a drain current of a transistor in an off state (also referred to as a non-conduction state or a cutoff state). Unless otherwise specified, an off state refers to a state where the voltage $V_{gs}$ between a gate and a source is lower than the threshold voltage $V_{th}$ in an n-channel transistor (higher than $V_{th}$ in a p-channel transistor).

In the drawings, the size, the layer thickness, or the region is exaggerated for clarity in some cases. Therefore, they are not limited to the illustrated scale. Note that the drawings are schematic views illustrating ideal examples, and embodiments of the present invention are not limited to shapes or values shown in the drawings. For example, in an actual manufacturing process, a layer, a resist mask, or the like might be unintentionally reduced in size by treatment such as etching, which might not be reflected in the drawings for easy understanding. Note that in drawings, the same reference numerals are used for the same portions or portions having similar functions in different drawings, and repeated description thereof is omitted in some cases. Furthermore, the same hatch pattern is used for the portions having similar functions, and the portions are not especially denoted by reference numerals in some cases.

In this specification and the like, a metal oxide is an oxide of metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, an OS FET can also be called a transistor including an oxide or an oxide semiconductor.

In this specification and the like, the terms "electrode" and "wiring" do not functionally limit these components. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, a "terminal" in an electric circuit refers to a portion that inputs or outputs current, inputs or outputs voltage, or receives or transmits a signal. Accordingly, part of a wiring or an electrode functions as a terminal in some cases.

Embodiment 1

In this embodiment, a semiconductor device of one embodiment of the present invention will be described.

One embodiment of the present invention relates to a semiconductor device in which a first layer and a second layer are stacked. The first layer includes a first circuit having a function of supplying a signal to a pixel provided in the second layer, and the second layer includes a region where a plurality of pixels are arranged in a matrix. The first circuit is provided to include a region overlapping with the region. Thus, the semiconductor device of one embodiment of the present invention can be reduced in size.

Another embodiment of the present invention is a semiconductor device including a source driver circuit provided in a first layer and a display portion provided in a second layer. The source driver is provided to include a region overlapping with the display portion, whereby the semiconductor device can operate at high speed, for example, compared to a semiconductor device in which a source driver circuit does not overlap with a display portion. Thus, the definition of the display portion in the semiconductor device of one embodiment of the present invention can be made higher than that of the semiconductor device in which the source driver circuit does not overlap with the display portion. For example, the pixel density of the display portion in the semiconductor device of one embodiment of the present invention can be 1000 ppi or higher, 5000 ppi or higher, or 10000 ppi.

<Structure Example 1 of Semiconductor Device>

FIG. 1A is a block diagram illustrating a structure example of a semiconductor device 10. The semiconductor device 10 includes a layer 20 and a layer 30 stacked over the layer 20.

An interlayer insulating layer can be provided between the layer 20 and the layer 30. Although FIG. 1A illustrates an example in which the layer 30 is stacked over the layer 20, the layer 20 may alternatively be formed over the layer 30, for example, in the semiconductor device of one embodiment of the present invention.

A semiconductor element is provided in each of the layer 20 and the layer 30. Specifically, for example, a transistor is provided in each of the layer 20 and the layer 30. The distance in the thickness direction between a semiconductor layer included in the transistor provided in the layer 20 and a semiconductor layer included in the transistor provided in the layer 30 is, for example, 30 µm or less, 20 µm or less, or 15 µm or less.

The layer 20 includes a plurality of source driver circuits 22. The plurality of source driver circuits 22 are arranged in a matrix, for example.

The layer 30 includes a pixel array 33 and a gate driver circuit 21. The pixel array 33 functions as a display portion, for example. A plurality of blocks 12 and a plurality of wirings 31 are arranged in the pixel array 33. The plurality of blocks 12 are arranged in a matrix, for example. The block 12 includes a plurality of pixels 34 and one wiring 32. The wiring 32 is electrically connected to the plurality of pixels 34.

In the example shown in FIG. 1A, the pixels arranged in one column are divided into four groups, and each of the divided groups constitutes the block 12. Four blocks 12 are arranged in one column. Here, "arranged in one column" means being arranged in the y direction shown in FIG. 1A, for example.

One of the source driver circuits 22 is electrically connected to one of the blocks 12. Preferably, the source driver circuit 22 and the block 12 that are electrically connected to each other have an overlap region as illustrated in FIG. 1A. Further preferably, the number of blocks 12 and the number of source driver circuits 22 are the same. Still further preferably, the number of blocks 12 arranged in the x direction and the number of source driver circuits 22 arranged in the x direction are the same. Still further preferably, the number of blocks 12 arranged in the y direction and the number of source driver circuits 22 arranged in the y direction are the same.

The pixels 34 in one row are electrically connected to the gate driver circuit 21 through the wiring 31. One wiring 31 electrically connects the pixels 34 in the same row across a plurality of blocks 12, for example. The wiring 31 has a function of a scan line, and the wiring 32 has a function of a signal line (sometimes referred to as a data line).

Alternatively, the pixels 34 in one row may be electrically connected to each other by two or more wirings 31. That is, one pixel 34 may be electrically connected to two or more scan lines. For example, one pixel 34 may include two or more transistors, and different wirings 31 may be electrically connected to respective gates of the transistors. Alternatively, one wiring 31 may be electrically connected to the pixels 34 in two or more rows. That is, one wiring 31 may be shared by the pixels 34 in two or more rows.

The gate driver circuit 21 has a function of generating a signal for controlling the operation of the pixel 34 and supplying the signal to the pixel 34 through the wiring 31. The source driver circuit 22 has a function of supplying a signal to the pixel 34 through the wiring 32.

Although FIG. 1A illustrates an example in which the gate driver circuit 21 is provided in the layer 30, the gate driver circuit 21 may alternatively be provided in the layer 20.

The pixel array 33 can function as a display portion when the pixel array 33 is supplied with image signals from the source driver circuit 22 and is supplied with signals, for example, scan signals from the gate driver. The display portion has a function of displaying an image corresponding to image signals supplied to the pixels 34 from the source driver circuit 22, for example. Specifically, light with luminance corresponding to the image signals is emitted from the pixels 34, whereby an image is displayed on the pixel array 33.

In FIG. 1A, the positional relation between the layer 20 and the layer 30 is shown by dashed double-dotted lines. An open circle in the layer 20 and an open circle in the layer 30 that are connected with a dashed double-dotted line overlap each other. Note that the same representation may be used in other diagrams.

Stacking the source driver circuit 22 and the block 12 to have an overlap region allows the semiconductor device 10 to have a narrower frame and a smaller size. Here, a frame refers to, for example, a circuit region other than the pixel array 33.

In the case where the source driver circuit 22 and the pixel array 33 do not overlap, the source driver circuit 22 is provided outside the pixel array 33, for example. Meanwhile, in the semiconductor device of one embodiment of the present invention, the source driver circuit 22 and the pixel array 33 are provided in the respective layers that overlap each other, whereby the semiconductor device can operate at high speed, for example, compared to the case where the source driver circuit 22 and the pixel array 33 do not overlap. Thus, the resolution of the pixel array 33 can be further increased. For example, the pixel density in one embodiment of the present invention can be 1000 ppi or higher, 5000 ppi or higher, or 10000 ppi or higher.

Figure 2A:
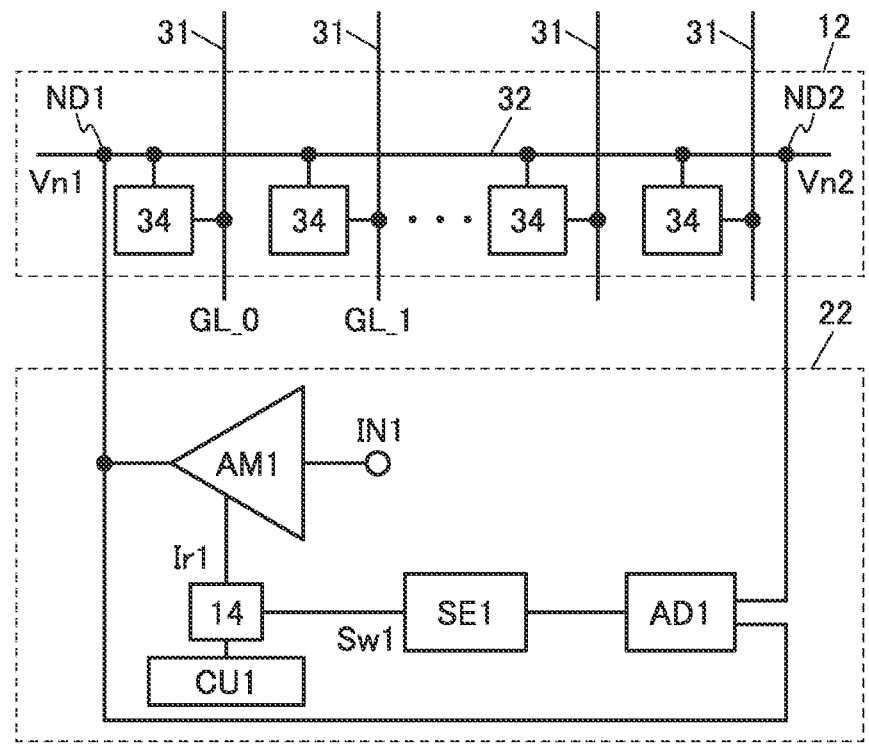
FIG. 2A is an example of a circuit diagram.
Figure 2B:
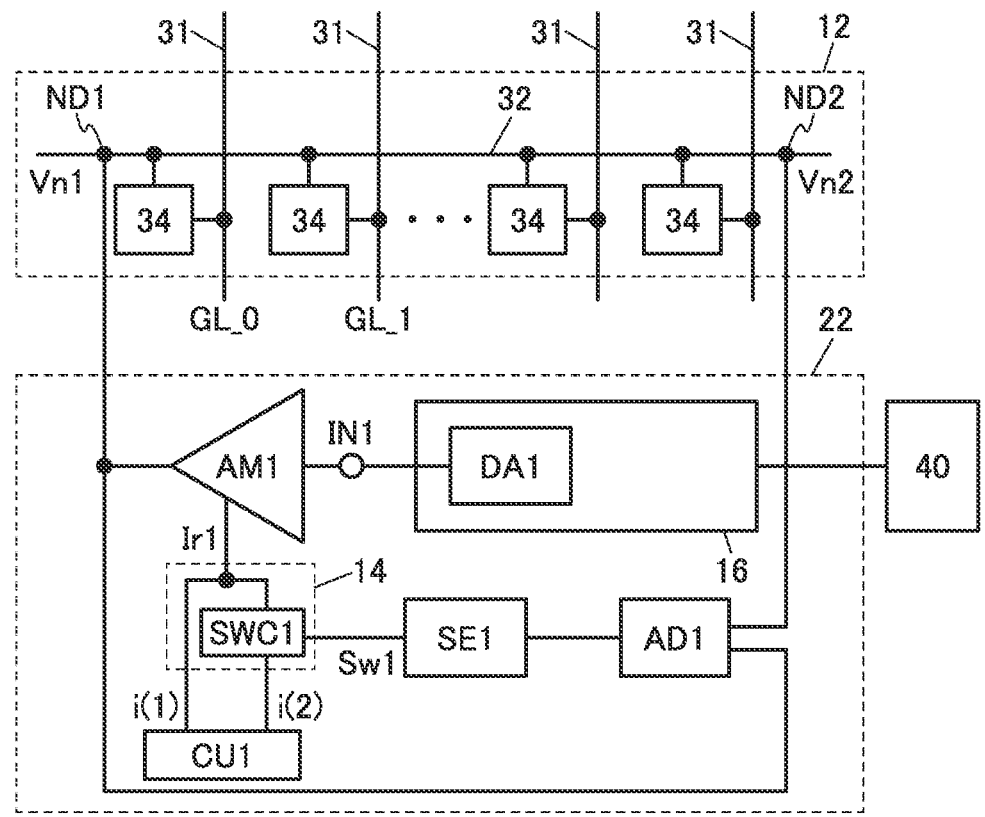
FIG. 2B is an example of a circuit diagram.

FIG. 2A and FIG. 2B are circuit diagrams of the block 12 and the source driver circuit 22.

The source driver circuit 22 includes an analog-to-digital converter circuit AD1, a sensing circuit SE1, an amplifier circuit AM1, and a current adjustment portion 14.

The source driver circuit 22 preferably includes a current generator circuit CU1. The current generator circuit CU1 has a function of supplying a current to the amplifier circuit AM1 through the current adjustment portion 14. The current supplied to the amplifier circuit AM1 from the current generator circuit CU1 through the current adjustment portion 14 (hereinafter current Ir1) is sometimes referred to as a reference current.

Instead of being included in the source driver circuit 22, the current generator circuit CU1 may be included in another circuit provided in the semiconductor device 10. Moreover, the current generator circuit CU1 is not necessarily provided in each of the source driver circuits 22, for example. For instance, a plurality of source driver circuits 22 may use a common current generator circuit CU1.

The plurality of pixels 34 included in the block 12 are connected sequentially in a region between one end and the other end of the wiring 32.

The wiring 32 includes a first region and a second region. Each of the wirings 31 that are electrically connected to the pixels 34 included in the block 12 includes, for example, a region overlapping the wiring 32 in a region between the first region and the second region. FIG. 4C is a top view illustrating an example of arrangement of the wiring 32 and a plurality of wirings 31 electrically connected to the pixels 34. The wiring 32 includes a region 37 and a region 38. The plurality of wirings 31 each include a region overlapping the wiring 32 in a region between the region 37 and the region 38. Although FIG. 4C illustrates an example where the wiring 32 has a linear shape in the region between the region 37 and the region 38, the wiring 32 does not necessarily have a linear shape in the region between the region 37 and the region 38. For example, the wiring 32 may have a curved shape in the region between the region 37 and the region 38. Moreover, the wiring 32 may have an angle in the region between the region 37 and the region 38.

In FIG. 2A and FIG. 2B, the plurality of pixels 34 included in the block 12 are electrically connected to the wiring 32 between a node ND1 and a node ND2. The node ND1 may refer to the first region (e.g., the region 37 in FIG. 4C), for example. The node ND2 may refer to the second region (e.g., the region 38 in FIG. 4C), for example.

Figure 1B:
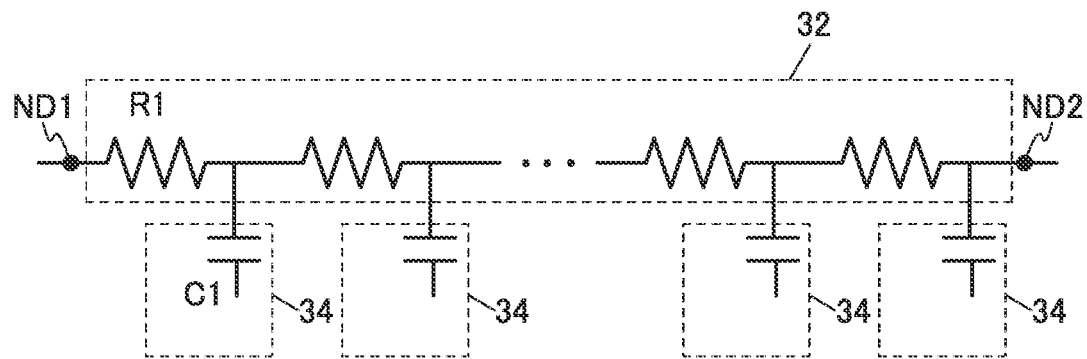
FIG. 1B is an example of a circuit diagram.

FIG. 1B illustrates an example of resistance and capacitance between the node ND1 and the node ND2. The wiring resistance of the wiring 32 is denoted by a resistance R1, and parasitic capacitance due to the pixel 34 electrically connected to the wiring 32 is denoted by a capacitance C1. Between the node ND1 and the node ND2, for example, the resistance R1 is generated by routing of the wiring 32, for instance, and the capacitance C1 is generated by parasitic capacitance electrically connected to the wiring 32. Since the wiring 32 has such a resistance component and a capacitance component, it takes a certain finite time after a potential is supplied to the node ND1 until the potential of the node ND2 becomes equal to that potential. A phenomenon in which a potential is supplied to the node ND1 of the wiring 32 and the potential of the node ND2 becomes equal to that potential may be referred to as charging of the wiring 32 in this specification and the like.

The amplifier circuit AM1 has a function of amplifying a signal supplied to a terminal IN1 and supplying the amplified signal to the node ND1 of the wiring 32.

The analog-to-digital converter circuit AD1 is electrically connected to the node ND1, the node ND2, and the sensing circuit SE1.

A signal is supplied to the node ND1 and written to a pixel selected from the plurality of pixels 34. A potential corresponding to the signal is stored in the wiring 32. When charging is terminated, the potential of the node ND2 is substantially equal to the potential of the node ND1. The time required for charging is shortened, whereby the write speed can be increased.

The potential of the node ND1 and the potential of the node ND2 are sensed and compared to each other, whereby the state of charging the wiring 32 can be obtained.

When the difference between the potential of the node ND1 and the potential of the node ND2 is large, power for charging the wiring 32 needs to be higher than that when the difference is small. In the semiconductor device of one embodiment of the present invention, power for charging is increased when the difference between the potential of the node ND1 and the potential of the node ND2 is large, and power for charging is decreased when the difference is small; thus, the write speed can be increased while power consumption is kept low.

In the semiconductor device of one embodiment of the present invention, the potentials of the node ND1 and the node ND2 are sensed and compared to each other using the sensing circuit SE1. Here, if the length of the wiring from the node ND1 and the node ND2 to the sensing circuit SE1 is too long in the semiconductor device, a load due to routing of the wiring increases, and there are concerns such as increase in power consumption and delay up to the sensing circuit SE1. For example, in the case where the source driver circuit 22 does not overlap with the pixel array 33 and is provided outside the pixel array 33, the length of the wiring from the node ND1 and the node ND2 to the sensing circuit SE1 is long in some cases. On the other hand, the semiconductor device of one embodiment of the present invention has a structure in which the layer 20 including the source driver circuits 22 provided with the sensing circuits SE1 and the layer 30 including the blocks 12 overlap each other vertically, and preferably has a region where the block 12 and the source driver circuit 22 corresponding to the block 12 overlap each other, for example; thus, the length of the wiring from the node ND1 and the node ND2 to the sensing circuit SE1 can be short.

In the semiconductor device of one embodiment of the present invention, dividing the pixels arranged in one column into groups can shorten their distance to the sensing circuit SE1. FIG. 1A illustrates an example where the pixels arranged in one column are divided into four groups; however, the pixels may be divided into three or less groups or into five or more groups. The number of groups into which the pixels are divided is greater than or equal to 2 and less than or equal to 10, preferably greater than or equal to 3 and less than or equal to 6, for example. Note that in the case where the number of pixels is smaller, for example, 140 million or less or 40 million or less, the pixels are not necessarily divided into groups.

Power for charging is adjusted, for example, by adjusting the current amplification factor, impedance conversion factor, and the like of the amplifier circuit AM1.

An image signal, for example, is supplied to the terminal IN1 of the amplifier circuit AM1. Preferably, the current of the supplied image signal is amplified by the amplifier circuit AM1 while its voltage remains constant. Note that a wiring supplied with a signal is referred to as a terminal in some cases.

In the semiconductor device of one embodiment of the present invention, the amplifier circuit AM1 has a function of performing impedance conversion. The amplifier circuit AM1 preferably has a function of outputting impedance that is lower than the input impedance, for example. A voltage follower can be used as the amplifier circuit AM1. Note that in the case where a circuit including a differential input circuit is used as the amplifier circuit, the offset voltage of the differential input circuit is preferably 0 V or a voltage that is as close to 0 V as possible.

By increasing the difference between the input impedance and the output impedance in the amplifier circuit AM1, the current value of a signal supplied to the node ND1 increases and the speed of writing the signal to the pixel 34 can be increased. Meanwhile, as the difference between the input impedance and the output impedance increases, power consumption of the amplifier circuit AM1 increases. For example, when the value of the current Ir1 is increased, the difference between the input impedance and the output impedance increases, and accordingly, power consumption of the amplifier circuit AM1 increases. For example, when the value of the current Ir1 is decreased, power consumption of the amplifier circuit AM1 decreases.

The layer 20 includes a first wiring that is electrically connected to the amplifier circuit AM1 and provided in the layer 20, for example. The first wiring is electrically connected to an output terminal of the amplifier circuit AM1, for example. The first wiring includes a region overlapped by the wiring 32, for example. The first wiring includes a region overlapped by the region 37 in FIG. 4C, for example.

The first wiring is electrically connected to the region 37 through a first plug provided in an insulating layer provided between the layer 20 and the layer 30, for example. The region 37 includes a region overlapping the first plug, for example.

The layer 20 includes a second wiring that is electrically connected to the analog-to-digital converter circuit AD1 and provided in the layer 20, for example. The second wiring is electrically connected to an input terminal of the analog-to-digital converter circuit AD1, for example. The second wiring includes a region overlapped by the wiring 32, for example. The second wiring includes a region overlapped by the region 38 in FIG. 4C, for example.

The second wiring is electrically connected to the region 38 through a second plug provided in the insulating layer provided between the layer 20 and the layer 30, for example. The region 38 includes a region overlapping the second plug, for example.

An example of a structure including the sensing circuit SE1 and the analog-to-digital converter circuit AD1 will be described in detail below.

The potential of the node ND1 is denoted by a potential Vn1, and the potential of the node ND2 is denoted by a potential Vn2. The sensing circuit SE1 has a function of outputting a signal corresponding to the difference between the potential Vn1 and the potential Vn2. For example, the sensing circuit SE1 outputs a first signal when the difference between the potential Vn1 and the potential Vn2 is larger than a certain value, and outputs a second signal when the difference is smaller than or equal to the certain value. For example, one of the first signal and the second signal is one of a high-potential signal and a low-potential signal, and the other of the first signal and the second signal is the other of the high-potential signal and the low-potential signal.

The analog-to-digital converter circuit AD1 has a function of converting an analog signal into a digital signal. In the semiconductor device of one embodiment of the present invention, the potential Vn1 and the potential Vn2 are converted into digital values using the analog-to-digital converter circuit AD1. The result obtained by converting the potential Vn1 by the analog-to-digital converter circuit AD1 is denoted by a potential Dn1, and the result obtained by converting the potential Vn2 by the analog-to-digital converter circuit AD1 is denoted by a potential Dn2. The sensing circuit SE1 has a function of comparing the potential Dn1 and the potential Dn2 and outputting a signal based on the comparison result. The output of the analog-to-digital converter circuit AD1 is supplied to the sensing circuit SE1, for example.

Here, the potential Vn1 and the potential Vn2 are converted into discrete values. Thus, when the potential Vn1 and the potential Vn2 are different but close values, the converted digital values (i.e., the potential Dn1 and the potential Dn2) match in some cases.

As the number of bits of digital values output from the analog-to-digital converter circuit AD1 is smaller, the converted digital values are more likely to match in some cases even when the difference between the potential Vn1 and the potential Vn2 is larger.

By reducing the number of bits of digital values output from the analog-to-digital converter circuit AD1, the structure of the analog-to-digital converter circuit AD1 can be more simplified and power consumption of the analog-to-digital converter circuit AD1 can be reduced in some cases. Moreover, the area of the analog-to-digital converter circuit AD1 can be reduced.

The expression "the potential Dn1 and the potential Dn2 match" means, for example, that the difference between the potential Vn1 and the potential Vn2 is small (specifically, the difference is smaller than the interval between discrete values, for instance) or there is no difference. When the difference between the potential Vn1 and the potential Vn2 is small or there is no difference, power for charging the wiring 32 is reduced. Accordingly, the output from the amplifier circuit AM1 is made small. Thus, for example, when the sensing circuit SE1 senses that the potential Dn1 and the potential Dn2 match, a signal for reducing the current Ir1, for instance, is supplied to the current adjustment portion 14.

The current adjustment portion 14 has a function of outputting the current Ir1 using a current supplied from the current generator circuit CU1. The current Ir1 is adjusted in accordance with a signal supplied from the sensing circuit SE1.

FIG. 2B illustrates an example where the current adjustment portion 14 includes a switch SWC1. A current i(1) and a current i(2) are output from the current generator circuit CU1. The current i(1) is supplied to the amplifier circuit AM1, and the current i(2) is supplied to the switch SWC1. The current i(2) is supplied to the amplifier circuit AM1 through the switch SWC1 when the switch SWC1 is on, and the current i(2) is not supplied to the amplifier circuit AM1 when the switch SWC1 is off. The current adjustment portion 14 can adjust the current Ir1 supplied to the amplifier circuit AM1 by controlling the state of the switch SWC1.

In FIG. 2B, the output of the sensing circuit SE1 is supplied to the switch SWC1. The state of the switch SWC1 is controlled in accordance with a signal from the sensing circuit SE1. For example, when the sensing circuit SE1 senses that the potential Dn1 and the potential Dn2 match, a desired signal, for instance, a low-potential signal is supplied to the switch SWC1, so that the switch SWC1 is turned off and the value of current supplied to the amplifier circuit AM1 is reduced.

As illustrated in FIG. 2B, the source driver circuit 22 includes a circuit 16, for example. The circuit 16 includes a digital-to-analog converter circuit DA1. In FIG. 2B, the semiconductor device 10 includes a circuit 40.

The circuit 40 is provided in the layer 20, for example. For example, the circuit 40 is provided outside the source driver circuit group where the plurality of source driver circuits 22 are provided. Alternatively, the circuit 40 may be provided between the plurality of source driver circuits. The semiconductor device 10 may include a plurality of circuits 40.

The total number of circuits 40 is preferably smaller than total number of source driver circuits 22. For example, one circuit 40 is preferably provided for a plurality of source driver circuits 22.

A signal is supplied to the circuit 16 from the circuit 40, and the signal is supplied to the input terminal of the amplifier circuit AM1 from the digital-to-analog converter circuit DA1 included in the circuit 16.

The circuit 40 has a function of receiving data that is generated by the source driver circuit 22 and serves as a base for a signal supplied to the pixel array and generating a digital signal using the received data, for example. The signal generated in the circuit 40 is stored in a register or the like included in the circuit 16, for example. The digital-to-analog converter circuit DA1 included in the circuit 16 has a function of converting the digital signal generated by the circuit 40 into an analog signal. The circuit 40 also has a function of a control circuit that generates a start pulse signal, a clock signal, and the like. An example of the data that the circuit 40 receives is image data, and an image signal supplied to the pixel array 33 is generated in the circuit 40 and the circuit 16 using the image data.

The circuit 16 may include some of the components included in the circuit 40.

The circuit 40 may include some of the components included in the source driver circuit 22. For example, the current generator circuit CU1 may be provided in the circuit 40 instead of the source driver circuit 22.

Here, the number of bits of digital signals generated by the analog-to-digital converter circuit AD1 is preferably smaller than the number of bits of digital signals generated by the circuit 40. The number of bits of the analog-to-digital converter circuit AD1 is m (m is an integer of 1 or more), and the number of bits of digital signals generated by the circuit 40 is k (k is an integer of 2 or more). For example, when m is more than or equal to 8 and less than or equal to 12, m is more than or equal to 2 and less than or equal to 4, for instance.

[Operation Example 1 of Semiconductor Device]

Figure 3A:
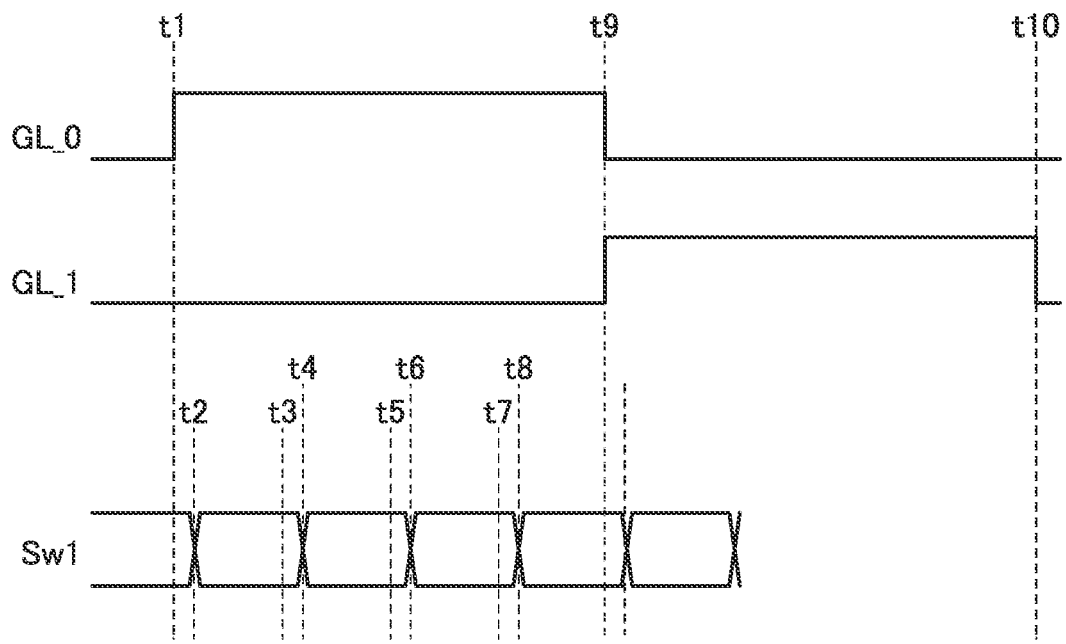
FIG. 3A is a diagram illustrating an operation example of a semiconductor device.

FIG. 3A is a timing chart showing an example of the operation of the semiconductor device of one embodiment of the present invention. A signal GL_0 represents a signal supplied to the wiring 31 connected to a first pixel among the plurality of pixels 34 included in the block 12. A signal GL_1 represents a signal supplied to the wiring 31 connected to a second pixel among the plurality of pixels 34 included in the block 12. A signal Sw1 represents an output signal from the sensing circuit SE1 to the current adjustment portion 14.

At Time t1, the signal GL_0 becomes a high potential, the signal GL_1 is a low potential, and the first pixel is selected. A period from Time t1 to Time t9 is a period during which the first pixel is selected.

Next, at Time t9, the signal GL_0 becomes a low potential, the signal GL_1 becomes a high potential, and the second pixel is selected. A period from Time t9 to Time t10 is a period during which the second pixel is selected.

In the period from Time t1 to Time t9, the potential Dn1 and the potential Dn2 are compared to each other in the sensing circuit SE1. In FIG. 3A, the potential Dn1 and the potential Dn2 are compared to each other in a total of four periods, that is, a period from Time t1 to Time t2, a period from Time t3 to Time t4, a period from Time t5 to Time t6, and a period from Time t7 to Time t8.

A value corresponding to the comparison result of the potential Dn1 and the potential Dn2 is output as the signal Sw1.

Figure 3B:
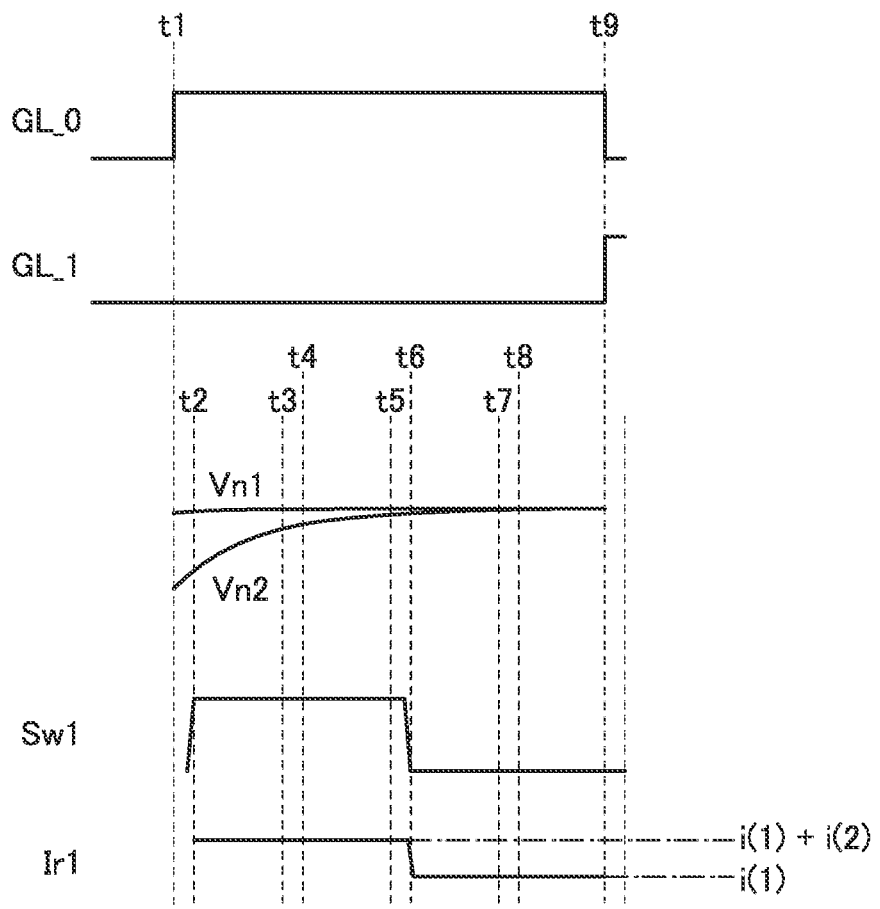
FIG. 3B is a diagram illustrating an operation example of a semiconductor device.

FIG. 3B shows an example of the potential Vn1 and the potential Vn2 and an example of a signal output as the signal Sw1.

In the period from Time t1 to Time t2, the difference between the potential Vn1 and the potential Vn2 is large, the converted digital values (the potential Dn1 and the potential Dn2) do not match, and a high-potential signal is output as the signal Sw1. In the source driver circuit 22 illustrated in FIG. 2B, the switch SWC1 is turned on, and the current Ir1 becomes the sum of the current i(1) and the current i(2) when there is no current loss due to the switch SWC1.

Next, in the period from Time t3 to Time t4, although the difference between the potential Vn1 and the potential Vn2 decreases, the converted digital values (the potential Dn1 and the potential Dn2) do not match, and a high-potential signal is output as the signal Sw1.

Then, in the period from Time t5 to Time t6, the difference between the potential Vn1 and the potential Vn2 becomes small, the converted digital values (the potential Dn1 and the potential Dn2) match, and a low-potential signal is output as the signal Sw1. In the source driver circuit 22 illustrated in FIG. 2B, the switch SWC1 is turned off, and the current Ir1 becomes the current i(1).

Next, in the period from Time t7 to Time t8, the potential Vn1 and the potential Vn2 substantially match, the converted digital values (the potential Dn1 and the potential Dn2) also match, and a low-potential signal is output as the signal Sw1.

[Example of Converter Circuit]

Figure 4A:
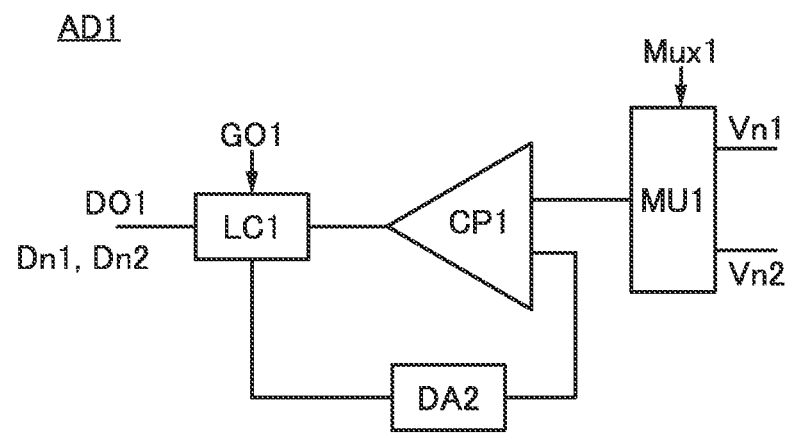
FIG. 4A is an example of a circuit diagram.

FIG. 4A illustrates an example of the analog-to-digital converter circuit AD1. The analog-to-digital converter circuit AD1 illustrated in FIG. 4A includes a multiplexer MU1, a comparator CP1, a digital-to-analog converter circuit DA2, and a logic circuit LC1.

The multiplexer MU1 is electrically connected to one of the input terminals, for example, a non-inverting input terminal of the comparator CP1. The digital-to-analog converter circuit DA2 is electrically connected to the other of the input terminals, for example, an inverting input terminal of the comparator CP1. The logic circuit LC1 is electrically connected to the digital-to-analog converter circuit DA2 and an output terminal of the comparator CP1.

The logic circuit LC1 has a function of holding m-bit digital values and supplying the data to the digital-to-analog converter circuit DA2 and the sensing circuit SE1.

The digital-to-analog converter circuit DA2 has a function of converting a digital value supplied from the logic circuit LC1 into an analog value and supplying the analog value to the input terminal of the comparator CP1.

The multiplexer MU1 has a function of sequentially selecting signals that are input thereto and supplying the signals to the input terminal of the comparator. In the example shown in FIG. 4A, the potential Vn1 and the potential Vn2 are input to the multiplexer MU1. Which input signal is selected by the multiplexer MU1 is controlled using a signal Mux1. Here, the multiplexer MU1 selects the potential Vn1 when the signal Mux1 is a high-potential signal, and selects the potential Vn2 when the signal Mux1 is a low-potential signal.

The comparator CP1 compares a signal supplied from the multiplexer MU1 and a signal supplied from the digital-to-analog converter circuit DA2, and supplies an output signal based on the comparison result to the logic circuit LC1. The logic circuit LC1 analyzes the output signal supplied from the comparator CP1, converts the potential Vn1 into a digital value, and outputs the conversion result as a signal DO1. Next, the logic circuit LC1 converts the potential Vn2 into a digital value and outputs the conversion result as the signal DO1. The signal DO1 is supplied to the sensing circuit SE1.

[Example of Sensing Circuit]

Figure 4B:
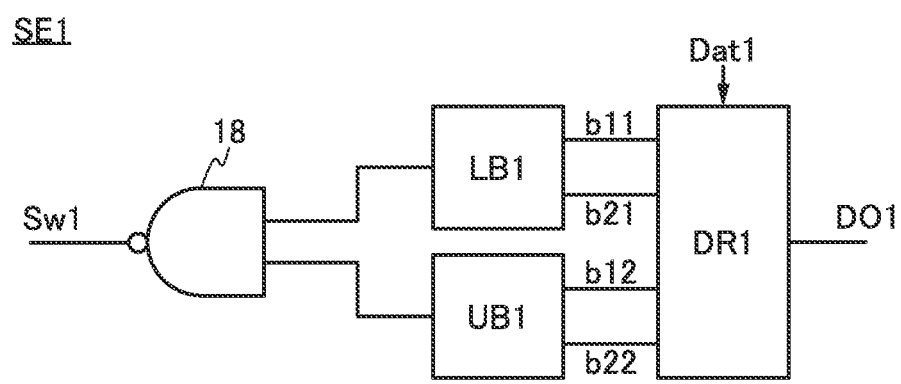
FIG. 4B is an example of a circuit diagram.
Figure 4C:
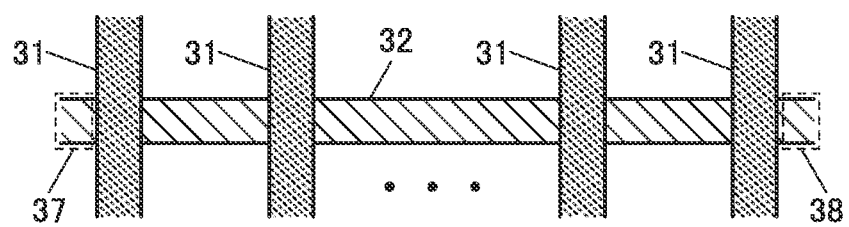
FIG. 4C is an example of a top view of wirings.

FIG. 4B illustrates an example of the sensing circuit SE1. The sensing circuit SE1 illustrated in FIG. 4B includes a register DR1, a circuit LB1, a circuit UB1, and a NAND circuit 18.

The register DR1 is electrically connected to the circuit LB1 and the circuit UB1. The circuit LB1 and the circuit UB1 are electrically connected to the NAND circuit 18.

The register DR1 has a function of holding the signal DO1 supplied from the analog-to-digital converter circuit AD1 and outputting the signal DO1 to the circuit LB1 and the circuit UB1.

The description is made below on an example where the potential Dn1 and the potential Dn2 are sequentially supplied as the signal DO1 and each of the potential Dn1 and the potential Dn2 is 2-bit data. The circuit LB1 is supplied with data b11 and data b21 from the register DR1, and the circuit UB1 is supplied with the data b21 and data b22 from the register DR1. The data b11 is the low order bit of the potential Dn1, the data b21 is the low order bit of the potential Dn2, data b12 is the high order bit of the potential Dn1, and the data b22 is the high order bit of the potential Dn2.

The circuit LB1 supplies an output corresponding to the comparison result of the data b11 and the data b21 to the NAND circuit 18, and the circuit UB1 supplies an output corresponding to the comparison result of the data b12 and the data b22 to the NAND circuit 18. For example, when the data match, a high-potential signal is output. The output of the NAND circuit 18 is supplied to the current adjustment portion 14 as the signal Sw1. For example, when both the circuit LB1 and the circuit UB1 supply a high-potential signal to the NAND circuit 18, a low-potential signal is output from the NAND circuit 18.

Here, an example where the signal DO1 has 2 bits is described; in the case where the signal DO1 has 3 bits or more, the structure illustrated in FIG. 4A can be used by arranging the structures in parallel, for example.

[Operation Example 2 of Semiconductor Device]

Figure 5:
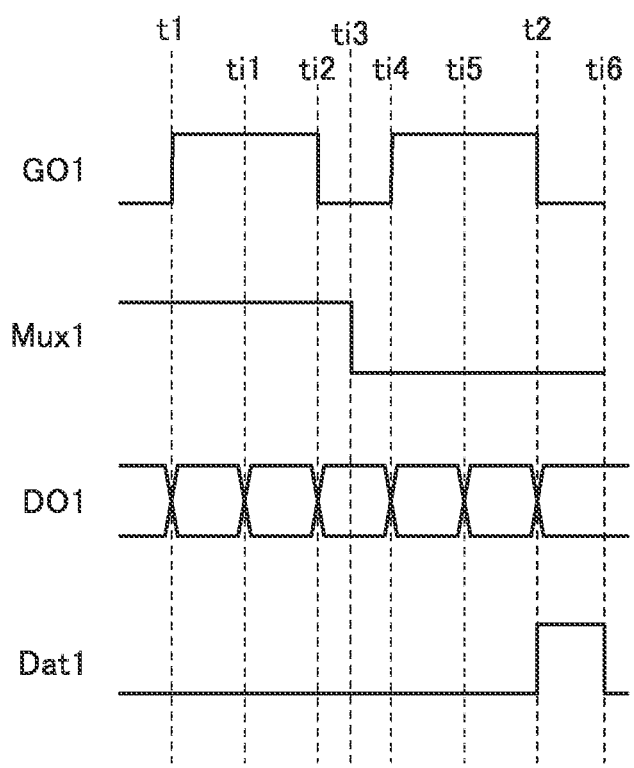
FIG. 5 is a diagram illustrating an operation example of a semiconductor device.

FIG. 5 is a timing chart showing an example of the operation in the period from Time t1 to Time t2 and a period from Time t2 to Time ti6 (Time ti6 is a time between Time t2 and Time t3) in the case where the analog-to-digital converter circuit AD1 illustrated in FIG. 4A and the sensing circuit SE1 illustrated in FIG. 4B are used in the timing chart shown in FIG. 3A.

A signal GO1 is a signal supplied to the logic circuit LC1. When a high-potential signal is supplied as the signal GO1 to the logic circuit LC1, data is converted in the analog-to-digital converter circuit AD1.

At Time t1, the signal GO1 rises and becomes a high-potential signal. Moreover, at Time t1, a high-potential signal is supplied as the signal Mux1 to the multiplexer MU1, and the potential Vn1 is supplied to the input terminal of the comparator CP1. The potential Vn1 is converted in the analog-to-digital converter circuit AD1, and the register DR1 is supplied with the high order bit of the potential Dn1 in a period from Time t1 to Time ti1 and supplied with the low order bit of the potential Dn1 in a period from Time ti1 to Time ti2. The register DR1 stores the supplied data.

At Time ti2, the signal GO1 changes from a high-potential signal to a low-potential signal.

At Time ti3, the signal Mux1 changes from a high-potential signal to a low-potential signal, and the potential Vn2 is supplied to the input terminal of the comparator CP1. The potential Vn2 is converted in the analog-to-digital converter circuit AD1.

At Time ti4, the signal GO1 rises and becomes a high-potential signal. The register DR1 is supplied with the high order bit of the potential Dn2 in a period from Time ti4 to Time ti5 and supplied with the low order bit of the potential Dn2 in a period from Time ti5 to Time t2. The register DR1 stores the supplied data.

At Time t2, a signal Dat1 rises and becomes a high-potential signal, and the data stored in the register DR1 are supplied to the circuit LB1 and the circuit UB1. The circuit LB1 and the circuit UB1 each supply an output corresponding to the supplied data to the NAND circuit 18. An output signal from the NAND circuit 18 is supplied to the current adjustment portion 14 as the signal Sw1.

At Time ti6, the signal Dat1 changes from a high-potential signal to a low-potential signal.

[Examples of Circuits]

Figure 6A:
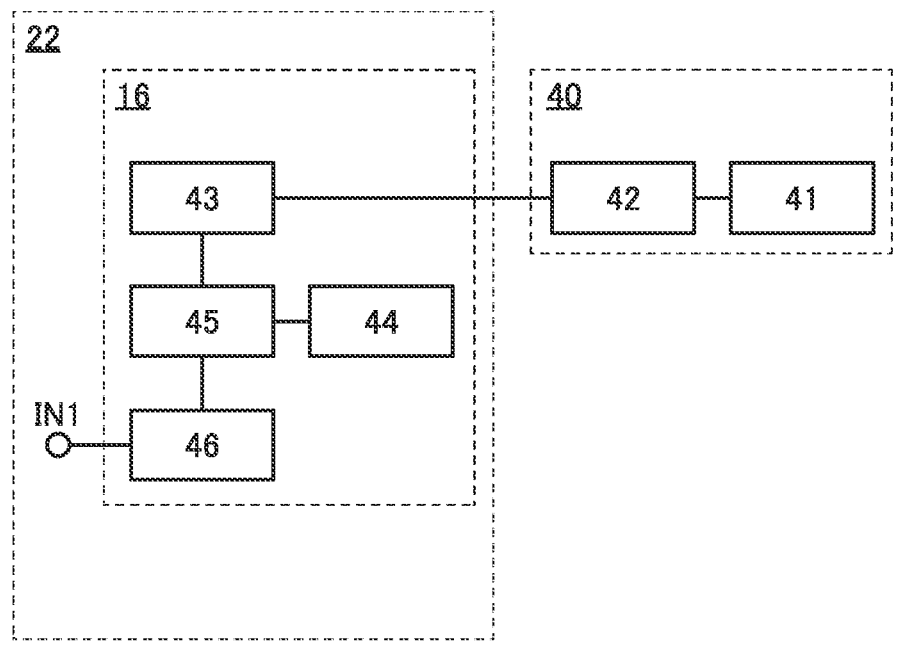
FIG. 6A is an example of a block diagram.

FIG. 6A is a block diagram illustrating a structure example of the circuit 40 and the circuit 16 included in the source driver circuit 22. For simplicity, the components included in the source driver circuit 22 other than the circuit 16 are omitted. Although FIG. 6A illustrates only one circuit 16, the circuit 40 can be electrically connected to a plurality of circuits 16.

The circuit 40 includes a receiver circuit 41 and a serial-to-parallel converter circuit 42. The circuit 16 included in the source driver circuit 22 includes a buffer circuit 43, a shift register circuit 44, a latch circuit 45, and a digital-to-analog converter circuit 46.

The receiver circuit 41 is electrically connected to the serial-to-parallel converter circuit 42. The serial-to-parallel converter circuit 42 is electrically connected to the buffer circuit 43. The buffer circuit 43 is electrically connected to the latch circuit 45. The shift register circuit 44 is electrically connected to the latch circuit 45. The latch circuit 45 is electrically connected to the digital-to-analog converter circuit 46. Note that a start pulse, a clock signal, and the like are supplied to the shift register circuit, for example. A circuit that generates a start pulse, a clock signal, and the like may be provided in the circuit 40, for example.

The receiver circuit 41 has a function of receiving image data that serves as a base for an image signal generated by the source driver circuit 22. The image data can be single-ended image data. When the receiver circuit 41 receives image data with the use of a data transmitting signal based on LVDS (Low Voltage Differential Signaling) or the like, the receiver circuit 41 may have a function of converting the received signal into a signal based on a standard that can undergo internal processing.

The serial-to-parallel converter circuit 42 has a function of performing parallel conversion of single-ended image data output from the receiver circuit 41. Providing the serial-to-parallel converter circuit 42 in the circuit 40 allows image data and the like to be transmitted from the circuit 40 to the source driver circuit 22 and the like even if the load is large at the time of transmitting image data and the like from the circuit 40 to the source driver circuit 22 and the like.

The buffer circuit 43 can be a unity gain buffer, for example. The buffer circuit 43 has a function of outputting data identical to image data output from the serial-to-parallel converter circuit 42. With the buffer circuit 43 provided in the source driver circuit 22, even if a potential corresponding to image data output from the serial-to-parallel converter circuit 42 is decreased by wiring resistance or the like when being transmitted from the circuit 40 to the source driver circuit 22, a potential corresponding to the decrease amount can be recovered. Accordingly, the decrease in driving capability of the source driver circuit 22 and the like can be inhibited even if the load is large at the time of transmitting image data and the like from the circuit 40 to the source driver circuit 22 and the like.

The shift register circuit 44 has a function of generating a signal for controlling the operation of the latch circuit 45. The latch circuit 45 has a function of holding or outputting image data output from the buffer circuit 43. Whether the latch circuit 45 holds or outputs image data is selected in accordance with a signal supplied from the shift register circuit 44. Note that in the circuit 16, a level shifter may be provided between the latch circuit 45 and the digital-to-analog converter circuit 46. The level shifter has a function of boosting a signal output from the latch circuit 45 and outputting the boosted signal.

The digital-to-analog converter circuit 46 has a function of converting digital image data, which is output from the latch circuit 45, into an analog image signal.

Figure 6B:
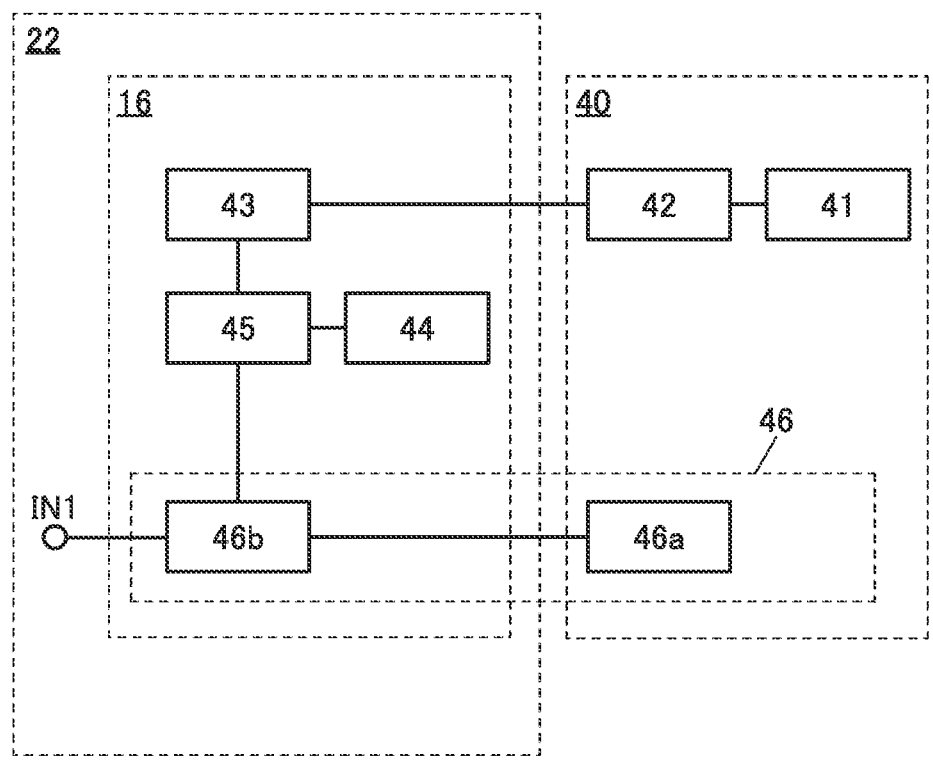
FIG. 6B is an example of a block diagram.

As illustrated in FIG. 6B, some of the components of the digital-to-analog converter circuit 46 may be provided in the circuit 40. The digital-to-analog converter circuit 46 illustrated in FIG. 6B includes a potential generator circuit 46*a* and a logic circuit 46*b*. The potential generator circuit 46*a* is provided in the circuit 40, and the logic circuit 46*b* is provided in the circuit 16.

The potential generator circuit 46*a* has a function of generating potentials that correspond to the number of bits of image data capable of being subjected to D/A conversion and supplying the potentials to the logic circuit 46*b*.

The logic circuit 46*b* has a function of receiving data from the latch circuit 45 and outputting any of the potentials generated by the potential generator circuit 46*a* on the basis of the digital value of the received data. As the logic circuit 46*b*, a pass transistor logic circuit or the like can be used, for example.

As illustrated in FIG. 6B, the circuits constituting the digital-to-analog converter circuit 46 can be provided in both the source driver circuit 22 and the circuit 40. Specifically, a circuit that is preferably provided in each source driver circuit, such as the logic circuit 46b, can be provided in the source driver circuit 22, and a circuit that is not necessarily provided in each source driver circuit, such as the potential generator circuit 46a, can be provided in the circuit 40. In that case, the area occupied by the source driver circuit 22 can be reduced as compared with the case where all circuits constituting the digital-to-analog converter circuit 46 are provided in the source driver circuit 22, for example; hence, the number of source driver circuits 22 provided in the layer 20 can be increased. Thus, the number of pixels in the pixel array 33 provided in the layer 30 can be increased, and high-speed operation, reduction in power consumption, increase in definition of the pixel array, and the like of the semiconductor device of one embodiment of the present invention can be achieved. Here, the components of a circuit other than the digital-to-analog converter circuit 46 can also be provided in both the source driver circuit 22 and the circuit 40.

In the case where the circuits constituting the digital-to-analog converter circuit 46 are provided in both the source driver circuit 22 and the circuit 40 as illustrated in FIG. 6B, the semiconductor device 10 can be configured to include one potential generator circuit 46a and logic circuits 46b as many as the source driver circuits 22, for example.

In the circuit 40, a variety of circuits can be provided in addition to the receiver circuit 41, the serial-to-parallel converter circuit 42, and the potential generator circuit 46a. For example, the circuit 40 can include a control circuit having a function of generating a start pulse signal, a clock signal, and the like.

<Structure Example 2 of Semiconductor Device>

A variety of structure examples of the semiconductor device of one embodiment of the present invention will be described with reference to FIG. 7A, FIG. 7B, FIG. 8A, FIG. 8B, FIG. 9A, and FIG. 9B.

Figure 7A:
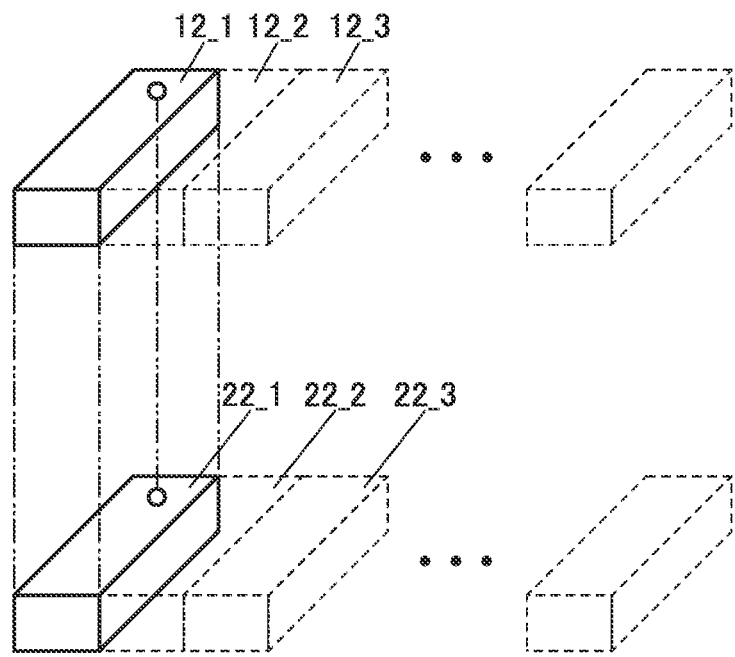
FIG. 7A is a diagram illustrating an arrangement example of source drivers and blocks.

FIG. 7A illustrates some of the components of the semiconductor device 10 illustrated in FIG. 1A. FIG. 7A illustrates a structure where a plurality of arranged source driver circuits 22 and a plurality of arranged blocks 12 overlap each other.

In FIG. 7A and the like, one of the plurality of source driver circuits 22 is represented by a source driver circuit 22_x and one of the plurality of blocks 12 is represented by a block 12_y. Here, x and y are each an integer of 1 or more.

In FIG. 7A, the block 12_1, the block 12_2, and the block 12_3 are sequentially provided to be adjacent to each other. The source driver circuit 22_1, the source driver circuit 22_2, and the source driver circuit 22_3 are electrically connected to the block 12_1, the block 12_2, and the block 12_3, respectively. In FIG. 7A, the pitch of the plurality of arranged source driver circuits 22 is substantially equal to the pitch of the plurality of arranged blocks 12. In FIG. 7A, the block 12 and the source driver circuit 22 that are electrically connected to each other have an overlap region.

Figure 7B:
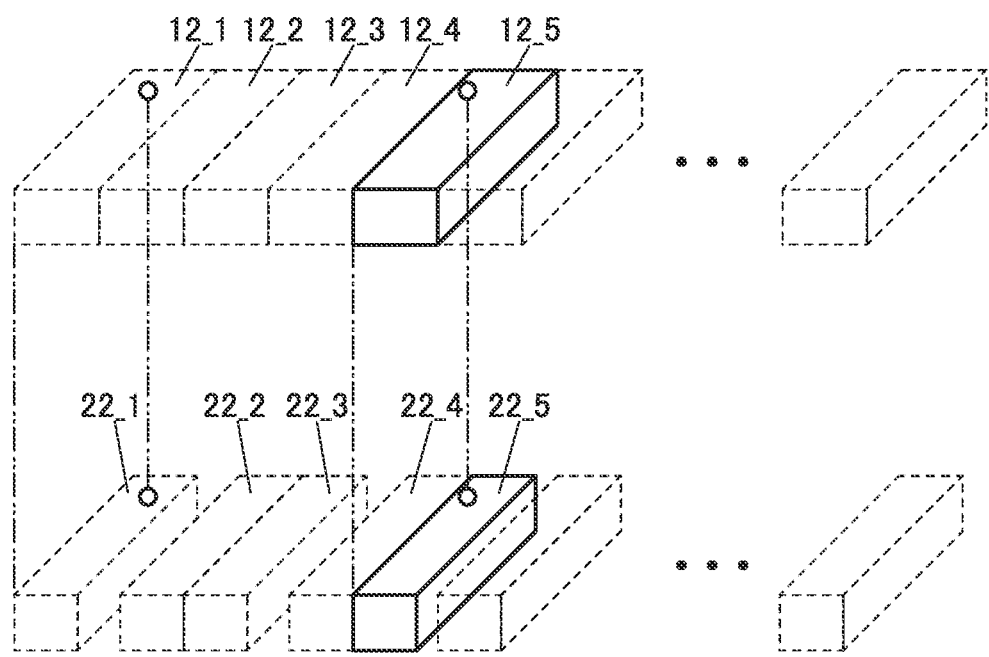
FIG. 7B is a diagram illustrating an arrangement example of source drivers and blocks.
Figure 8A:
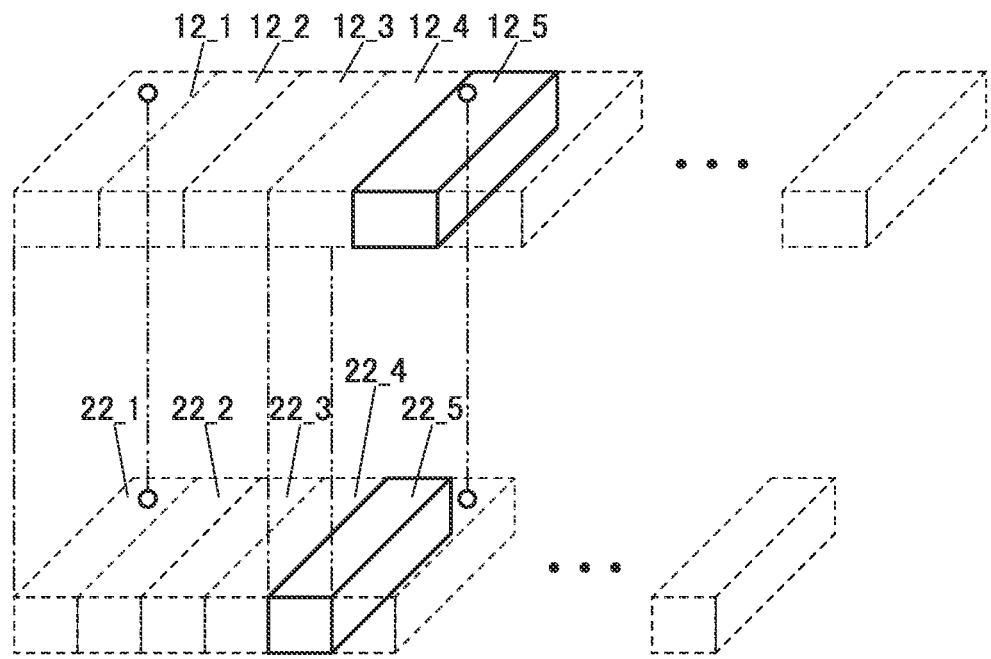
FIG. 8A is a diagram illustrating an arrangement example of source drivers and blocks.
Figure 8B:
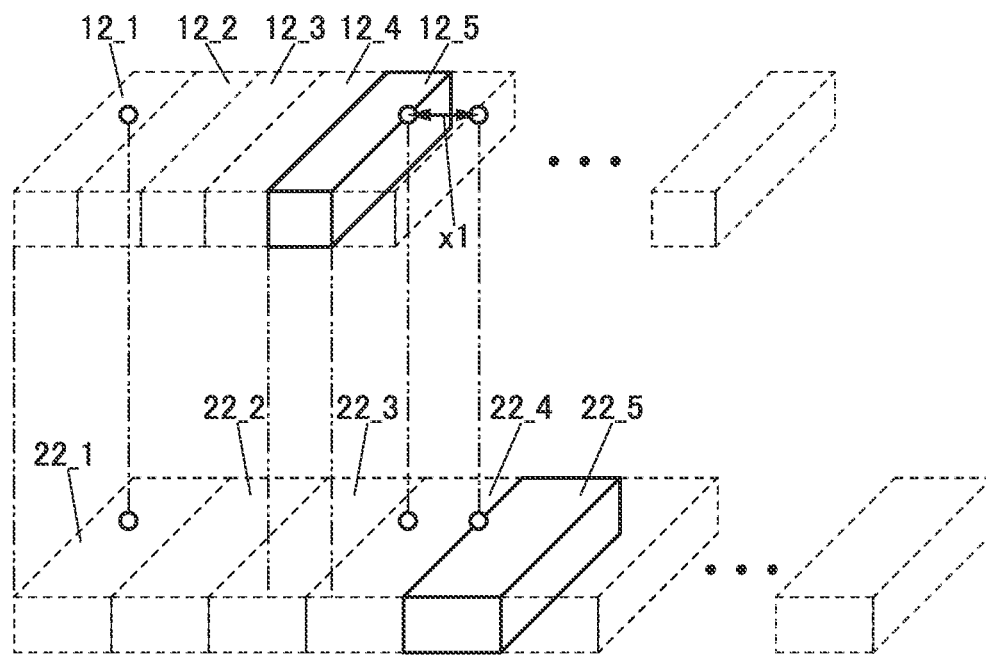
FIG. 8B is a diagram illustrating an arrangement example of source drivers and blocks.

In FIG. 7B, FIG. 8A, and FIG. 8B, the source driver circuit 22_1, the source driver circuit 22_2, the source driver circuit 22_3, the source driver circuit 22_4, and the source driver circuit 22_5 are electrically connected to the block 12_1, the block 12_2, the block 12_3, the block 12_4, and the block 12_5, respectively.

FIG. 7B and FIG. 8A illustrate examples in which the width of the source driver circuit 22 is smaller than that in FIG. 7A.

In FIG. 7B, the pitch of the plurality of arranged source driver circuits 22 is substantially equal to the pitch of the plurality of arranged blocks 12, and the block 12 and the source driver circuit 22 that are electrically connected to each other have an overlap region.

In contrast, in FIG. 8A, the pitch of the plurality of arranged source driver circuits 22 is different from the pitch of the plurality of arranged blocks 12. Consequently, for example, the block 12_1 and the source driver circuit 22_1 have an overlap region, but the block 12_5 and the source driver circuit 22_5 do not overlap.

FIG. 8B illustrates an example in which the width of the block 12 is smaller than that in FIG. 7A. In FIG. 8B, the pitch of the plurality of arranged source driver circuits 22 is different from the pitch of the plurality of arranged blocks 12. Thus, for example, the block 12_1 and the source driver circuit 22_1 have an overlap region, but the block 12_5 and the source driver circuit 22_5 do not overlap.

FIG. 8B illustrates an example of a distance x1 that is a distance between the block 12_5 and the source driver circuit 22_5. As shown in FIG. 8B, the distance x1 can be obtained, for example, by projecting an end portion of the source driver circuit 22_5 onto a layer where the block 12_5 is formed, that is, the layer 30 and measuring the distance between the projected point (or the projected region) and an end portion of the block 12_5. Here, in the case where the block 12 and the source driver circuit 22 that are electrically connected to each other do not overlap each other, the distance x1 is preferably 30 μm or less, for example. The distance x1 may be referred to as a distance seen from above.

Figure 9A:
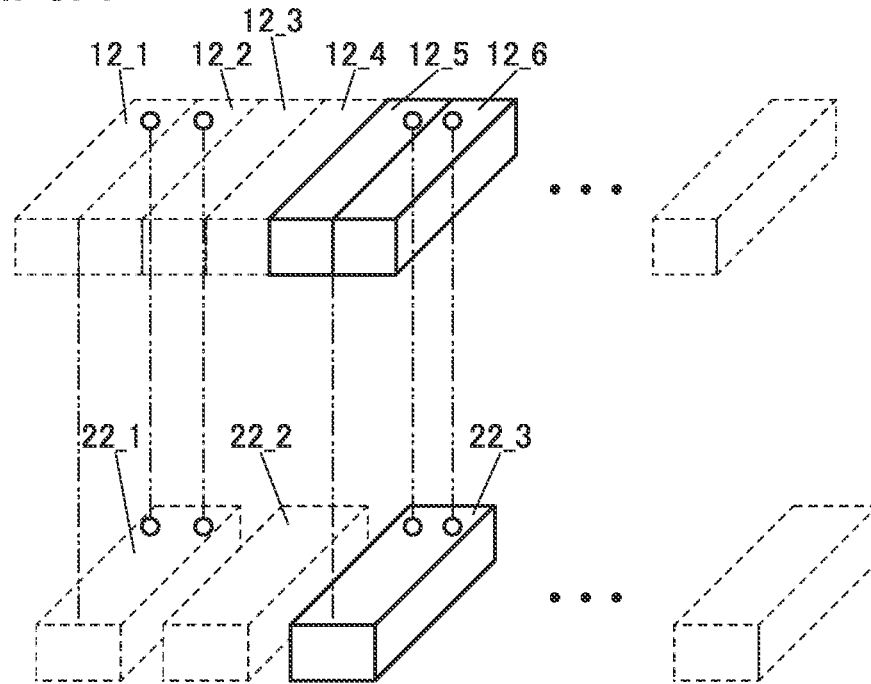
FIG. 9A is a diagram illustrating an arrangement example of source drivers and blocks.
Figure 9B:
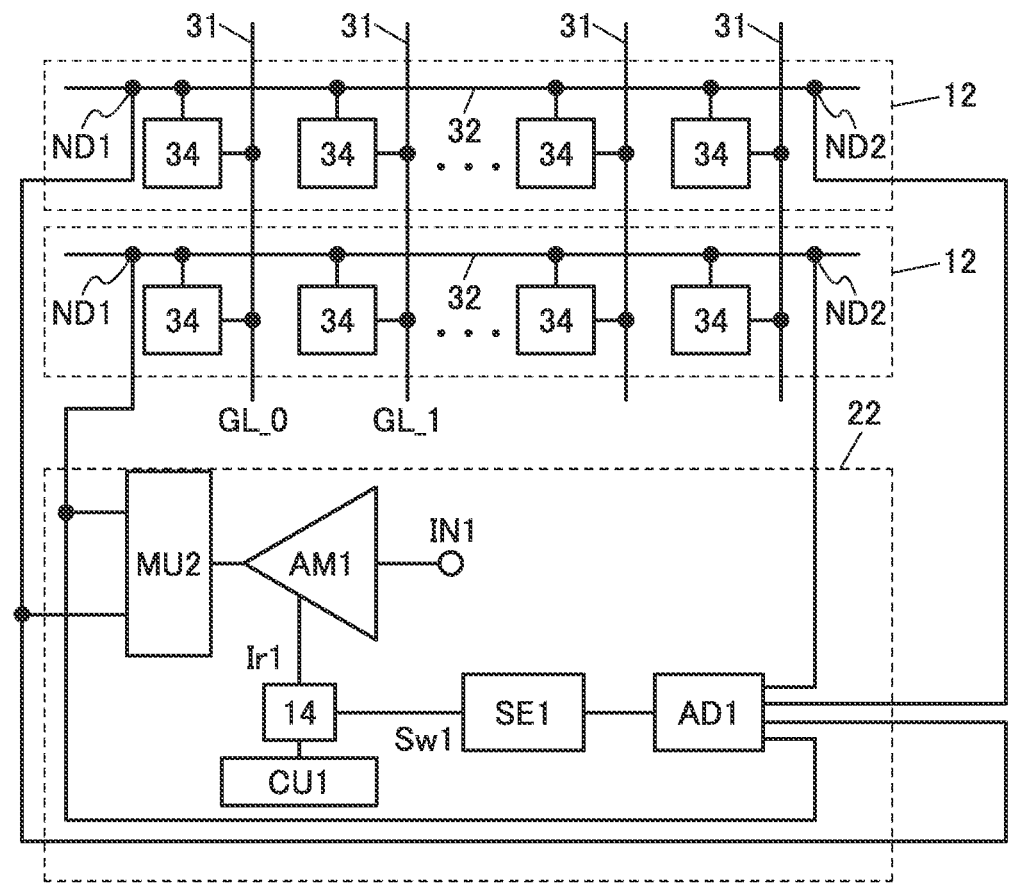
FIG. 9B is an example of a circuit diagram.

In the case where the area of the block 12 is smaller than that of the source driver circuit 22, for example, in the case where the width of the block 12 is smaller than the width of the source driver circuit 22 as illustrated in FIG. 9A, one source driver circuit 22 may be electrically connected to a plurality of blocks 12 as illustrated in FIG. 9B. In FIG. 9B, one source driver circuit 22 is provided for two blocks 12. The output of the amplifier circuit AM1 is electrically connected to a demultiplexer MU2. The demultiplexer MU2 is electrically connected to the node ND1 of a first block 12 and the node ND1 of a second block 12. The demultiplexer MU2 has a function of distributing an output from the amplifier circuit AM1 to either the first block 12 or the second block 12. In FIG. 9A, the source driver circuit 22_1 is electrically connected to the block 12_1 and the block 12_2, the source driver circuit 22_2 is electrically connected to the block 12_3 and the block 12_4, and the source driver circuit 22_3 is electrically connected to the block 12_5 and the block 12_6. In FIG. 9A, the block 12 and the source driver circuit 22 that are electrically connected to each other have an overlap region.

<Structure Example of Digital-to-Analog Converter Circuit 46>

Figure 10:
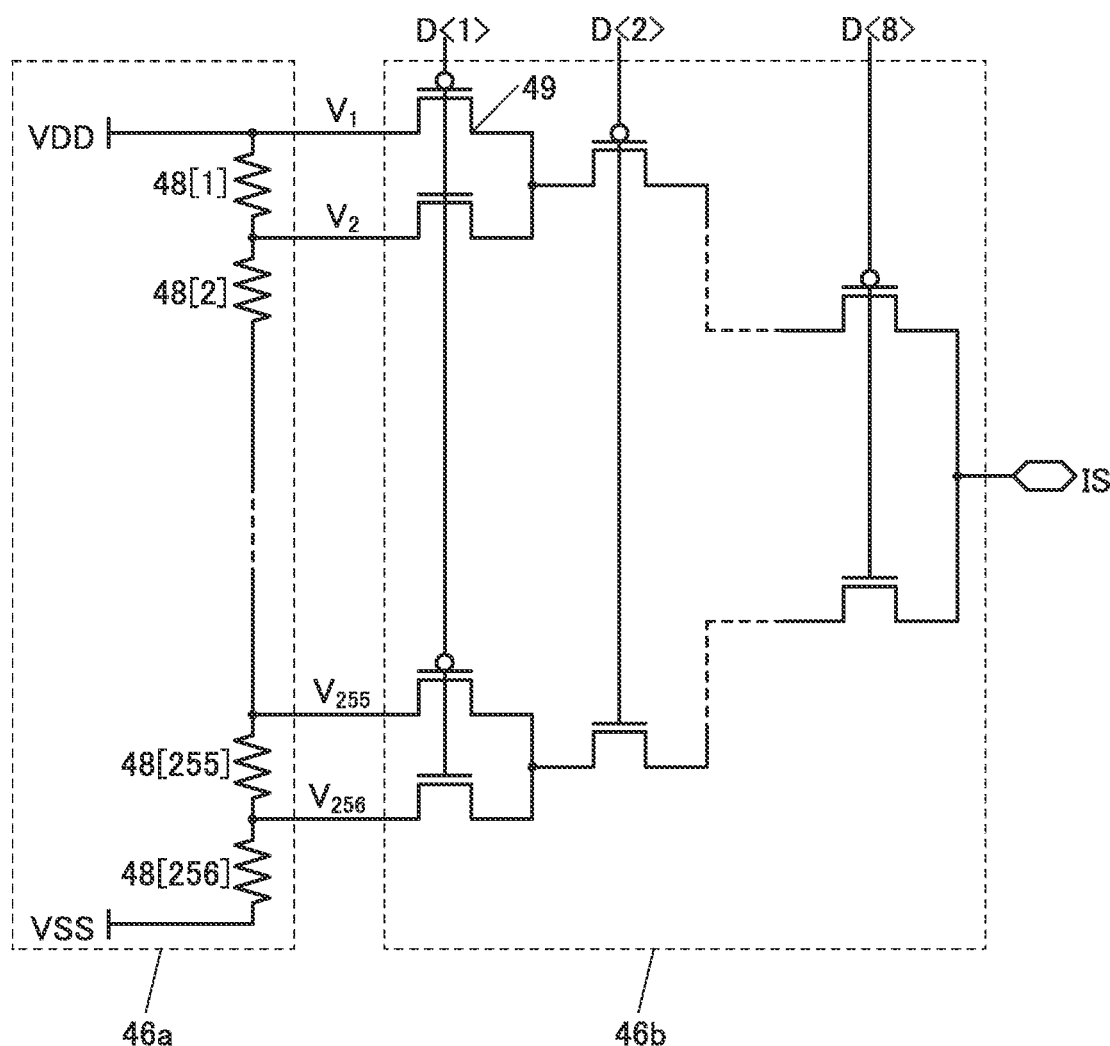
FIG. 10 is an example of a circuit diagram.

FIG. 10 is a circuit diagram illustrating a structure example of the potential generator circuit 46a and the logic circuit 46b, which constitute the digital-to-analog converter circuit 46. The digital-to-analog converter circuit 46 having the structure illustrated in FIG. 10 is capable of converting 8-bit image data D<1> to D<8> into an analog image signal IS.

In this specification and the like, for example, first-bit image data D is denoted as the image data D<1>, second-bit image data D is denoted as the image data D<2>, and eighth-bit image data D is denoted as the image data D<8>.

The potential generator circuit 46a having the structure illustrated in FIG. 10 includes resistors 48[1] to 48[256] that are connected in series. In other words, the digital-to-analog converter circuit 46 can be a resistor-string D/A converter circuit.

A potential VDD can be supplied to one terminal of the resistor 48[1]. A potential VSS can be supplied to one terminal of the resistor 48[256]. Thus, potentials $V_1$ to $V_{256}$ that have different levels can be output from the terminals of the resistors 48[1] to 48[256]. Although FIG. 10 illustrates a structure example of the potential generator circuit 46a in which the potential $V_1$ is the potential VDD, the potential $V_{256}$ may be the potential VSS. Alternatively, the potential $V_1$ may be the potential VDD and the potential $V_{256}$ may be the potential VSS without providing the resistor 48[256].

In this specification and the like, the potential VDD can be a high potential, for example, and the potential VSS can be a low potential, for example. Here, the low potential can be a ground potential, for example. The high potential is a potential higher than the low potential, and can be a positive potential when the low potential is a ground potential.

The logic circuit 46b having the structure illustrated in FIG. 10 may be referred to as a pass transistor logic circuit. The logic circuit 46b is formed of 8-stage pass transistors 49. Specifically, the logic circuit 46b is configured such that one stage is separated into two electrical paths, and has a total of 256 paths. That is, the pass transistors 49 can be regarded as being electrically connected in a tournament manner. The analog image signal IS can be output from one of a source and a drain of the pass transistor 49 in the eighth stage, which is the last stage.

For example, the image data D<1> can be supplied to the pass transistor 49 in the first stage, the image data D<2> can be supplied to the pass transistors 49 in the second stage, and the image data D<8> can be supplied to the pass transistors 49 in the eighth stage. In the above manner, the potential of the image signal IS can be set to any of the potentials $V_1$ to $V_{256}$ in accordance with the image data D. Consequently, digital image data can be converted into the analog image signal IS.

The logic circuit 46b illustrated in FIG. 10 includes n-channel pass transistors 49 and p-channel pass transistors 49; alternatively, the logic circuit 46b can include only n-channel pass transistors 49. The pass transistors 49 provided in the logic circuit 46b can be all n-channel transistors when the image data D<1> to D<8> and their complementary data are supplied to the gates of the pass transistors 49, for example.

The structure illustrated in FIG. 10 can also be applied to the digital-to-analog converter circuit 46 having a function of performing D/A conversion on the image data D with bits other than 8 bits. For example, when 1024 or 1023 resistors 48 are provided in the potential generator circuit 46a and 10-stage pass transistors 49 are provided in the logic circuit 46b, the digital-to-analog converter circuit 46 can have a function of performing D/A conversion on 10-bit image data D.

<Structure Example of the Gate Driver Circuit 21>

Figure 11:
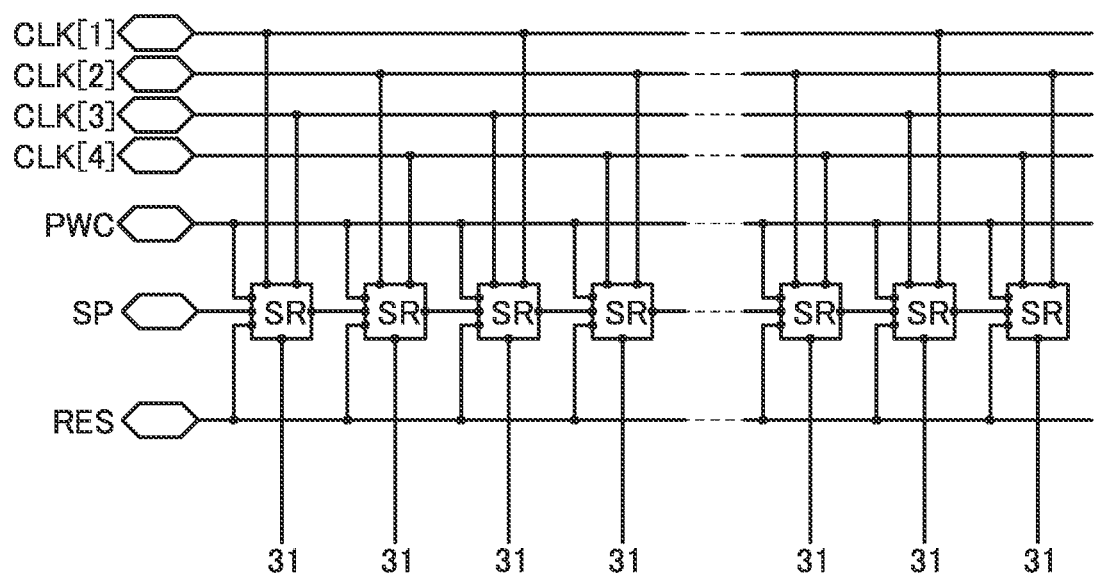
FIG. 11 is an example of a circuit diagram.

FIG. 11 is a block diagram illustrating a structure example of the gate driver circuit 21. The gate driver circuit 21 includes shift register circuits SR composed of a plurality of set-reset flip-flops. The shift register circuit SR is electrically connected to the wiring 31 having a function of a scan line, and has a function of outputting a signal to the wiring 31.

A signal RES is a reset signal. When the signal RES is set to a high potential, for example, all the outputs of the shift register circuits SR can be a low potential. A signal SP is a start pulse signal. When the signal SP is input to the gate driver circuit 21, the shift operation of the shift register circuits SR can be started. A signal PWC is a pulse width control signal and has a function of controlling the pulse width of a signal output from the shift register circuit SR to the wiring 31. A signal CLK[1], a signal CLK[2], a signal CLK[3], and a signal CLK[4] are clock signals. For example, two of the signals CLK[1] to CLK[4] can be input to one shift register circuit SR.

Note that the structure illustrated in FIG. 11 can also be applied to the shift register circuit 44 included in the source driver circuit 22, for instance, when the wiring 31 electrically connected to the shift register circuit SR is replaced with another wiring, for example.

Figure 12A:
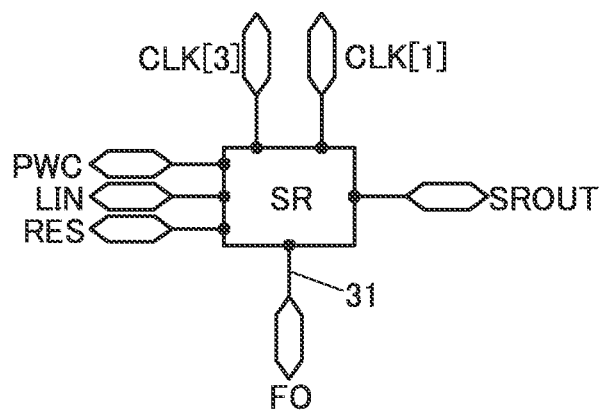
FIG. 12A is an example of a circuit diagram.

FIG. 12A is a diagram illustrating signals input to the shift register circuit SR and signals output from the shift register circuit SR. Here, FIG. 12A illustrates the case where the signal CLK[1] and the signal CLK[3] are input as the clock signals.

A signal FO is an output signal and is output to the wiring 31, for example. A signal SROUT is a shift signal and can be used as a signal LIN that is input to the next-stage shift register circuit SR. Among the signals illustrated in FIG. 12A, the signal RES, the signal PWC, the signal CLK[1], the signal CLK[3], and the signal LIN are signals input to the shift register circuit SR; the signal FO and the signal SROUT are signals output from the shift register circuit SR.

Figure 12B:
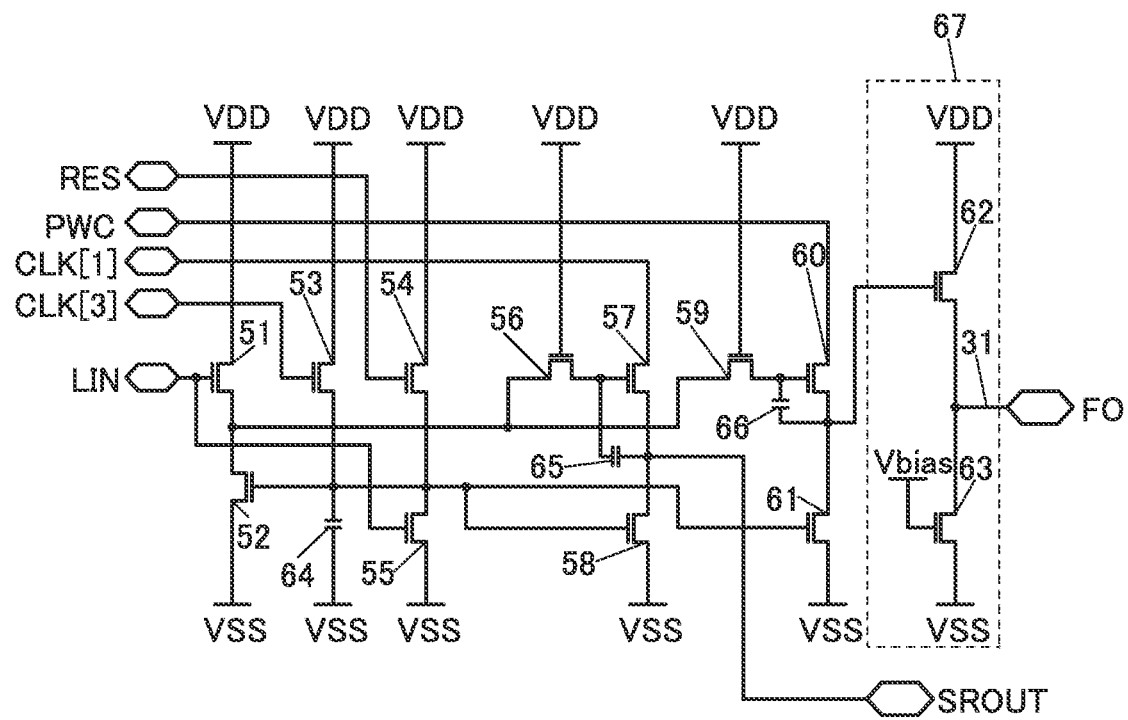
FIG. 12B is an example of a circuit diagram.

FIG. 12B is a circuit diagram illustrating a structure example of the shift register circuit SR that inputs and outputs the signals illustrated in FIG. 12A. The shift register circuit SR includes a transistor 51 to a transistor 63 and a capacitor 64 to a capacitor 66.

One of a source and a drain of the transistor 51 is electrically connected to one of a source and a drain of the transistor 52, one of a source and a drain of the transistor 56, and one of a source and a drain of the transistor 59. A gate of the transistor 52 is electrically connected to one of a source and a drain of the transistor 53, one of a source and a drain of the transistor 54, one of a source and a drain of the transistor 55, a gate of the transistor 58, a gate of the transistor 61, and one electrode of the capacitor 64. The other of the source and the drain of the transistor 56 is electrically connected to a gate of the transistor 57 and one electrode of the capacitor 65. The other of the source and the drain of the transistor 59 is electrically connected to a gate of the transistor 60 and one electrode of the capacitor 66. One of a source and a drain of the transistor 60 is electrically connected to one of a source and a drain of the transistor 61, a gate of the transistor 62, and the other electrode of the capacitor 66.

The signal LIN is input to a gate of the transistor 51 and a gate of the transistor 55. The signal CLK[3] is input to a gate of the transistor 53. The signal RES is input to a gate of the transistor 54. The signal CLK[1] is input to one of a source and a drain of the transistor 57. The signal PWC is input to the other of the source and the drain of the transistor 60.

One of a source and a drain of the transistor 62 and one of a source and a drain of the transistor 63 are electrically connected to the wiring 31, and the signal FO is output from the wiring 31 as described above. The signal SROUT is output from the other of the source and the drain of the transistor 57, one of a source and a drain of the transistor 58, and the other electrode of the capacitor 65.

The potential VDD is supplied to the other of the source and the drain of the transistor 51, the other of the source and the drain of the transistor 53, the other of the source and the drain of the transistor 54, a gate of the transistor 56, a gate of the transistor 59, and other of the source and drain of the transistor 62. The potential VSS is supplied to the other of the source and the drain of the transistor 52, the other of the source and the drain of the transistor 55, the other of the source and the drain of the transistor 58, the other of the source and the drain of the transistor 61, the other of the source and the drain of the transistor 63, and the other electrode of the capacitor 64.

The transistor 63 is a bias transistor and has a function of a constant current source. A potential Vbias that is a bias potential can be supplied to a gate of the transistor 63.

The transistor 62 and the transistor 63 form a source follower circuit 67. Even if signal decay or the like due to wiring resistance, parasitic capacitance, or the like occurs inside the shift register circuit SR, the source follower circuit 67 provided in the shift register circuit SR can inhibit a reduction in the potential of the signal FO due to the signal decay or the like. This increases the operating speed of the semiconductor device 10. Note that the source follower circuit 67 may be replaced with another circuit as long as the circuit has a function of a buffer.

Examples where the semiconductor device of one embodiment of the present invention is used in a display device will be described below.

<Configuration Examples of Pixel 34>

FIG. 13A to FIG. 13E are diagrams for describing colors exhibited by the pixels 34 provided in the semiconductor device 10. As illustrated in FIG. 6A, the pixel 34 that exhibits red (R), the pixel 34 that exhibits green (G), and the pixel 34 that exhibits blue (B) can be provided in the display device of one embodiment of the present invention. Alternatively, as illustrated in FIG. 13B, the pixel 34 that exhibits cyan (C), the pixel 34 that exhibits magenta (M), and the pixel 34 that exhibits yellow (Y) may be provided in the semiconductor device 10.

Alternatively, as illustrated in FIG. 13C, the pixel 34 that exhibits red (R), the pixel 34 that exhibits green (G), the pixel 34 that exhibits blue (B), and the pixel 34 that exhibits white (W) may be provided in the semiconductor device 10. Alternatively, as illustrated in FIG. 13D, the pixel 34 that exhibits red (R), the pixel 34 that exhibits green (G), the pixel 34 that exhibits blue (B), and the pixel 34 that exhibits yellow (Y) may be provided in the semiconductor device 10. Alternatively, as illustrated in FIG. 13E, the pixel 34 that exhibits cyan (C), the pixel 34 that exhibits magenta (M), the pixel 34 that exhibits yellow (Y), and the pixel 34 that exhibits white (W) may be provided in the semiconductor device 10.

Providing the pixel 34 that exhibits white in the semiconductor device 10 as illustrated in FIG. 13C and FIG. 13E can increase the luminance of a displayed image. Furthermore, increasing the number of colors exhibited by the pixels 34 as illustrated in FIG. 13D and the like can increase the reproducibility of intermediate colors and thus can improve the display quality.

Figure 14A:
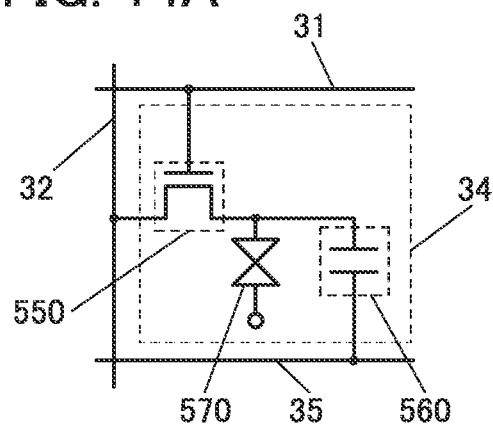
FIG. 14A, FIG. 14B, and FIG. 14C are circuit diagrams each illustrating an example of a pixel.
Figure 14B:
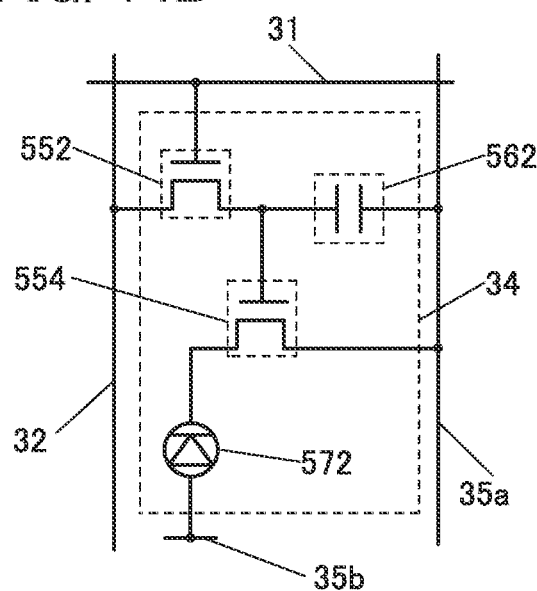

FIG. 14A and FIG. 14B are circuit diagrams illustrating configuration examples of the pixel 34. The pixel 34 having the configuration illustrated in FIG. 14A includes a liquid crystal element 570, a transistor 550, and a capacitor 560. In addition to the wiring 31 and the wiring 32, a wiring 35 and the like are electrically connected to the pixel 34.

The potential of one electrode of the liquid crystal element 570 is set as appropriate in accordance with the specifications of the pixel 34. The alignment state of the liquid crystal element 570 is set depending on an image signal written to the pixel 34. Note that a common potential may be supplied to the one electrode of the liquid crystal element 570 included in each of a plurality of pixels 34. Alternatively, a potential supplied to the one electrode of the liquid crystal element 570 in the pixel 34 may differ between rows.

The pixel 34 having the configuration illustrated in FIG. 14B includes a transistor 552, a transistor 554, a capacitor 562, and a light-emitting element 572. As the light-emitting element 572, an EL element utilizing electroluminescence can be used, for example. An EL element includes a layer containing a light-emitting compound (hereinafter also referred to as an EL layer) between a pair of electrodes. By generating a potential difference between the pair of electrodes that is greater than the threshold voltage of the EL element, holes are injected into the EL layer from the anode side and electrons are injected into the EL layer from the cathode side. The injected electrons and holes are recombined in the EL layer, and a light-emitting substance contained in the EL layer emits light.

EL elements are classified according to whether a light-emitting material is an organic compound or an inorganic compound; in general, the former is referred to as an organic EL element, and the latter is referred to as an inorganic EL element.

In an organic EL element, by voltage application, electrons from one electrode and holes from the other electrode are injected into the EL layer. Then, the carriers (electrons and holes) are recombined, whereby a light-emitting organic compound forms an excited state, and light is emitted when the excited state returns to a ground state. Owing to such a mechanism, this light-emitting element is referred to as a current-excitation light-emitting element.

Note that in addition to the light-emitting compound, the EL layer may include a substance with a high hole-injection property, a substance with a high hole-transport property, a hole-blocking material, a substance with a high electron-transport property, a substance with a high electron-injection property, a substance with a bipolar property (a substance with a high electron-transport property and a high hole-transport property), or the like.

The EL layer can be formed by a method such as an evaporation method (including a vacuum evaporation method), a transfer method, a printing method, an inkjet method, or a coating method.

The inorganic EL elements are classified according to their element structures into a dispersion-type inorganic EL element and a thin-film inorganic EL element. A dispersion-type inorganic EL element includes a light-emitting layer where particles of a light-emitting material are dispersed in a binder, and its light emission mechanism is donor-acceptor recombination type light emission that utilizes a donor level and an acceptor level. A thin-film inorganic EL element has a structure in which a light-emitting layer is provided between dielectric layers, which are further sandwiched between electrodes, and its light emission mechanism is localized type light emission that utilizes inner-shell electron transition of metal ions.

In order to extract light emitted from the light-emitting element, at least one of the pair of electrodes is transparent. A transistor and a light-emitting element are formed over a substrate; the light-emitting element can have a top emission structure in which emitted light is extracted from the surface on the side opposite to the substrate, a bottom emission structure in which emitted light is extracted from the surface on the substrate side, or a dual emission structure in which emitted light is extracted from both surfaces. The light-emitting element having any of the emission structures can be used.

Note that an element similar to the light-emitting element 572 can be used as light-emitting elements other than the light-emitting element 572.

Power consumption can be reduced in the semiconductor device of one embodiment of the present invention. Reducing the power consumption of the semiconductor device can suppress heat generation in the pixel array. Suppressing heat generation in the pixel array can increase the display quality of the display portion in the semiconductor device of one embodiment of the present invention, for example. Moreover, the lifetime of the light-emitting element can be increased, for example. In the case where an organic EL element is used as the light-emitting element, for example, an element with a longer lifetime can be achieved by suppressing heat generation.

One of a source and a drain of a transistor 552 is electrically connected to the wiring 32. The other of the source and the drain of the transistor 552 is electrically connected to one electrode of the capacitor 562 and a gate of the transistor 554. The other electrode of the capacitor 562 is electrically connected to a wiring 35*a*. A gate of the transistor 552 is electrically connected to the wiring 31. One of a source and a drain of the transistor 554 is electrically connected to the wiring 35*a*. The other of the source and the drain of the transistor 554 is electrically connected to one electrode of the light-emitting element 572. The other electrode of the light-emitting element 572 is electrically connected to a wiring 35*b*. The potential VSS is supplied to the wiring 35*a*, and the potential VDD is supplied to the wiring 35*b*.

In the pixel 34 having the configuration illustrated in FIG. 14B, a current flowing through the light-emitting element 572 is controlled in accordance with a potential supplied to the gate of the transistor 554, whereby the luminance of light emitted from the light-emitting element 572 is controlled.

Figure 14C:
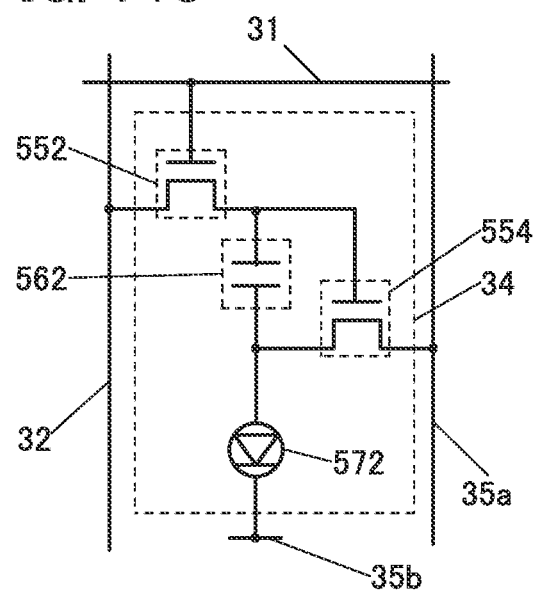

FIG. 14C illustrates a configuration different from that of the pixel 34 in FIG. 14B. In the pixel 34 having the configuration illustrated in FIG. 14C, one of the source and the drain of the transistor 552 is electrically connected to the wiring 32. The other of the source and the drain of the transistor 552 is electrically connected to one electrode of the capacitor 562 and the gate of the transistor 554. The gate of the transistor 552 is electrically connected to the wiring 31. One of the source and the drain of the transistor 554 is electrically connected to the wiring 35*a*. The other of the source and the drain of the transistor 554 is electrically connected to the other electrode of the capacitor 562 and one electrode of the light-emitting element 572. The other electrode of the light-emitting element 572 is electrically connected to the wiring 35*b*. The potential VDD is supplied to the wiring 35*a*, and the potential VSS is supplied to the wiring 35*b*.

<Cross-Sectional Structure Examples of Display Device>

Figure 15:
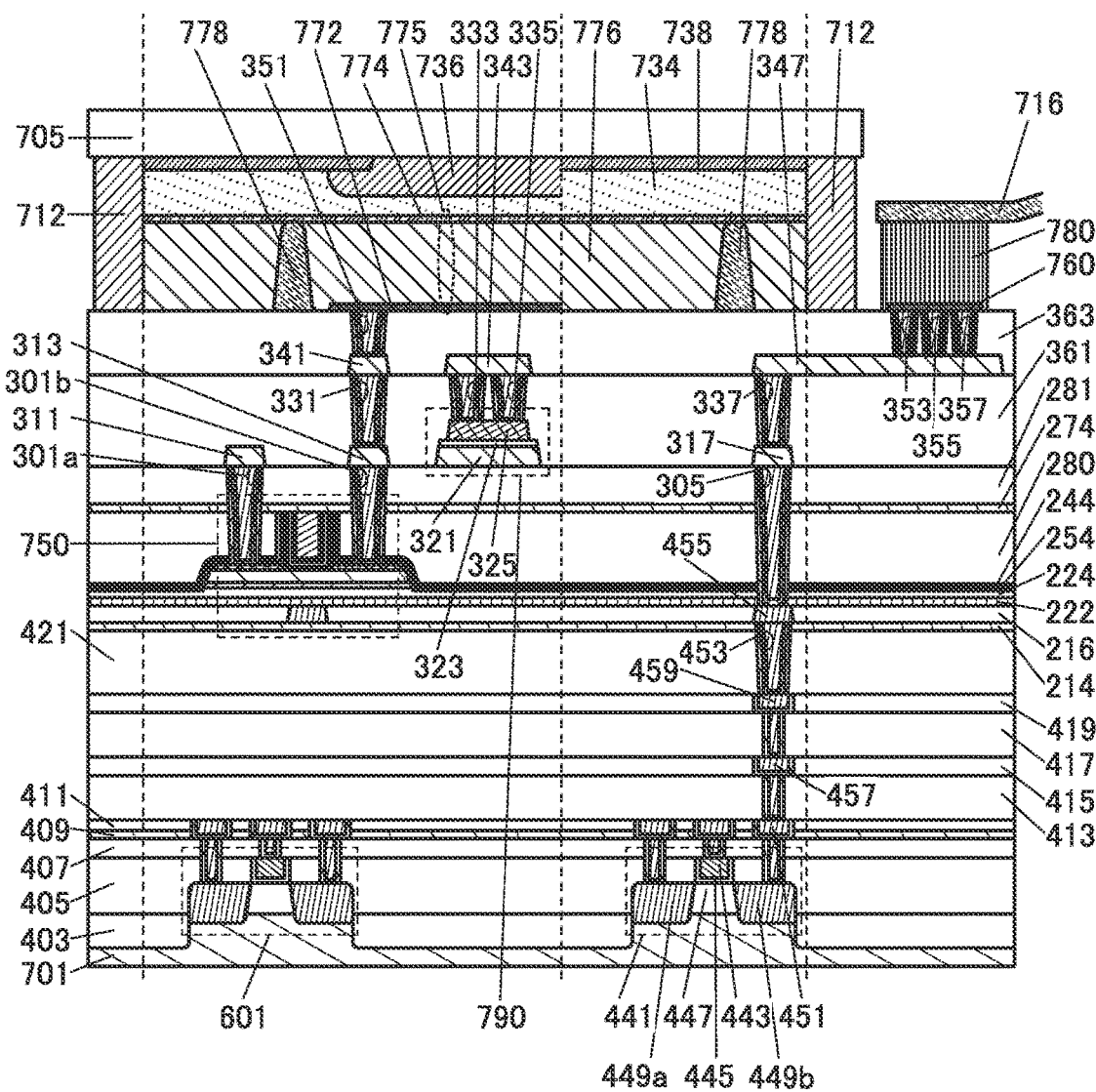
FIG. 15 is an example of a cross-sectional view of a semiconductor device.

FIG. 15 is a cross-sectional view illustrating a structure example of the semiconductor device 10. The semiconductor device 10 includes a substrate 701 and a substrate 705. The substrate 701 and the substrate 705 are attached to each other with a sealant 712.

As the substrate 701, a single crystal semiconductor substrate such as a single crystal silicon substrate can be used. Note that a semiconductor substrate other than a single crystal semiconductor substrate may be used as the substrate 701.

A transistor 441 and a transistor 601 are provided on the substrate 701. The transistor 441 can be a transistor provided in the circuit 40. The transistor 601 can be a transistor provided in the gate driver circuit 21 or a transistor provided in the source driver circuit 22. That is, the transistor 441 and the transistor 601 can be provided in the layer 20 illustrated in FIG. 1 and the like.

The transistor 441 is formed of a conductor 443 having a function of a gate electrode, an insulator 445 having a function of a gate insulator, and part of the substrate 701 and includes a semiconductor region 447 including a channel formation region, a low-resistance region 449*a* having a function of one of a source region and a drain region, and a low-resistance region 449*b* having a function of the other of the source region and the drain region. The transistor 441 can be a p-channel transistor or an n-channel transistor.

The transistor 441 is electrically isolated from other transistors by an element isolation layer 403. FIG. 15 illustrates the case where the transistor 441 and the transistor 601 are electrically isolated from each other by the element isolation layer 403. The element isolation layer 403 can be formed by a LOCOS (LOCal Oxidation of Silicon) method, an STI (Shallow Trench Isolation) method, or the like.

Here, in the transistor 441 illustrated in FIG. 15, the semiconductor region 447 has a projecting shape. Moreover, the conductor 443 is provided to cover a side surface and a top surface of the semiconductor region 447 with the insulator 445 therebetween. Note that FIG. 15 does not illustrate the state where the conductor 443 covers the side surface of the semiconductor region 447. A material for adjusting the work function can be used for the conductor 443.

A transistor having a projecting semiconductor region, like the transistor 441, can be referred to as a fin-type transistor because a projecting portion of a semiconductor substrate is used. An insulator having a function of a mask for forming a projecting portion may be provided in contact with the top surface of the projecting portion. Although FIG. 15 illustrates the structure in which the projecting portion is formed by processing part of the substrate 701, a semiconductor having a projecting shape may be formed by processing an SOI substrate.

Note that the structure of the transistor 441 illustrated in FIG. 15 is only an example; the structure of the transistor 441 is not particularly limited and can be changed as appropriate in accordance with the circuit configuration, an operation method for the circuit, or the like. For example, the transistor 441 may be a planar transistor.

The transistor 601 can have the same structure as the transistor 441.

An insulator 405, an insulator 407, an insulator 409, and an insulator 411 are provided over the substrate 701, in addition to the element isolation layer 403, the transistor 441, and the transistor 601. A conductor 451 is embedded in the insulator 405, the insulator 407, the insulator 409, and the insulator 411. Here, the top surface of the conductor 451 and the top surface of the insulator 411 can be substantially level with each other.

An insulator 413 and an insulator 415 are provided over the conductor 451 and the insulator 411. A conductor 457 is embedded in the insulator 413 and the insulator 415. Here, the top surface of the conductor 457 and the top surface of the insulator 415 can be substantially level with each other.

An insulator 417 and an insulator 419 are provided over the conductor 457 and the insulator 415. A conductor 459 is embedded in the insulator 417 and the insulator 419. Here, the top surface of the conductor 459 and the top surface of the insulator 419 can be substantially level with each other.

An insulator 421 and an insulator 214 are provided over the conductor 459 and the insulator 419. A conductor 453 is embedded in the insulator 421 and the insulator 214. Here, the top surface of the conductor 453 and the top surface of the insulator 214 can be substantially level with each other.

An insulator 216 is provided over the conductor 453 and the insulator 214. A conductor 455 is embedded in the insulator 216. Here, the top surface of the conductor 455 and the top surface of the insulator 216 can be substantially level with each other.

An insulator 222, an insulator 224, an insulator 254, an insulator 244, an insulator 280, an insulator 274, and an insulator 281 are provided over the conductor 455 and the insulator 216. A conductor 305 is embedded in the insulator 222, the insulator 224, the insulator 254, the insulator 244, the insulator 280, the insulator 274, and the insulator 281. Here, the top surface of the conductor 305 and the top surface of the insulator 281 can be substantially level with each other.

An insulator 361 is provided over the conductor 305 and the insulator 281. A conductor 317 and a conductor 337 are embedded in the insulator 361. Here, the top surface of the conductor 337 and the top surface of the insulator 361 can be substantially level with each other.

An insulator 363 is provided over the conductor 337 and the insulator 361. A conductor 347, a conductor 353, a conductor 355, and a conductor 357 are embedded in the insulator 363. Here, the top surfaces of the conductor 353, the conductor 355, and the conductor 357 and the top surface of the insulator 363 can be substantially level with each other.

A connection electrode 760 is provided over the conductor 353, the conductor 355, the conductor 357, and the insulator 363. An anisotropic conductor 780 is provided to be electrically connected to the connection electrode 760. An FPC (Flexible Printed Circuit) 716 is provided to be electrically connected to the anisotropic conductor 780. A variety of signals and the like are supplied to the semiconductor device 10 from the outside through the FPC 716.

As illustrated in FIG. 15, the low-resistance region 449b having a function of the other of the source region and the drain region of the transistor 441 is electrically connected to the FPC 716 through the conductor 451, the conductor 457, the conductor 459, the conductor 453, the conductor 455, the conductor 305, the conductor 317, the conductor 337, the conductor 347, the conductor 353, the conductor 355, the conductor 357, the connection electrode 760, and the anisotropic conductor 780. Although FIG. 15 illustrates three conductors, which are the conductor 353, the conductor 355, and the conductor 357, as conductors that electrically connect the connection electrode 760 and the conductor 347, one embodiment of the present invention is not limited thereto. The number of conductors having a function of electrically connecting the connection electrode 760 and the conductor 347 may be one, two, or four or more. Providing a plurality of conductors having a function of electrically connecting the connection electrode 760 and the conductor 347 can reduce the contact resistance.

A transistor 750 is provided over the insulator 214. The transistor 750 can be a transistor provided in the pixel 34. That is, the transistor 750 can be provided in the layer 30 illustrated in FIG. 1 and the like. An OS transistor can be used as the transistor 750. The OS transistor has a feature of extremely low off-state current. Consequently, the retention time for an image signal or the like can be increased, so that the refresh operation can be less frequent. Thus, power consumption of the semiconductor device 10 can be reduced.

A conductor 301a and a conductor 301b are embedded in the insulator 254, the insulator 244, the insulator 280, the insulator 274, and the insulator 281. The conductor 301a is electrically connected to one of a source and a drain of the transistor 750, and the conductor 301b is electrically connected to the other of the source and the drain of the transistor 750. Here, the top surfaces of the conductor 301a and the conductor 301b and the top surface of the insulator 281 can be substantially level with each other.

A conductor 311, a conductor 313, a conductor 331, a capacitor 790, a conductor 333, and a conductor 335 are embedded in the insulator 361. The conductor 311 and the conductor 313 are electrically connected to the transistor 750 and have a function of a wiring. The conductor 333 and the conductor 335 are electrically connected to the capacitor 790. Here, the top surfaces of the conductor 331, the conductor 333, and the conductor 335 and the top surface of the insulator 361 can be substantially level with each other.

A conductor 341, a conductor 343, and a conductor 351 are embedded in the insulator 363. Here, the top surface of the conductor 351 and the top surface of the insulator 363 can be substantially level with each other.

The insulator 405, the insulator 407, the insulator 409, the insulator 411, the insulator 413, the insulator 415, the insulator 417, the insulator 419, the insulator 421, the insulator 214, the insulator 280, the insulator 274, the insulator 281, the insulator 361, and the insulator 363 have a function of an interlayer film and may also have a function of a planarization film that covers unevenness thereunder. For example, the top surface of the insulator 363 may be planarized by planarization treatment using a chemical mechanical polishing (CMP) method or the like to increase the level of planarity.

As illustrated in FIG. 15, the capacitor 790 includes a lower electrode 321 and an upper electrode 325. An insulator 323 is provided between the lower electrode 321 and the upper electrode 325. That is, the capacitor 790 has a stacked-layer structure in which the insulator 323 functioning as a dielectric is positioned between the pair of electrodes. Although FIG. 15 illustrates an example in which the capacitor 790 is provided over the insulator 281, the capacitor 790 may be provided over an insulator other than the insulator 281.

In the example in FIG. 15, the conductor 301a, the conductor 301b, and the conductor 305 are formed in one layer. The conductor 311, the conductor 313, the conductor 317, and the lower electrode 321 are formed in one layer. The conductor 331, the conductor 333, the conductor 335, and the conductor 337 are formed in one layer. The conductor 341, the conductor 343, and the conductor 347 are formed in one layer. The conductor 351, the conductor 353, the conductor 355, and the conductor 357 are formed in one layer. Forming a plurality of conductors in one layer in this manner simplifies the process of manufacturing the semiconductor device 10 and thus makes the semiconductor device 10 inexpensive. Note that these conductors may be formed in different layers or may contain different types of materials.

The semiconductor device 10 illustrated in FIG. 15 includes a liquid crystal element 775. The liquid crystal element 775 includes a conductor 772, a conductor 774, and a liquid crystal layer 776 positioned therebetween. The conductor 774 is provided on the substrate 705 side and has a function of a common electrode. The conductor 772 is electrically connected to the other of the source and the drain of the transistor 750 through the conductor 351, the conductor 341, the conductor 331, the conductor 313, and the conductor 301b. The conductor 772 is formed over the insulator 363 and has a function of a pixel electrode.

A material that transmits visible light or a material that reflects visible light can be used for the conductor 772. As a light-transmitting material, for example, an oxide material containing indium, zinc, tin, or the like is preferably used. As a reflective material, for example, a material containing aluminum, silver, or the like is preferably used.

When a reflective material is used for the conductor 772, the semiconductor device 10 is a reflective liquid crystal display device. Meanwhile, when a light-transmitting material is used for the conductor 772 and a light-transmitting material is also used for the substrate 701 and the like, the semiconductor device 10 is a transmissive liquid crystal display device. In the case where the semiconductor device 10 is a reflective liquid crystal display device, a polarizing plate is provided on the viewer side. On the other hand, in the case where the semiconductor device 10 is a transmissive liquid crystal display device, a pair of polarizing plates are provided such that the liquid crystal element is sandwiched therebetween.

Although not illustrated in FIG. 15, an alignment film in contact with the liquid crystal layer 776 may be provided. Furthermore, an optical member (an optical substrate) such as a polarizing member, a retardation member, or an anti-reflection member and a light source such as a backlight or a side light can be provided as appropriate.

A component 778 is provided between the insulator 363 and the conductor 774. The component 778 is a columnar spacer and has a function of controlling the distance (the cell gap) between the substrate 701 and the substrate 705. Note that a spherical spacer may also be used as the component 778.

On the substrate 705 side, a light-blocking layer 738, a coloring layer 736, and an insulator 734 that is in contact with them are provided. The light-blocking layer 738 has a function of blocking light emitted from adjacent regions. Alternatively, the light-blocking layer 738 has a function of preventing external light from reaching the transistor 750 or the like. Note that the coloring layer 736 is provided to have a region overlapping the liquid crystal element 775.

For the liquid crystal layer 776, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. In the case where a horizontal electric field mode is employed, a liquid crystal exhibiting a blue phase for which an alignment film is not used may be used.

As the mode of the liquid crystal element, a TN (Twisted Nematic) mode, a VA (Vertical Alignment) mode, an IPS (In-Plane-Switching) mode, an FFS (Fringe Field Switching) mode, an ASM (Axially Symmetric aligned Micro-cell) mode, an OCB (Optically Compensated Birefringence) mode, an ECB (Electrically Controlled Birefringence) mode, a guest-host mode, or the like can be employed.

In addition, a scattering liquid crystal employing a polymer dispersed liquid crystal, a polymer network liquid crystal, or the like can be used for the liquid crystal layer 776. In this case, monochrome image display may be performed without providing the coloring layer 736, or color display may be performed using the coloring layer 736.

As a driving method of the liquid crystal element, a time-division display method (also referred to as a field-sequential driving method) by which color display is performed by a successive additive color mixing method may be used. In that case, a structure in which the coloring layer 736 is not provided can be employed. In the case where the time-division display method is employed, advantages such as an increase in the aperture ratio of pixels and an increase in definition can be obtained because it is not necessary to provide subpixels that exhibit R (red), G (green), and B (blue), for example.

Figure 16:
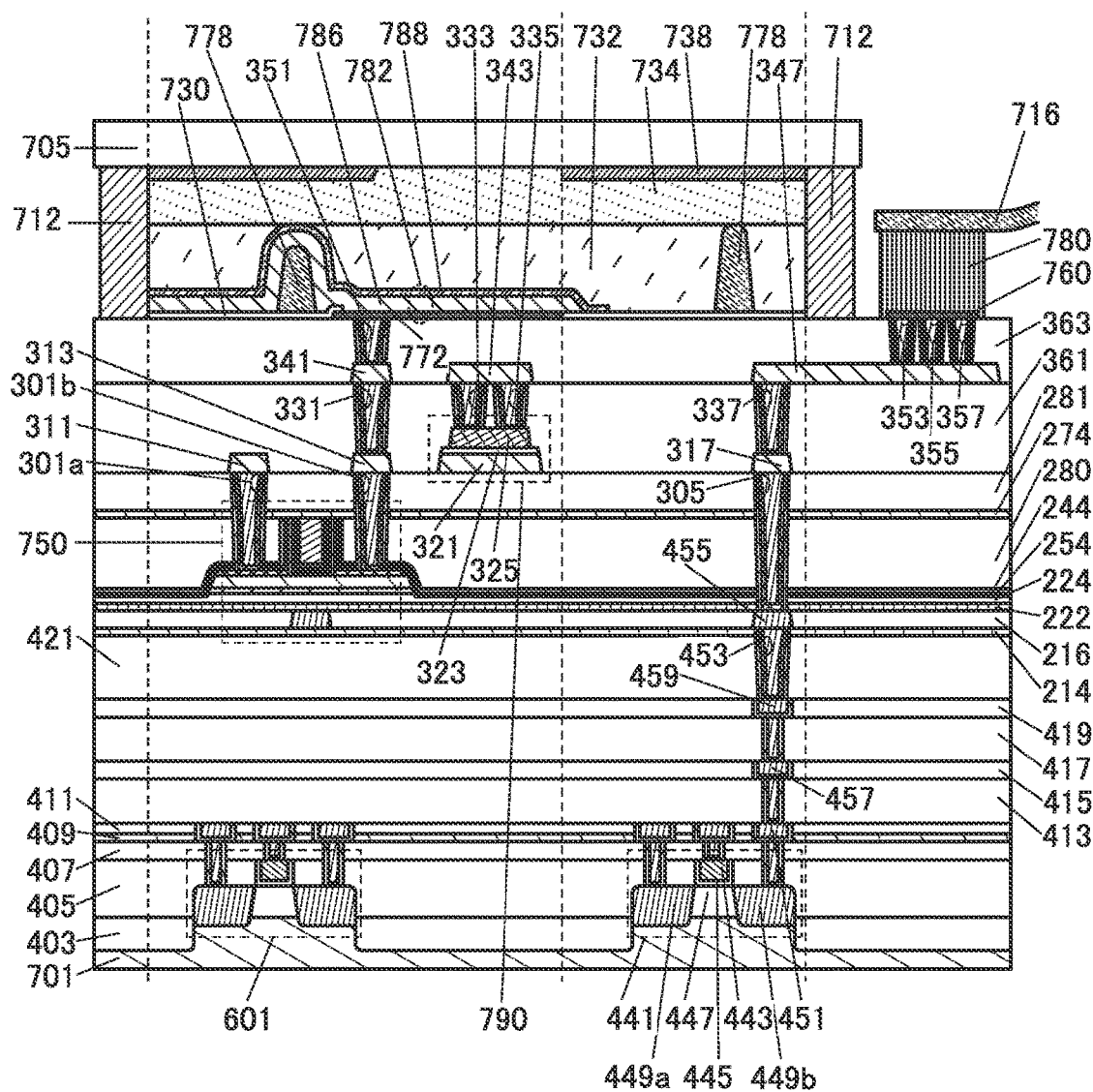
FIG. 16 is an example of a cross-sectional view of a semiconductor device.

In the semiconductor device 10 having the structure illustrated in FIG. 15, a liquid crystal element is used as a display element; however, one embodiment of the present invention is not limited thereto. FIG. 16 illustrates a modification example of the semiconductor device 10 illustrated in FIG. 15 and differs from the semiconductor device 10 illustrated in FIG. 15 in that a light-emitting element is used as a display element.

The semiconductor device 10 illustrated in FIG. 16 includes a light-emitting element 782. The light-emitting element 782 includes the conductor 772, an EL layer 786, and a conductor 788. The EL layer 786 contains an organic compound or an inorganic compound such as quantum dots.

Examples of materials that can be used as an organic compound include a fluorescent material and a phosphorescent material. Examples of materials that can be used as quantum dots include a colloidal quantum dot material, an alloyed quantum dot material, a core-shell quantum dot material, and a core quantum dot material.

In the semiconductor device 10 illustrated in FIG. 16, an insulator 730 is provided over the insulator 363. Here, the insulator 730 can cover part of the conductor 772. The light-emitting element 782 is a top-emission light-emitting element including the conductor 788 with a light-transmitting property. Note that the light-emitting element 782 may have a bottom emission structure in which light is emitted to the conductor 772 side or a dual emission structure in which light is emitted toward both the conductor 772 and the conductor 788.

The light-emitting element 782 can have a microcavity structure, which is described later in detail. Thus, light of predetermined colors (e.g., RGB) can be extracted without a coloring layer, and the semiconductor device 10 can perform color display. The structure without a coloring layer can inhibit light absorption due to the coloring layer. As a result, the semiconductor device 10 can display high-luminance images, and power consumption of the semiconductor device 10 can be reduced. Note that a structure in which a coloring layer is not provided can be employed even when the EL layer 786 is formed into an island shape for each pixel or into a stripe shape for each pixel column, i.e., the EL layer 786 is formed by separate coloring.

The light-blocking layer 738 is provided to include a region overlapping the insulator 730. The light-blocking layer 738 is covered with the insulator 734. A space between the light-emitting element 782 and the insulator 734 is filled with a sealing layer 732.

The component 778 is provided between the insulator 730 and the EL layer 786. Moreover, the component 778 is provided between the insulator 730 and the insulator 734.

Figure 17:
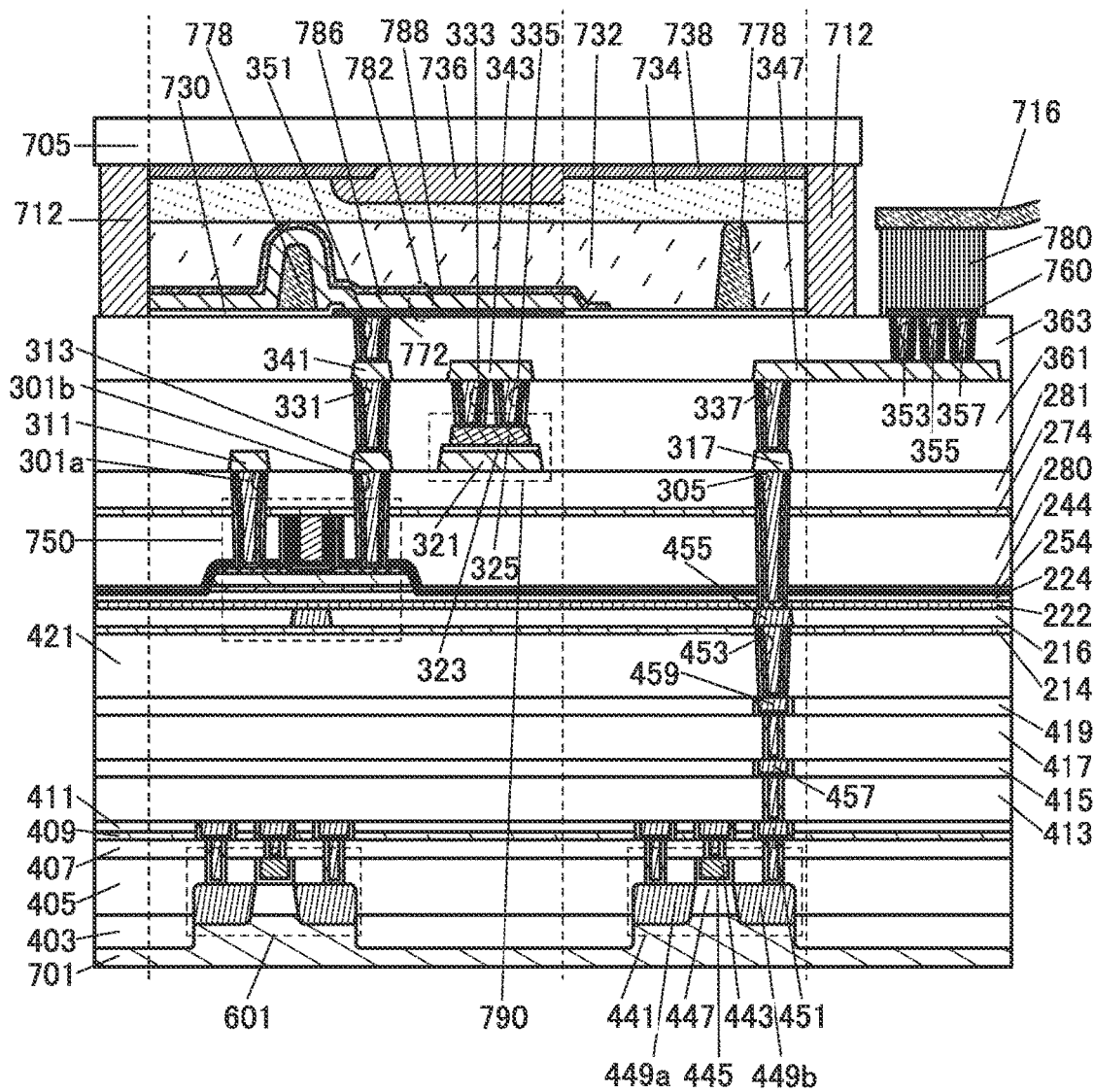
FIG. 17 is an example of a cross-sectional view of a semiconductor device.

FIG. 17 illustrates a modification example of the semiconductor device 10 illustrated in FIG. 16 and differs from the semiconductor device 10 illustrated in FIG. 16 in that the coloring layer 736 is provided. Providing the coloring layer 736 can improve the color purity of light extracted from the light-emitting element 782. Thus, the semiconductor device 10 can display high-quality images. Furthermore, all the light-emitting elements 782, for example, in the semiconductor device 10 can be light-emitting elements that emit white light; hence, the EL layers 786 are not necessarily formed by separate coloring, leading to higher definition of the semiconductor device 10.

Figure 18:
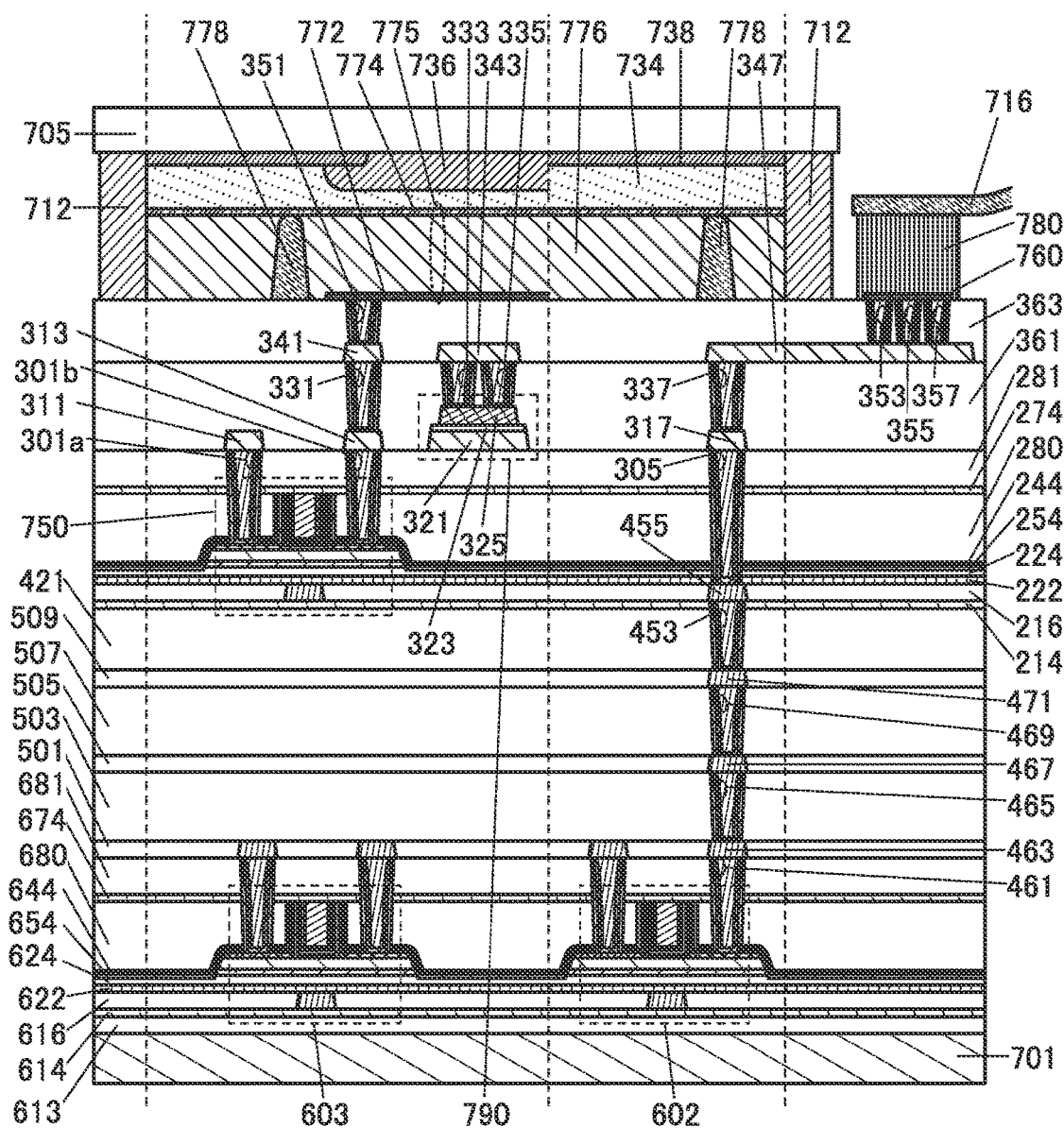
FIG. 18 is an example of a cross-sectional view of a semiconductor device.
Figure 19:
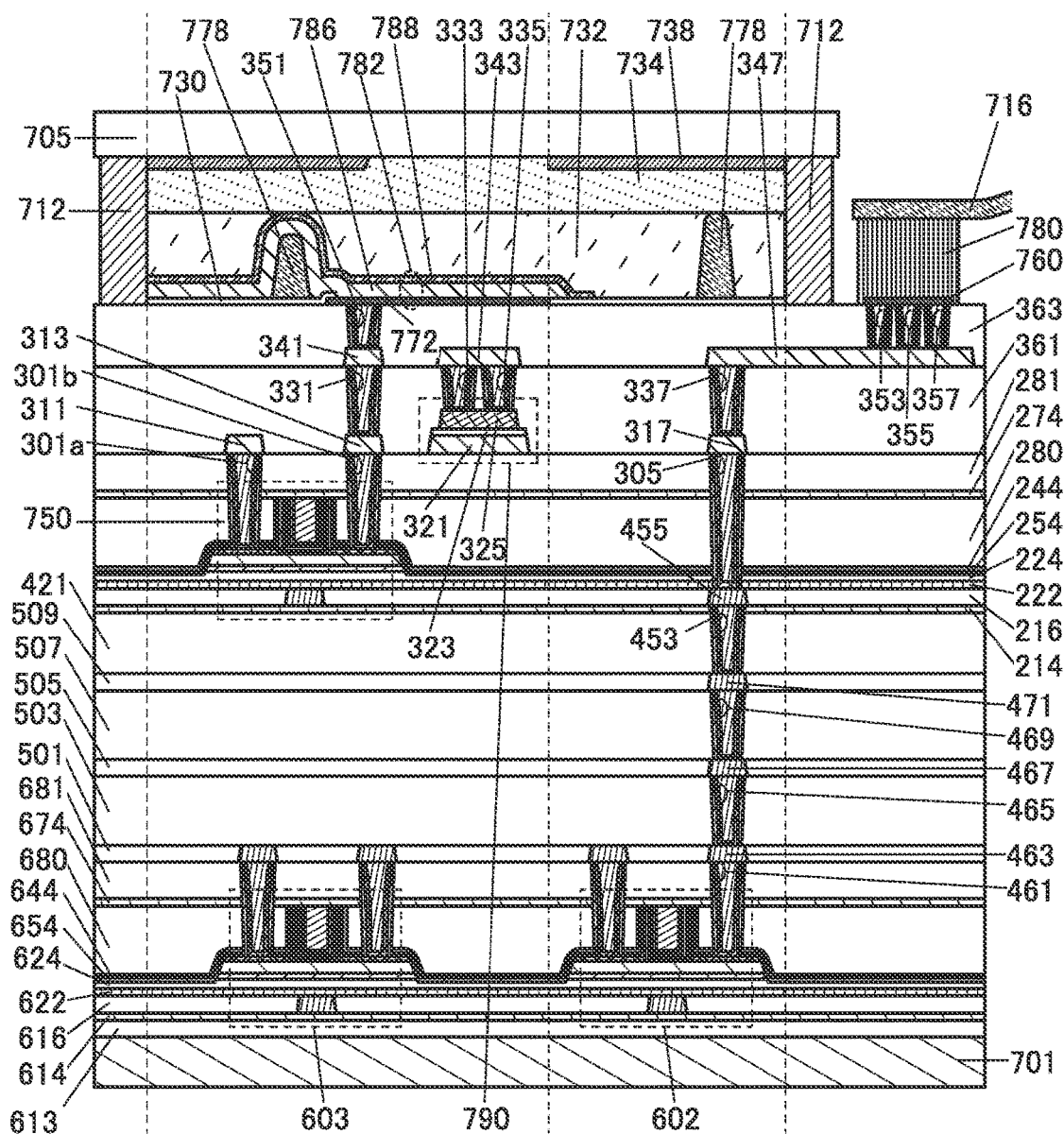
FIG. 19 is an example of a cross-sectional view of a semiconductor device.
Figure 20:
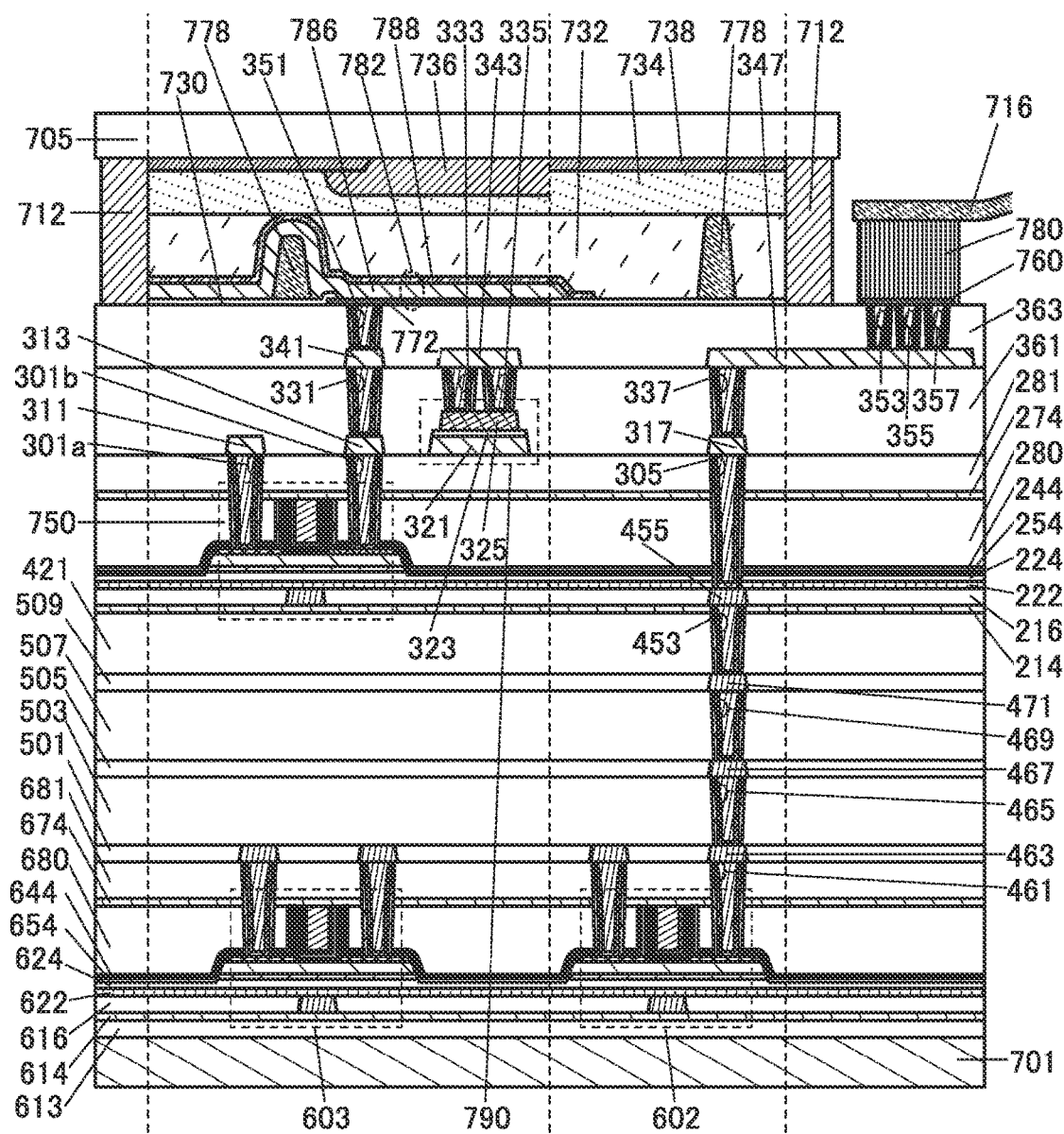
FIG. 20 is an example of a cross-sectional view of a semiconductor device.

Although FIG. 15 to FIG. 17 each illustrate a structure where the transistor 441 and the transistor 601 are provided so that their channel formation regions are formed inside the substrate 701 and the OS transistor is stacked over the transistor 441 and the transistor 601, one embodiment of the present invention is not limited thereto. FIG. 18 illustrates a modification example of FIG. 15, FIG. 19 illustrates a modification example of FIG. 16, and FIG. 20 illustrates a modification example of FIG. 17. The semiconductor devices 10 in FIG. 18 to FIG. 20 differ from the semiconductor devices 10 having the structures illustrated in FIG. 15 to FIG. 17 in that the transistor 750 is provided to be stacked not over the transistor 441 and the transistor 601 but over a transistor 602 and a transistor 603 that are OS transistors. That is, the semiconductor device 10 having the structure illustrated in any of FIG. 18 to FIG. 20 includes a stack of OS transistors.

An insulator 613 and an insulator 614 are provided over the substrate 701, and the transistor 602 and the transistor 603 are provided over the insulator 614. Note that a transistor or the like may be provided between the substrate 701 and the insulator 613. For example, a transistor having a structure similar to that of the transistor 441 and the transistor 601 illustrated in FIG. 15 to FIG. 17 may be provided between the substrate 701 and the insulator 613.

The transistor 602 can be a transistor provided in the circuit 40. The transistor 603 can be a transistor provided in the gate driver circuit 21 or a transistor provided in the source driver circuit 22. That is, the transistor 602 and the transistor 603 can be provided in the layer 20 illustrated in FIG. 1 and the like. Note that when the circuit 40 is provided in the layer 30, the transistor 602 can be provided in the layer 30.

The transistor 602 and the transistor 603 can have a structure similar to that of the transistor 750. Note that the transistor 602 and the transistor 603 may be OS transistors having a structure different from that of the transistor 750.

An insulator 616, an insulator 622, an insulator 624, an insulator 654, an insulator 644, an insulator 680, an insulator 674, and an insulator 681 are provided over the insulator 614, in addition to the transistor 602 and the transistor 603. A conductor 461 is embedded in the insulator 654, the insulator 644, the insulator 680, the insulator 674, and the insulator 681. Here, the top surface of the conductor 461 and the top surface of the insulator 681 can be substantially level with each other.

An insulator 501 is provided over the conductor 461 and the insulator 681. A conductor 463 is embedded in the insulator 501. Here, the top surface of the conductor 463 and the top surface of the insulator 501 can be substantially level with each other.

An insulator 503 is provided over the conductor 463 and the insulator 501. A conductor 465 is embedded in the insulator 503. Here, the top surface of the conductor 465 and the top surface of the insulator 503 can be substantially level with each other.

An insulator 505 is provided over the conductor 465 and the insulator 503. A conductor 467 is embedded in the insulator 505. Here, the top surface of the conductor 467 and the top surface of the insulator 505 can be substantially level with each other.

An insulator 507 is provided over the conductor 467 and the insulator 505. A conductor 469 is embedded in the insulator 507. Here, the top surface of the conductor 469 and the top surface of the insulator 507 can be substantially level with each other.

An insulator 509 is provided over the conductor 469 and the insulator 507. A conductor 471 is embedded in the insulator 509. Here, the top surface of the conductor 471 and the top surface of the insulator 509 can be substantially level with each other.

The insulator 421 and the insulator 214 are provided over the conductor 471 and the insulator 509. The conductor 453 is embedded in the insulator 421 and the insulator 214. Here, the top surface of the conductor 453 and the top surface of the insulator 214 can be substantially level with each other.

As illustrated in FIG. 18 to FIG. 20, one of a source and a drain of the transistor 602 is electrically connected to the FPC 716 through the conductor 461, the conductor 463, the conductor 465, the conductor 467, the conductor 469, the conductor 471, the conductor 453, the conductor 455, the conductor 305, the conductor 317, the conductor 337, the conductor 347, the conductor 353, the conductor 355, the conductor 357, the connection electrode 760, and the anisotropic conductor 780.

The insulator 613, the insulator 614, the insulator 680, the insulator 674, the insulator 681, the insulator 501, the insulator 503, the insulator 505, the insulator 507, and the insulator 509 have a function of an interlayer film and may also have a function of a planarization film that covers unevenness thereunder.

When the semiconductor device 10 has the structure illustrated in any of FIG. 18 to FIG. 20, all the transistors included in the semiconductor device 10 can be OS transistors while the frame and size of the semiconductor device 10 are reduced. Consequently, different types of transistors do not need to be formed, whereby the manufacturing cost of the semiconductor device 10 can be reduced and thus the semiconductor device 10 can be inexpensive.

<Structure Examples of Light-Emitting Element>

Figure 21A:
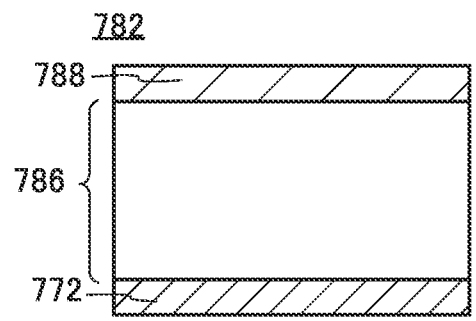
FIG. 21A, FIG. 21B, FIG. 21C, FIG. 21D, and FIG. 21E are diagrams each illustrating a structure example of a light-emitting element.

FIG. 21A to FIG. 21E illustrate structure examples of the light-emitting element 782. FIG. 21A illustrates a structure where the EL layer 786 is positioned between the conductor 772 and the conductor 788 (a single structure). As described above, the EL layer 786 contains a light-emitting material, for example, a light-emitting material of an organic compound.

Figure 21B:
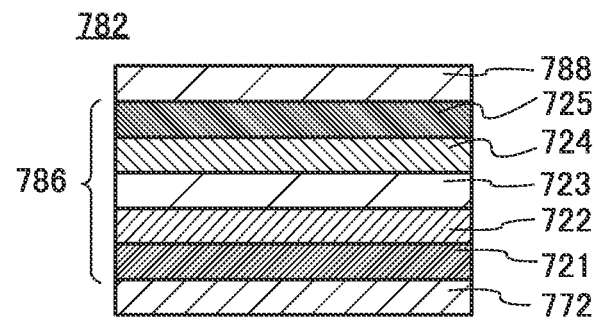

FIG. 21B illustrates a stacked-layer structure of the EL layer 786. In the light-emitting element 782 with the structure illustrated in FIG. 21B, the conductor 772 has a function of an anode and the conductor 788 has a function of a cathode.

The EL layer 786 has a structure in which a hole-injection layer 721, a hole-transport layer 722, a light-emitting layer 723, an electron-transport layer 724, and an electron-injection layer 725 are stacked in this order over the conductor 772. Note that the order of the stacked layers is reversed when the conductor 772 has a function of a cathode and the conductor 788 has a function of an anode.

The light-emitting layer 723 contains a light-emitting material and a plurality of materials in appropriate combination, so that fluorescence or phosphorescence of a desired emission color can be obtained. The light-emitting layer 723 may have a stacked-layer structure having different emission colors. In that case, light-emitting substances and other substances are different between the stacked light-emitting layers.

For example, when the light-emitting element 782 has a micro optical resonator (microcavity) structure with the conductor 772 and the conductor 788 in FIG. 21B serving as a reflective electrode and a transflective electrode, respectively, light emitted from the light-emitting layer 723 included in the EL layer 786 can be resonated between the electrodes and thus the light emitted through the conductor 788 can be intensified.

Note that when the conductor 772 of the light-emitting element 782 is a reflective electrode having a stacked-layer structure of a reflective conductive material and a light-transmitting conductive material (a transparent conductive film), optical adjustment can be performed by controlling the thickness of the transparent conductive film. Specifically, when the wavelength of light from the light-emitting layer 723 is λ, the distance between the conductor 772 and the conductor 788 is preferably adjusted to around mλ/2 (m is a natural number).

To amplify desired light (wavelength: λ) obtained from the light-emitting layer 723, the optical path length from the conductor 772 to a region where desired light is obtained in the light-emitting layer 723 (a light-emitting region) and the optical path length from the conductor 788 to the region where desired light is obtained in the light-emitting layer 723 (the light-emitting region) are preferably adjusted to around (2m'+1)×/4 (m' is a natural number). Here, the light-emitting region means a region where holes and electrons are recombined in the light-emitting layer 723.

By such optical adjustment, the spectrum of specific monochromatic light emitted from the light-emitting layer 723 can be narrowed and light emission with high color purity can be obtained.

In the above case, the optical path length between the conductor 772 and the conductor 788 is, to be exact, the total thickness between a reflective region in the conductor 772 and a reflective region in the conductor 788. However, it is difficult to precisely determine the reflection region in the conductor 772 and the conductor 788; hence, it is assumed that the above effect is sufficiently obtained with given positions in the conductor 772 and the conductor 788 being supposed to be reflective regions. Furthermore, the optical path length between the conductor 772 and the light-emitting layer where desired light is obtained is, to be exact, the optical path length between the reflective region in the conductor 772 and the light-emitting region where desired light is obtained in the light-emitting layer. However, it is difficult to precisely determine the reflective region in the conductor 772 and the light-emitting region where desired light is obtained in the light-emitting layer; thus, it is assumed that the above effect can be sufficiently obtained with a given position in conductor 772 being supposed to be the reflective region and a given position in the light-emitting layer where desired light is obtained being supposed to be the light-emitting region.

The light-emitting element 782 illustrated in FIG. 21B has a microcavity structure, so that light (monochromatic light) with different wavelengths can be extracted from different light-emitting elements including the same EL layer. Thus, separate coloring for obtaining a plurality of emission colors (e.g., RGB) is not necessary. Therefore, high definition can be easily achieved. In addition, a combination with coloring layers is also possible. Furthermore, the emission intensity of light with a specific wavelength in the front direction can be increased, whereby power consumption can be reduced.

Note that the light-emitting element 782 illustrated in FIG. 21B does not necessarily have a microcavity structure. In the case where a microcavity structure is not employed, light of predetermined colors (e.g., RGB) can be extracted when the light-emitting layer 723 has a structure for emitting white light and coloring layers are provided. When the EL layers 786 are formed by separate coloring for obtaining different emission colors, light of predetermined colors can be extracted without providing coloring layers.

At least one of the conductor 772 and the conductor 788 can be a light-transmitting electrode (e.g., a transparent electrode or a transflective electrode). In the case where the light-transmitting electrode is a transparent electrode, the transparent electrode has a visible light transmittance higher than or equal to 40%. In the case where the light-transmitting electrode is a transflective electrode, the visible light reflectance of the transflective electrode is higher than or equal to 20% and lower than or equal to 80%, preferably higher than or equal to 40% and lower than or equal to 70%. These electrodes preferably have a resistivity less than or equal to $1\times10^{-2}$ Ωcm.

When the conductor 772 or the conductor 788 is an electrode having reflectivity (a reflective electrode), the visible light reflectance of the reflective electrode is higher than or equal to 40% and lower than or equal to 100%, preferably higher than or equal to 70% and lower than or equal to 100%. This electrode preferably has a resistivity less than or equal to $1\times10^{-2}$ Ωcm.

Figure 21C:
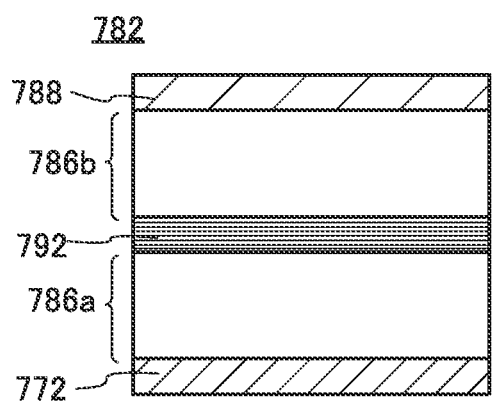

The light-emitting element 782 may have a structure illustrated in FIG. 21C. FIG. 21C illustrates the light-emitting element 782 having a stacked-layer structure (a tandem structure) in which two EL layers (an EL layer 786a and an EL layer 786b) are provided between the conductor 772 and the conductor 788, and a charge generation layer 792 is provided between the EL layer 786a and the EL layer 786b. When the light-emitting element 782 has the tandem structure, the current efficiency and external quantum efficiency of the light-emitting element 782 can be increased. Thus, the semiconductor device 10 can display high-luminance images. Moreover, power consumption of the semiconductor device 10 can be reduced. Here, the EL layer 786a and the EL layer 786b can have a structure similar to that of the EL layer 786 illustrated in FIG. 21B.

The charge generation layer 792 has a function of injecting electrons into one of the EL layer 786a and the EL layer 786b and injecting holes to the other of the EL layer 786a and the EL layer 786b when a voltage is supplied between the conductor 772 and the conductor 788. Accordingly, when a voltage is supplied such that the potential of the conductor 772 becomes higher than the potential of the conductor 788, electrons are injected into the EL layer 786a from the charge generation layer 792 and holes are injected into the EL layer 786b from the charge generation layer 792.

Note that in terms of light extraction efficiency, the charge generation layer 792 preferably transmits visible light (specifically, the visible light transmittance of the charge generation layer 792 is preferably 40% or higher). The conductivity of the charge generation layer 792 may be lower than the conductivity of the conductor 772 or the conductivity of the conductor 788.

Figure 21D:
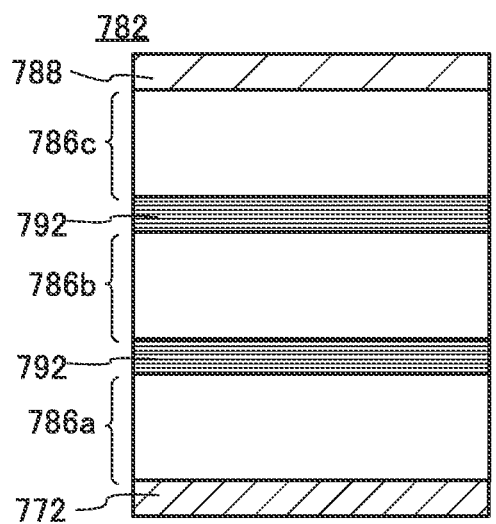

The light-emitting element 782 may have a structure illustrated in FIG. 21D. FIG. 21D illustrates the light-emitting element 782 having a tandem structure in which three EL layers (the EL layer 786a, the EL layer 786b, and an EL layer 786c) are provided between the conductor 772 and the conductor 788, and the charge generation layer 792 is provided between the EL layer 786a and the EL layer 786b and between the EL layer 786b and the EL layer 786c. Here, the EL layer 786a, the EL layer 786b, and the EL layer 786c can have a structure similar to that of the EL layer 786 illustrated in FIG. 21B. When the light-emitting element 782 has the structure illustrated in FIG. 21D, the current efficiency and external quantum efficiency of the light-emitting element 782 can be further increased. As a result, the semiconductor device 10 can display higher-luminance images. Moreover, power consumption of the semiconductor device 10 can be further reduced.

Figure 21E:
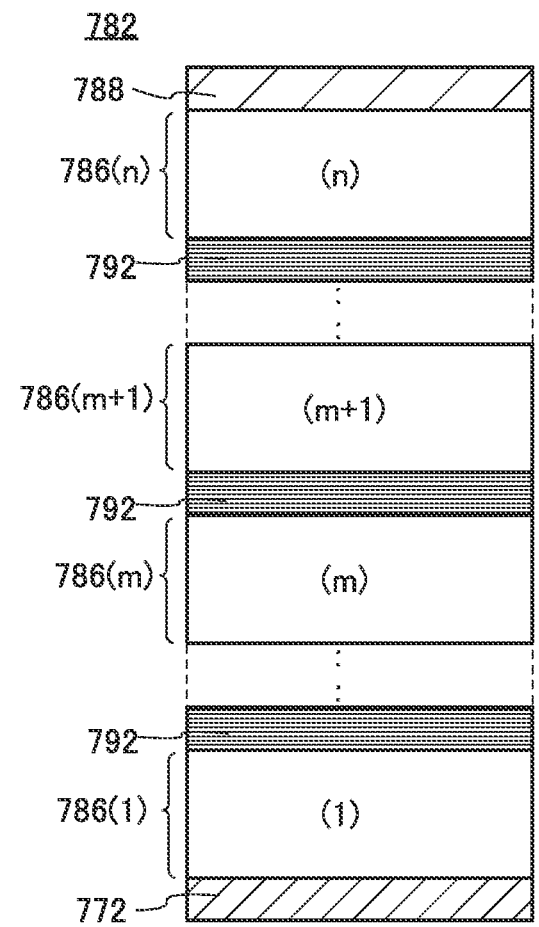

The light-emitting element 782 may have a structure illustrated in FIG. 21E. FIG. 21E illustrates the light-emitting element 782 having a tandem structure in which n EL layers (an EL layer 786(1) to an EL layer 786(n)) are provided between the conductor 772 and the conductor 788, and the charge generation layer 792 is provided between the EL layers 786. Here, the EL layer 786(1) to the EL layer 786(n) can have a structure similar to that of the EL layer 786 illustrated in FIG. 21B. Note that FIG. 21E illustrates the EL layer 786(1), the EL layer 786(m), and the EL layer 786(n) among the EL layers 786. Here, m is an integer greater than or equal to 2 and less than n, and n is an integer greater than or equal to m. As n becomes larger, the current efficiency and external quantum efficiency of the light-emitting element 782 can be increased. Thus, the semiconductor device 10 can display high-luminance images. Moreover, power consumption of the semiconductor device 10 can be reduced.

<Materials for Light-Emitting Element>

Next, materials that can be used for the light-emitting element 782 will be described.

«Conductor 772 and Conductor 788»

For the conductor 772 and the conductor 788, any of the following materials can be used in an appropriate combination as long as the functions of the anode and the cathode can be fulfilled. For example, a metal, an alloy, an electrically conductive compound, a mixture of these, and the like can be used as appropriate. Specific examples include In—Sn oxide (also referred to as ITO), In—Si—Sn oxide (also referred to as ITSO), In—Zn oxide, and In—W—Zn oxide. In addition, it is possible to use a metal such as aluminum (Al), titanium (Ti), chromium (Cr), manganese (Mn), iron (Fe), cobalt (Co), nickel (Ni), copper (Cu), gallium (Ga), zinc (Zn), indium (In), tin (Sn), molybdenum (Mo), tantalum (Ta), tungsten (W), palladium (Pd), gold (Au), platinum (Pt), silver (Ag), yttrium (Y), or neodymium (Nd) or an alloy containing an appropriate combination of any of these metals. It is also possible to use an element that belongs to Group 1 or Group 2 of the periodic table and is not described above (e.g., lithium (Li), cesium (Cs), calcium (Ca), or strontium (Sr)), a rare earth metal such as europium (Eu) or ytterbium (Yb), an alloy containing an appropriate combination of any of these, graphene, or the like.

«Hole-Injection Layer 721 and Hole-Transport Layer 722»

The hole-injection layer 721 injects holes to the EL layer 786 from the conductor 772, which is an anode, or the charge generation layer 792 and contains a material with a high hole-injection property. Here, the EL layer 786 includes the EL layer 786a, the EL layer 786b, the EL layer 786c, and the EL layer 786(1) to the EL layer 786(n).

Examples of the material having a high hole-injection property include transition metal oxides such as molybdenum oxide, vanadium oxide, ruthenium oxide, tungsten oxide, and manganese oxide. Alternatively, it is possible to use phthalocyanine-based compounds such as phthalocyanine (abbreviation: H$_2$Pc) and copper phthalocyanine (abbreviation: CuPc); aromatic amine compounds such as 4,4'-bis[N-(4-diphenylaminophenyl)-N-phenylamino]biphenyl (abbreviation: DPAB) and N,N'-bis{4-[bis(3-methylphenyl)amino]phenyl}-N,N'-diphenyl-(1,1'-biphenyl)-4,4'-diamine (abbreviation: DNTPD); high molecular compounds such as poly(3,4-ethylenedioxythiophene)/poly(styrenesulfonic acid) (abbreviation: PEDOT/PSS); or the like.

Alternatively, as the material having a high hole-injection property, a composite material containing a hole-transport material and an acceptor material (an electron-accepting material) can be used. In that case, the acceptor material extracts electrons from the hole-transport material, so that holes are generated in the hole-injection layer 721 and the holes are injected into the light-emitting layer 723 through the hole-transport layer 722. Note that the hole-injection layer 721 may be formed as a single layer made of a composite material containing a hole-transport material and an acceptor material (an electron-accepting material), or may be formed by stacking a layer containing a hole-transport material and a layer containing an acceptor material (an electron-accepting material).

The hole-transport layer 722 transports the holes, which are injected from the conductor 772 by the hole-injection layer 721, to the light-emitting layer 723. Note that the hole-transport layer 722 contains a hole-transport material. It is particularly preferable that the HOMO level of the hole-transport material used for the hole-transport layer 722 be the same as or close to that of the hole-injection layer 721.

Examples of the acceptor material used for the hole-injection layer 721 include oxides of a metal belonging to any of Group 4 to Group 8 of the periodic table. Specific examples include molybdenum oxide, vanadium oxide, niobium oxide, tantalum oxide, chromium oxide, tungsten oxide, manganese oxide, and rhenium oxide. Among these, molybdenum oxide is particularly preferable since it is stable in the air, has a low hygroscopic property, and is easy to handle. Furthermore, organic acceptors such as a quinodimethane derivative, a chloranil derivative, and a hexaazatriphenylene derivative can be used. Specifically, 7,7,8,8-tetracyano-2,3,5,6-tetrafluoroquinodimethane (abbreviation: F$_4$-TCNQ), chloranil, 2,3,6,7,10,11-hexacyano-1,4,5,8,9,12-hexaazatriphenylene (abbreviation: HAT-CN), and the like can be used.

The hole-transport materials used for the hole-injection layer 721 and the hole-transport layer 722 are preferably substances with a hole mobility greater than or equal to $10^{-6}$ cm$^2$/Vs. Note that other substances can also be used as long as they have a property of transporting more holes than electrons.

Preferred hole-transport materials are π-electron rich heteroaromatic compounds (e.g., carbazole derivatives and indole derivatives) and aromatic amine compounds. Specific examples include compounds having an aromatic amine skeleton, such as 4,4'-bis[N-(1-naphthyl)-N-phenylamino]biphenyl (abbreviation: NPB or α-NPD), N,N'-bis(3-methylphenyl)-N,N'-diphenyl-[1,1'-biphenyl]-4,4'-diamine (abbreviation: TPD), 4,4'-bis[N-(spiro-9,9'-bifluoren-2-yl)-N-phenylamino]biphenyl (abbreviation: BSPB), 4-phenyl-4'-(9-phenylfluoren-9-yl)triphenylamine (abbreviation: BPAFLP), 4-phenyl-3'-(9-phenylfluoren-9-yl)triphenylamine (abbreviation: mBPAFLP), 4-phenyl-4'-(9-phenyl-9H-carbazol-3-yl)triphenylamine (abbreviation: PCBA1BP), 3-[4-(9-phenanthryl)-phenyl]-9-phenyl-9H-carbazole (abbreviation: PCPPn), N-(4-biphenyl)-N-(9,9-dimethyl-9H-fluoren-2-yl)-9-phenyl-9H-carbazol-3-amine (abbreviation: PCBiF), N-(1,1'-biphenyl-4-yl)-N-[4-(9-phenyl-9H-carbazol-3-yl)phenyl]-9,9-dimethyl-9H-fluoren-2-amine abbreviation: PCBBiF), 4,4'-diphenyl-4"-(9-phenyl-9H-carbazol-3-yl)triphenylamine (abbreviation: PCBBi1BP), 4-(1-naphthyl)-4'-(9-phenyl-9H-carbazol-3-yl)triphenylamine (abbreviation: PCBANB), 4,4'-di(1-naphthyl)-4"-(9-phenyl-9H-carbazol-3-yl)triphenylamine (abbreviation: PCBNBB), 9,9-dimethyl-N-phenyl-N-[4-(9-phenyl-9H-carbazol-3-yl)phenyl]fluoren-2-amine (abbreviation: PCBAF), N-phenyl-N-[4-(9-phenyl-9H-carbazol-3-yl)phenyl]spiro-9,9'-bifluoren-2-amine (abbreviation: PCBASF), 4,4',4"-tris(carbazol-9-yl)triphenylamine (abbreviation: TCTA), 4,4',4"-tris(N,N-diphenylamino)triphenylamine (abbreviation: TDATA), and 4,4',4"-tris[N-(3-methylphenyl)-N-phenylamino]triphenylamine (abbreviation: MTDATA); compounds having a carbazole skeleton, such as 1,3-bis(N-carbazolyl)benzene (abbreviation: mCP), 4,4'-di(N-carbazolyl)biphenyl (abbreviation: CBP), 3,6-bis(3,5-diphenylphenyl)-9-phenylcarbazole (abbreviation: CzTP), 3,3'-bis(9-phenyl-9H-carbazole) (abbreviation: PCCP), 3-[N-(9-phenylcarbazol-3-yl)-N-phenylamino]-9-phenylcarbazole (abbreviation: PCzPCA1), 3,6-bis[N-(9-phenylcarbazol-3-yl)-N-phenylamino]-9-phenylcarbazole (abbreviation: PCzPCA2), 3-[N-(1-naphthyl)-N-(9-phenylcarbazol-3-yl)amino]-9-phenylcarbazole (abbreviation: PCzPCN1), 1,3,5-tris[4-(N-carbazolyl)phenyl] benzene (abbreviation: TCPB), and 9-[4-(10-phenyl-9-anthracenyl)phenyl]-9H-carbazole (abbreviation: CzPA); compounds having a thiophene skeleton, such as 4,4',4"-(benzene-1,3,5-triyl)tri(dibenzothiophene) (abbreviation: DBT3P-II), 2,8-diphenyl-4-[4-(9-phenyl-9H-fluoren-9-yl) phenyl]dibenzothiophene (abbreviation: DBTFLP-III), and 4-[4-(9-phenyl-9H-fluoren-9-yl)phenyl]-6-phenyldibenzothiophene (abbreviation: DBTFLP-IV); and compounds having a furan skeleton, such as 4,4',4"-(benzene-1,3,5-triyl) tri(dibenzofuran) (abbreviation: DBF3P-II) and 4-{3-[3-(9-phenyl-9H-fluoren-9-yl)phenyl]phenyl}dibenzofuran (abbreviation: mmDBFFLBi-II).

High molecular compounds such as poly(N-vinylcarbazole) (abbreviation: PVK), poly(4-vinyltriphenylamine) (abbreviation: PVTPA), poly[N-(4-{N'-[4-(4-diphenylamino) phenyl]phenyl-N'-phenylamino}phenyl)methacrylamide] (abbreviation: PTPDMA), and poly [N,N'-bis(4-butylphenyl)-N,N'-bis(phenyl)benzidine] (abbreviation: Poly-TPD) can also be used.

The hole-transport material is not limited to the above examples, and one of or a combination of various known materials can be used as the hole-transport material for the hole-injection layer 721 and the hole-transport layer 722. Note that the hole-transport layer 722 may be formed of a plurality of layers. That is, a first hole-transport layer and a second hole-transport layer may be stacked, for example.

«Light-Emitting Layer 723»

The light-emitting layer 723 is a layer containing a light-emitting substance. Note that as the light-emitting substance, a substance that exhibits an emission color of blue, purple, bluish purple, green, yellowish green, yellow, orange, red, or the like is appropriately used. Here, when the light-emitting element 782 includes a plurality of EL layers as illustrated in FIG. 21C, FIG. 21D, and (E), the use of different light-emitting substances for the light-emitting layers 723 in the EL layers enables different emission colors to be exhibited (e.g., it enables white light emission obtained by combining complementary emission colors). For example, when the light-emitting element 782 has the structure illustrated in FIG. 21C, the use of different light-emitting substances for the light-emitting layer 723 in the EL layer 786a and the light-emitting layer 723 in the EL layer 786b can achieve different emission colors of the EL layer 786a and the EL layer 786b. Note that a stacked-layer structure in which one light-emitting layer contains different light-emitting substances may be employed.

The light-emitting layer 723 may contain one or more kinds of organic compounds (a host material and an assist material) in addition to a light-emitting substance (a guest material). As one or more kinds of organic compounds, one or both of the hole-transport material and the electron-transport material can be used.

When the light-emitting element 782 has the structure illustrated in FIG. 21C, it is preferred that a light-emitting substance that emits blue light (a blue-light-emitting substance) be used as a guest material in one of the EL layer 786a and the EL layer 786b and a substance that emits green light (a green-light-emitting substance) and a substance that emits red light (a red-light-emitting substance) be used in the other EL layer. This manner is effective when the blue-light-emitting substance (the blue-light-emitting layer) has lower light emission efficiency or a shorter lifetime than the others. Here, it is preferred that a light-emitting substance that converts singlet excitation energy into light in the visible light range be used as the blue-light-emitting substance and light-emitting substances that convert triplet excitation energy into light in the visible light range be used as the green- and red-light-emitting substances, whereby the spectrum balance between R, G, and B is improved.

There is no particular limitation on the light-emitting substance that can be used for the light-emitting layer 723, and it is possible to use a light-emitting substance that converts singlet excitation energy into light in the visible light range or a light-emitting substance that converts triplet excitation energy into light in the visible light range. Examples of the light-emitting substance are given below.

As an example of the light-emitting substance that converts singlet excitation energy into light, a substance that exhibits fluorescence (a fluorescent material) can be given. Examples include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative. A pyrene derivative is particularly preferable because it has a high emission quantum yield. Specific examples of the pyrene derivative include N,N'-bis(3-methylphenyl)-N,N'-bis[3-(9-phenyl-9H-fluoren-9-yl)phenyl] pyrene-1,6-diamine (abbreviation: 1,6mMemFLPAPrn), N,N'-diphenyl-N,N'-bis[4-(9-phenyl-9H-fluoren-9-yl)phenyl]pyrene-1,6-diamine (abbreviation: 1,6FLPAPrn), N,N'-bis(dibenzofuran-2-yl)-N,N'-diphenylpyrene-1,6-diamine (abbreviation: 1,6FrAPrn), N,N'-bis(dibenzothiophen-2-yl)-N,N'-diphenylpyrene-1,6-diamine (abbreviation: 1,6ThAPrn), N,N'-(pyrene-1,6-diyl)bis[(N-phenylbenzo[b] naphtho[1,2-d]furan)-6-amine] (abbreviation: 1,6BnfAPrn), N,N'-(pyrene-1,6-diyl)bis[(N-phenylbenzo[b]naphtho[1,2-d]furan)-8-amine] (abbreviation: 1,6BnfAPrn-02), and N,N'-(pyrene-1,6-diyl)bis[(6,N-diphenylbenzo[b]naphtho [1,2-d]furan)-8-amine] (abbreviation: 1,6BnfAPrn-03). In addition, pyrene derivatives are compounds effective for meeting the chromaticity of blue in one embodiment of the present invention.

In addition, it is possible to use 5,6-bis[4-(10-phenyl-9-anthryl)phenyl]-2,2'-bipyridine (abbreviation: PAP2BPy), 5,6-bis[4'-(10-phenyl-9-anthryl)biphenyl-4-yl]-2,2'-bipyridine (abbreviation: PAPP2BPy), N,N'-bis[4-(9H-carbazol-9-yl)phenyl]-N,N'-diphenylstilbene-4,4'-diamine (abbreviation: YGA2S), 4-(9H-carbazol-9-yl)-4'-(10-phenyl-9-anthryl)triphenylamine (abbreviation: YGAPA), 4-(9H-carbazol-9-yl)-4'-(9,10-diphenyl-2-anthryl)triphenylamine (abbreviation: 2YGAPPA), N,9-diphenyl-N-[4-(10-phenyl-9-anthryl)phenyl]-9H-carbazol-3-amine (abbreviation: PCAPA), 4-(10-phenyl-9-anthryl)-4'-(9-phenyl-9H-carbazol-3-yl)triphenylamine (abbreviation: PCBAPA), 4-[4-(10-phenyl-9-anthryl)phenyl]-4'-(9-phenyl-9H-carbazol-3-yl) triphenylamine (abbreviation: PCBAPBA), perylene, 2,5,8, 11-tetra(tert-butyl)perylene (abbreviation: TBP), N,N"-(2-tert-butylanthracene-9,10-diyldi-4,1-phenylene)bis[N,N', N'-triphenyl-1,4-phenylenediamine] (abbreviation: DPABPA), N,9-diphenyl-N-[4-(9,10-diphenyl-2-anthryl) pheny]-9H-carbazol-3-amine (abbreviation: 2PCAPPA), N-[4-(9,10-diphenyl-2-anthryl)phenyl]-N,N',N'-triphenyl-1, 4-phenylenediamine (abbreviation: 2DPAPPA), and the like.

Examples of the light-emitting substance that converts triplet excitation energy into light include a substance that exhibits phosphorescence (a phosphorescent material) and a thermally activated delayed fluorescence (TADF) material that exhibits thermally activated delayed fluorescence.

Examples of a phosphorescent material include an organometallic complex, a metal complex (platinum complex), and a rare earth metal complex. These substances exhibit different emission colors (emission peaks), and thus are used through appropriate selection as needed.

As a phosphorescent material that exhibits blue or green and whose emission spectrum has a peak wavelength at greater than or equal to 450 nm and less than or equal to 570 nm, the following substances can be given.

Examples include organometallic complexes having a 4H-triazole skeleton, such as tris{2-[5-(2-methylphenyl)-4-(2,6-dimethylphenyl)-4H-1,2,4-triazol-3-yl-κN2]phenyl-κC}iridium(III) (abbreviation: [Ir(mpptz-dmp)$_3$]), tris(5-methyl-3,4-diphenyl-4H-1,2,4-triazolato)iridium(III) (abbreviation: [Ir(Mptz)$_3$]), tris[4-(3-biphenyl)-5-isopropyl-3-phenyl-4H-1,2,4-triazolato]iridium(III) (abbreviation: [Ir(iPrptz-3b)$_3$]), and tris[3-(5-biphenyl)-5-isopropyl-4-phenyl-4H-1,2,4-triazolato]iridium(III) (abbreviation: [Ir(iPr5btz)$_3$]); organometallic complexes having a 1H-triazole skeleton, such as tris[3-methyl-1-(2-methylphenyl)-5-phenyl-1H-1,2,4-trizolato]iridium(III) (abbreviation: [Ir(Mptz1-mp)$_3$]) and tris(1-methyl-5-phenyl-3-propyl-1H-1,2,4-triazolato)iridium(III) (abbreviation: [Ir(Prptz1-Me)$_3$]); organometallic complexes having an imidazole skeleton, such as fac-tris[1-(2,6-diisopropylphenyl)-2-phenyl-1H-imidazole]iridium(III) (abbreviation: [Ir(iPrpmi)$_3$]) and tris[3-(2,6-dimethylphenyl)-7-methylimidazo[1,2-f]phenanthridinato]iridium(III) (abbreviation: [Ir(dmpimpt-Me)$_3$]); and organometallic complexes in which a phenylpyridine derivative having an electron-withdrawing group is a ligand, such as bis[2-(4',6'-difluorophenyl)pyridinato-N,C$^{2'}$]iridium(III) tetrakis(1-pyrazolyl)borate (abbreviation: FIr6), bis[2-(4',6'-difluorophenyl)pyridinato-N,C$^{2'}$]iridium(III) picolinate (abbreviation: FIrpic), bis[2-(3,5-bistrifluoromethyl-phenyl)-pyridinato-N,C$^{2'}$]iridium(III) picolinate (abbreviation: [Ir(CF$_3$ppy)$_2$(pic)]), and bis[2-(4',6'-difluorophenyl)pyridinato-N,C$^{2'}$]iridium(III) acetylacetonate (abbreviation: FIr(acac)).

As a phosphorescent material that exhibits green or yellow and whose emission spectrum has a peak wavelength at greater than or equal to 495 nm and less than or equal to 590 nm, the following substances can be given.

Examples include organometallic iridium complexes having a pyrimidine skeleton, such as tris(4-methyl-6-phenylpyrimidinato)iridium(III) (abbreviation: [Ir(mppm)$_3$]), tris(4-t-butyl-6-phenylpyrimidinato)iridium(III) (abbreviation: [Ir(tBuppm)$_3$]), (acetylacetonato)bis(6-methyl-4-phenylpyrimidinato)iridium(III) (abbreviation: [Ir(mppm)$_2$(acac)]), (acetylacetonato)bis(6-tert-butyl-4-phenylpyrimidinato)iridium(III) (abbreviation: [Ir(tBuppm)$_2$(acac)]), (acetylacetonato)bis[6-(2-norbornyl)-4-phenylpyrimidinato]iridium(III) (abbreviation: [Ir(nbppm)$_2$(acac)], (acetylacetonato)bis[5-methyl-6-(2-methylphenyl)-4-phenylpyrimidinato]iridium(III) (abbreviation: [Ir(mpmppm)$_2$(acac)]), (acetylacetonato)bis{4,6-dimethyl-2-[6-(2,6-dimethylphenyl)-4-pyrimidinyl-κN3]phenyl-κC}iridium(III) (abbreviation: [Ir(dmppm-dmp)$_2$(acac)]), and (acetylacetonato)bis(4,6-diphenylpyrimidinato)iridium (III) (abbreviation: [Ir(dppm)$_2$(acac)]); organometallic iridium complexes having a pyrazine skeleton, such as (acetylacetonato)bis(3,5-dimethyl-2-phenylpyrazinato) iridium(III) (abbreviation: [Ir(mppr-Me)$_2$(acac)]) and (acetylacetonato)bis(5-isopropyl-3-methyl-2-phenylpyrazinato)iridium(III) (abbreviation: [Ir(mppr-iPr)$_2$(acac)]); organometallic iridium complexes having a pyridine skeleton, such as tris(2-phenylpyridinato-N,C$^{2'}$)iridium(III) (abbreviation: [Ir(ppy)$_3$]), bis(2-phenylpyridinato-N,C$^{2'}$)iridium (III) acetylacetonate (abbreviation: [Ir(ppy)$_2$(acac)]), bis (benzo[h]quinolinato)iridium(III) acetylacetonate (abbreviation: [Ir(bzq)$_2$(acac)]), tris(benzo[h] quinolinato) iridium(III) (abbreviation: [Ir(bzq)$_3$]), tris(2-phenylquinolinato-N,C$^{2'}$)iridium(III) (abbreviation: [Ir(pq)$_3$]), and bis(2-phenylquinolinato-N,C$^{2'}$)iridium(III) acetylacetonate (abbreviation: [Ir(pq)$_2$(acac)]); organometallic complexes such as bis(2,4-diphenyl-1,3-oxazolato-N,C$^{2'}$)iridium(III) acetylacetonate (abbreviation: [Ir(dpo)$_2$(acac)]), bis{2-[4'-(perfluorophenyl)phenyl]pyridinato-N,C$^{2'}$}iridium(III) acetylacetonate (abbreviation: [Ir(p-PF-ph)$_2$(acac)]), and bis (2-phenylbenzothiazolato-N,C$^{2'}$)iridium(III) acetylacetonate (abbreviation: [Ir(bt)$_2$(acac)]); and rare earth metal complexes such as tris(acetylacetonato) (monophenanthroline)terbium(III) (abbreviation: [Tb(acac)$_3$(Phen)]).

Among the above, organometallic iridium complexes having a pyridine skeleton (particularly, a phenylpyridine skeleton) or a pyrimidine skeleton are compounds effective for meeting the chromaticity of green in one embodiment of the present invention.

As a phosphorescent material that exhibits yellow or red and whose emission spectrum has a peak wavelength at greater than or equal to 570 nm and less than or equal to 750 nm, the following substances can be given.

Examples include organometallic complexes having a pyrimidine skeleton, such as (diisobutyrylmethanato)bis[4,6-bis(3-methylphenyl)pyrimidinato]iridium(III) (abbreviation: [Ir(5mdppm)$_2$(dibm)]), bis[4,6-bis(3-methylphenyl) pyrimidinato] (dipivaloylmethanato)iridium(III) (abbreviation: [Ir(5mdppm)$_2$(dpm)]), and (dipivaloylmethanato)bis[4,6-di(naphthalen-1-yl)pyrimidinato]iridium(III) (abbreviation: [Ir(d1npm)$_2$(dpm)]); organometallic complexes having a pyrazine skeleton, such as (acetylacetonato) bis(2,3,5-triphenylpyrazinato)iridium(III) (abbreviation: [Ir(tppr)$_2$(acac)]), bis(2,3,5-triphenylpyrazinato) (dipivaloylmethanato)iridium(III) (abbreviation: [Ir(tppr)$_2$ (dpm)]), bis{4,6-dimethyl-2-[3(3,5-dimethylphenyl)-5-phenyl-2-pyrazinyl-ΛN]phenyl-κC}(2,6-dimethyl-3,5-heptanedionato-κ$^2$O,O')iridium(III) (abbreviation: [Ir(dmdppr-P)$_2$(dibm)]), bis{4,6-dimethyl-2-[5-(4-cyano-2,6-dimethylphenyl)-3-(3,5-dimethylphenyl)-2-pyrazinyl-κN] phenyl-κC}(2,2,6,6-tetramethyl-3,5-heptanedionato-κ$^2$O, O')iridium(III) (abbreviation: [Ir(dmdppr-dmCP)$_2$(dpm)]), (acetylacetonato)bis[2-methyl-3-phenylquinoxalinato-N, C$^{2'}$]iridium(III) (abbreviation: [Ir(mpq)$_2$(acac)]), (acetylacetonato)bis(2,3-diphenylquinoxalinato-N,C$^{2'}$)iridium(III) (abbreviation: [Ir(dpq)$_2$(acac)]), and (acetylacetonato)bis[2,3-bis(4-fluorophenyl)quinoxalinato]iridium(III) (abbreviation: [Ir(Fdpq)$_2$(acac)]); organometallic complexes having a pyridine skeleton, such as tris(1-phenylisoquinolinato-N, C$^{2'}$)iridium(III) (abbreviation: [Ir(piq)$_3$]) and bis(1-phenylisoquinolinato-N,C$^{2'}$)iridium(III) acetylacetonate (abbreviation: [Ir(piq)$_2$(acac)]); platinum complexes such as 2,3,7,8,12,13,17,18-octaethyl-21H,23H-porphyrinplatinum(II) (abbreviation: [PtOEP]); and rare earth metal complexes such as tris(1,3-diphenyl-1,3-propanedionato) (monophenanthroline)europium(III) (abbreviation: [Eu(DBM)$_3$ (Phen)]) and tris[1-(2-thenoyl)-3,3,3-trifluoroacetonato] (monophenanthroline)europium(III) (abbreviation: [Eu (TTA)$_3$(Phen)]).

Among the above, organometallic iridium complexes having a pyrazine skeleton are compounds effective for meeting the chromaticity of red in one embodiment of the present invention. In particular, organometallic iridium complexes having a cyano group, such as [Ir(dmdppr-dmCP)$_2$(dpm)], are preferable because of their high stability.

Note that as the blue-light-emitting substance, a substance whose photoluminescence peak wavelength is greater than or equal to 430 nm and less than or equal to 470 nm, preferably greater than or equal to 430 nm and less than or equal to 460 nm is used. As the green-light-emitting substance, a substance whose photoluminescence peak wavelength is greater than or equal to 500 nm and less than or equal to 540 nm, preferably greater than or equal to 500 nm and less than or equal to 530 nm is used. As the red-light-emitting substance, a substance whose photoluminescence peak wavelength is greater than or equal to 610 nm and less than or equal to 680 nm, preferably greater than or equal to 620 nm and less than or equal to 680 nm is used. Note that the photoluminescence may be measured with either a solution or a thin film.

With the parallel use of such compounds and the microcavity effect, the above chromaticity can be met more easily. Here, a transflective electrode (a metal thin film portion) that is needed for obtaining the microcavity effect preferably has a thickness greater than or equal to 20 nm and less than or equal to 40 nm. Further preferably, the thickness is greater than 25 nm and less than or equal to 40 nm. However, a thickness greater than 40 nm possibly reduces the efficiency.

As the organic compounds (the host material and the assist material) used in the light-emitting layer 723, one or more kinds of substances having a larger energy gap than the light-emitting substance (the guest material) are used. Note that the hole-transport materials listed above and the electron-transport materials given below can be used as the host material and the assist material, respectively.

In the case where the light-emitting substance is a fluorescent material, it is preferable to use, as the host material, an organic compound that has a high energy level in a singlet excited state and has a low energy level in a triplet excited state. For example, an anthracene derivative or a tetracene derivative is preferably used. Specific examples include 9-phenyl-3-[4-(10-phenyl-9-anthryl)phenyl]-9H-carbazole (abbreviation: PCzPA), 3-[4-(1-naphthyl)-phenyl]-9-phenyl-9H-carbazole (abbreviation: PCPN), 9-[4-(10-phenyl-9-anthracenyl)phenyl]-9H-carbazole (abbreviation: CzPA), 7-[4-(10-phenyl-9-anthryl)phenyl]-7H-dibenzo[c,g]carbazole (abbreviation: cgDBCzPA), 6-[3-(9,10-diphenyl-2-anthryl)phenyl]-benzo[b]naphtho[1,2-d]furan (abbreviation: 2mBnfPPA), 9-phenyl-10-{4-(9-phenyl-9H-fluoren-9-yl)biphenyl-4'-yl}anthracene (abbreviation: FLPPA), 5,12-diphenyltetracene, and 5,12-bis(biphenyl-2-yl)tetracene.

In the case where the light-emitting substance is a phosphorescent material, an organic compound having triplet excitation energy (energy difference between a ground state and a triplet excited state) higher than that of the light-emitting substance can be selected as the host material. In this case, it is possible to use a zinc- or aluminum-based metal complex, an oxadiazole derivative, a triazole derivative, a benzimidazole derivative, a quinoxaline derivative, a dibenzoquinoxaline derivative, a dibenzothiophene derivative, a dibenzofuran derivative, a pyrimidine derivative, a triazine derivative, a pyridine derivative, a bipyridine derivative, a phenanthroline derivative, an aromatic amine, a carbazole derivative, or the like.

Specific examples include metal complexes such as tris(8-quinolinolato)aluminum(III) (abbreviation: Alq), tris(4-methyl-8-quinolinolato)aluminum(III) (abbreviation: Almq$_3$), bis(10-hydroxybenzo[h]quinolinato)beryllium(II) (abbreviation: BeBq$_2$), bis(2-methyl-8-quinolinolato)(4-phenylphenolato)aluminum(III) (abbreviation: BAlq), bis(8-quinolinolato)zinc(II) (abbreviation: Znq), bis[2-(2-benzoxazolyl)phenolato]zinc(II) (abbreviation: ZnPBO), and bis[2-(2-benzothiazolyl)phenolato]zinc(II) (abbreviation: ZnBTZ); heterocyclic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-4-phenyl-5-(4-tert-butylphenyl)-1,2,4-triazole (abbreviation: TAZ), 2,2',2''-(1,3,5-benzenetriyl)-tris(1-phenyl-1H-benzimidazole) (abbreviation: TPBI), bathophenanthroline (abbreviation: BPhen), bathocuproine (abbreviation: BCP), 2,9-bis(naphthalen-2-yl)-4,7-diphenyl-1,10-phenanthroline (abbreviation: NBphen), and 9-[4-(5-phenyl-1,3,4-oxadiazol-2-yl)phenyl]-9H-carbazole (abbreviation: CO11); and aromatic amine compounds such as NPB, TPD, and BSPB.

In addition, condensed polycyclic aromatic compounds such as anthracene derivatives, phenanthrene derivatives, pyrene derivatives, chrysene derivatives, and dibenzo[g,p]chrysene derivatives can be used. Specifically, it is possible to use 9,10-diphenylanthracene (abbreviation: DPAnth), N,N-diphenyl-9-[4-(10-phenyl-9-anthryl)phenyl]-9H-carbazol-3-amine (abbreviation: CzA1PA), 4-(10-phenyl-9-anthryl)triphenylamine (abbreviation: DPhPA), YGAPA, PCAPA, N,9-diphenyl-N-{4-[4-(10-phenyl-9-anthryl)phenyl]phenyl}-9H-carbazol-3-amine (abbreviation: PCAPBA), 9,10-diphenyl-2-[N-phenyl-N-(9-phenyl-9H-carbazol-3-yl)amino]anthracene (abbreviation: 2PCAPA), 6,12-dimethoxy-5,11-diphenylchrysene, N,N,N',N',N'',N'',N''',N'''-octaphenyldibenzo[g,p]chrysene-2,7,10,15-tetraamine (abbreviation: DBC1), 9-[4-(10-phenyl-9-anthracenyl)phenyl]-9H-carbazole (abbreviation: CzPA), 3,6-diphenyl-9-[4-(10-phenyl-9-anthryl)phenyl]-9H-carbazole (abbreviation: DPCzPA), 9,10-bis(3,5-diphenylphenyl)anthracene (abbreviation: DPPA), 9,10-di(2-naphthyl)anthracene (abbreviation: DNA), 2-tert-butyl-9,10-di(2-naphthyl)anthracene (abbreviation: t-BuDNA), 9,9'-bianthryl (abbreviation: BANT), 9,9'-(stilbene-3,3'-diyl)diphenanthrene (abbreviation: DPNS), 9,9'-(stilbene-4,4'-diyl)diphenanthrene (abbreviation: DPNS2), 1,3,5-tri(1-pyrenyl)benzene (abbreviation: TPB3), or the like.

When a plurality of organic compounds are used in the light-emitting layer 723, compounds that form an exciplex are preferably mixed with a light-emitting substance. In this case, various organic compounds can be used in appropriate combination; to form an exciplex efficiently, it is particularly preferable to combine a compound that easily accepts holes (a hole-transport material) and a compound that easily accepts electrons (an electron-transport material). As the hole-transport material and the electron-transport material, specifically, any of the materials described in this embodiment can be used.

The TADF material is a material that enables upconversion of a triplet excited state into a singlet excited state (reverse intersystem crossing) using a little thermal energy and efficiently exhibits light emission (fluorescence) from the singlet excited state. Thermally activated delayed fluorescence is efficiently obtained under the condition where the difference in energy between the triplet excited level and the singlet excited level is greater than or equal to 0 eV and less than or equal to 0.2 eV, preferably greater than or equal to 0 eV and less than or equal to 0.1 eV. Note that "delayed fluorescence" exhibited by the TADF material refers to light emission having the same spectrum as normal fluorescence and an extremely long lifetime. The lifetime is $1 \times 10^{-6}$ seconds or longer, preferably $1 \times 10^{-3}$ seconds or longer.

Examples of the TADF material include fullerene, a derivative thereof, an acridine derivative such as proflavine, and eosin. Other examples include a metal-containing porphyrin such as a porphyrin containing magnesium (Mg), zinc (Zn), cadmium (Cd), tin (Sn), platinum (Pt), indium (In), or palladium (Pd). Examples of the metal-containing porphyrin include a protoporphyrin-tin fluoride complex ($SnF_2$(Proto IX)), a mesoporphyrin-tin fluoride complex ($SnF_2$(Meso IX)), a hematoporphyrin-tin fluoride complex ($SnF_2$(Hemato IX)), a coproporphyrin tetramethyl ester-tin fluoride complex ($SnF_2$(Copro III-4Me)), an octaethylporphyrin-tin fluoride complex ($SnF_2$(OEP)), an etioporphyrin-tin fluoride complex ($SnF_2$(Etio I)), and an octaethylporphyrin-platinum chloride complex ($PtCl_2$OEP).

Alternatively, it is possible to use a heterocyclic compound having a π-electron rich heteroaromatic ring and a π-electron deficient heteroaromatic ring, such as 2-(biphenyl-4-yl)-4,6-bis(12-phenylindolo[2,3-a]carbazol-11-yl)-1,3,5-triazine (PIC-TRZ), 2-{4-[3-(N-phenyl-9H-carbazol-3-yl)-9H-carbazol-9-yl]phenyl}-4,6-diphenyl-1,3,5-triazine (PCCzPTzn), 2-[4-(10H-phenoxazin-10-yl)phenyl]-4,6-diphenyl-1,3,5-triazine (PXZ-TRZ), 3-[4-(5-phenyl-5,10-dihydrophenazin-10-yl)phenyl]-4,5-diphenyl-1,2,4-triazole (PPZ-3TPT), 3-(9,9-dimethyl-9H-acridin-10-yl)-9H-xanthen-9-one (ACRXTN), bis[4-(9,9-dimethyl-9,10-dihydroacridine)phenyl]sulfone (DMAC-DPS), or 10-phenyl-10H,10'H-spiro[acridin-9,9'-anthracen]-10'-one (ACRSA). Note that a substance in which a π-electron rich heteroaromatic ring is directly bonded to a π-electron deficient heteroaromatic ring is particularly preferable because both the donor property of the π-electron rich heteroaromatic ring and the acceptor property of the π-electron deficient heteroaromatic ring are improved and the energy difference between the singlet excited state and the triplet excited state becomes small.

Note that the TADF material can also be used in combination with another organic compound.

«Electron-Transport Layer 724»

The electron-transport layer 724 transports the electrons, which are injected from the conductor 788 by the electron-injection layer 725, to the light-emitting layer 723. Note that the electron-transport layer 724 contains an electron-transport material. The electron-transport material used for the electron-transport layer 724 is preferably a substance with an electron mobility higher than or equal to $1\times10^{-6}$ cm$^2$/Vs. Note that other substances can also be used as long as they have a property of transporting more electrons than holes.

Examples of the electron-transport material include metal complexes having a quinoline ligand, a benzoquinoline ligand, an oxazole ligand, and a thiazole ligand; an oxadiazole derivative; a triazole derivative; a phenanthroline derivative; a pyridine derivative; and a bipyridine derivative. In addition, a π-electron deficient heteroaromatic compound such as a nitrogen-containing heteroaromatic compound can also be used.

Specifically, it is possible to use metal complexes such as Alq$_3$, tris(4-methyl-8-quinolinolato)aluminum (abbreviation: Almq$_3$), bis(10-hydroxybenzo[h]quinolinato)beryllium (abbreviation: BeBq$_2$), BAlq, Zn(BOX)$_2$, and bis[2-(2-hydroxyphenyl)benzothiazolato]zinc (abbreviation: Zn(BTZ)$_2$); heteroaromatic compounds such as 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4'-tert-butylphenyl)-4-phenyl-5-(4"-biphenyl)-1,2,4-triazole (abbreviation: TAZ), 3-(4-tert-butylphenyl)-4-(4-ethylphenyl)-5-(4-biphenylyl)-1,2,4-triazole (abbreviation: p-EtTAZ), bathophenanthroline (abbreviation: Bphen), bathocuproine (abbreviation: BCP), and 4,4'-bis(5-methylbenzoxazol-2-yl)stilbene (abbreviation: BzOs); and quinoxaline derivatives and dibenzoquinoxaline derivatives such as 2-[3-(dibenzothiophen-4-yl)phenyl]dibenzo[f,h]quinoxaline (abbreviation: 2mDBTPDBq-II), 2-[3'-(dibenzothiophen-4-yl)biphenyl-3-yl]dibenzo[f,h]quinoxaline (abbreviation: 2mDBTBPDBq-II), 2-[4-(3,6-diphenyl-9H-carbazol-9-yl)phenyl]dibenzo[f,h]quinoxaline (abbreviation: 2CzPDBq-III), 7-[3-(dibenzothiophen-4-yl)phenyl]dibenzo[f,h]quinoxaline (abbreviation: 7mDBTPDBq-II), and 6-[3-(dibenzothiophen-4-yl)phenyl]dibenzo[f,h]quinoxaline (abbreviation: 6mDBTPDBq-II).

Furthermore, a high molecular compound such as poly (2,5-pyridinediyl) (abbreviation: PPy), poly[(9,9-dihexylfluorene-2,7-diyl)-co-(pyridine-3,5-diyl)] (abbreviation: PF-Py), or poly[(9,9-dioctylfluorene-2,7-diyl)-co-(2,2'-bipyridine-6,6'-diyl)] (abbreviation: PF-BPy) can be used.

The electron-transport layer 724 is not limited to a single layer and may be a stack of two or more layers each containing any of the above substances.

«Electron-Injection Layer 725»

The electron-injection layer 725 contains a substance having a high electron-injection property. For the electron-injection layer 725, an alkali metal, an alkaline earth metal, or a compound thereof, such as lithium fluoride (LiF), cesium fluoride (CsF), calcium fluoride (CaF$_2$), or lithium oxide (LiO$_x$), can be used. A rare earth metal compound like erbium fluoride (ErF$_3$) can also be used. An electride may also be used for the electron-injection layer 725. An example of the electride is a substance in which electrons are added at high concentration to calcium oxide-aluminum oxide. Any of the above-described substances used for the electron-transport layer 724 can also be used.

A composite material in which an organic compound and an electron donor (a donor) are mixed may also be used for the electron-injection layer 725. Such a composite material is excellent in an electron-injection property and an electron-transport property because electrons are generated in the organic compound by the electron donor. The organic compound here is preferably a material excellent in transporting the generated electrons; specifically, for example, the electron-transport material used for the electron-transport layer 724 (e.g., a metal complex or a heteroaromatic compound) can be used. As the electron donor, a substance showing a property of donating electrons to an organic compound is used. Specifically, an alkali metal, an alkaline earth metal, and a rare earth metal are preferable, and lithium, cesium, magnesium, calcium, erbium, ytterbium, and the like are given. In addition, an alkali metal oxide and an alkaline earth metal oxide are preferable, and lithium oxide, calcium oxide, barium oxide, and the like are given. Alternatively, a Lewis base such as magnesium oxide can be used. Further alternatively, an organic compound such as tetrathiafulvalene (abbreviation: TTF) can be used.

«Charge Generation Layer 792»

The charge generation layer 792 has a function of injecting electrons into the EL layer 786 that is closer to the conductor 772 of the two EL layers 786 in contact with the charge generation layer 792 and injecting holes to the other EL layer 786 that is closer to the conductor 788, when a voltage is applied between the conductor 772 and the conductor 788. For example, in the light-emitting element 782 having the structure illustrated in FIG. 21C, the charge generation layer 792 has a function of injecting electrons into the EL layer 786a and injecting holes into the EL layer 786b. Note that the charge generation layer 792 may have either a structure in which an electron acceptor (an acceptor) is added to a hole-transport material or a structure in which an electron donor (a donor) is added to an electron-transport material. Alternatively, both of these structures may be stacked. Forming the charge generation layer 792 by using any of the above materials can inhibit the increase in driving voltage of the semiconductor device 10 including the stack of the EL layers.

When the charge generation layer 792 has a structure in which an electron acceptor is added to a hole-transport material, the electron acceptor can be 7,7,8,8-tetracyano-2,3,5,6-tetrafluoroquinodimethane (abbreviation: $F_4$-TCNQ), chloranil, or the like. Other examples include oxides of metals that belong to Group 4 to Group 8 of the periodic table. Specific examples include vanadium oxide, niobium oxide, tantalum oxide, chromium oxide, molybdenum oxide, tungsten oxide, manganese oxide, and rhenium oxide.

When the charge generation layer 792 has a structure in which an electron donor is added to an electron-transport material, an alkali metal, an alkaline earth metal, a rare earth metal, or a metal that belongs to Group 2 or Group 13 of the periodic table, or an oxide or carbonate thereof can be used as the electron donor. Specifically, lithium (Li), cesium (Cs), magnesium (Mg), calcium (Ca), ytterbium (Yb), indium (In), lithium oxide, cesium carbonate, or the like is preferably used. An organic compound such as tetrathianaphthacene may be used as the electron donor.

For fabrication of the light-emitting element 782, a vacuum process such as an evaporation method or a solution process such as a spin coating method or an inkjet method can be used. In the case of using an evaporation method, a physical vapor deposition method (a PVD method) such as a sputtering method, an ion plating method, an ion beam evaporation method, a molecular beam evaporation method, or a vacuum evaporation method, a chemical vapor deposition method (a CVD method), or the like can be used. Specifically, the functional layers (the hole-injection layer, the hole-transport layer, the light-emitting layer, the electron-transport layer, and the electron-injection layer) included in the EL layer and the charge generation layer of the light-emitting element can be formed by an evaporation method (e.g., a vacuum evaporation method), a coating method (e.g., a dip coating method, a die coating method, a bar coating method, a spin coating method, or a spray coating method), a printing method (e.g., an inkjet method, screen printing (stencil), offset printing (planography), flexography (relief printing), gravure printing, or micro-contact printing), or the like.

Note that materials for the functional layers (the hole-injection layer, the hole-transport layer, the light-emitting layer, the electron-transport layer, and the electron-injection layer) included in the EL layer and the charge generation layer of the light-emitting element described in this embodiment are not limited to the above materials, and other materials can be used in combination as long as the functions of the layers are fulfilled. For example, a high molecular compound (e.g., an oligomer, a dendrimer, and a polymer), a middle molecular compound (a compound between a low molecular compound and a high molecular compound, with a molecular weight of 400 to 4000), or an inorganic compound (e.g., a quantum dot material) can be used. As the quantum dot material, a colloidal quantum dot material, an alloyed quantum dot material, a core-shell quantum dot material, a core quantum dot material, or the like can be used.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments described in this specification as appropriate.

Embodiment 2

In this embodiment, transistors that can be used in the semiconductor device of one embodiment of the present invention will be described.

<Transistor Structure Example 1>

Figure 22A:
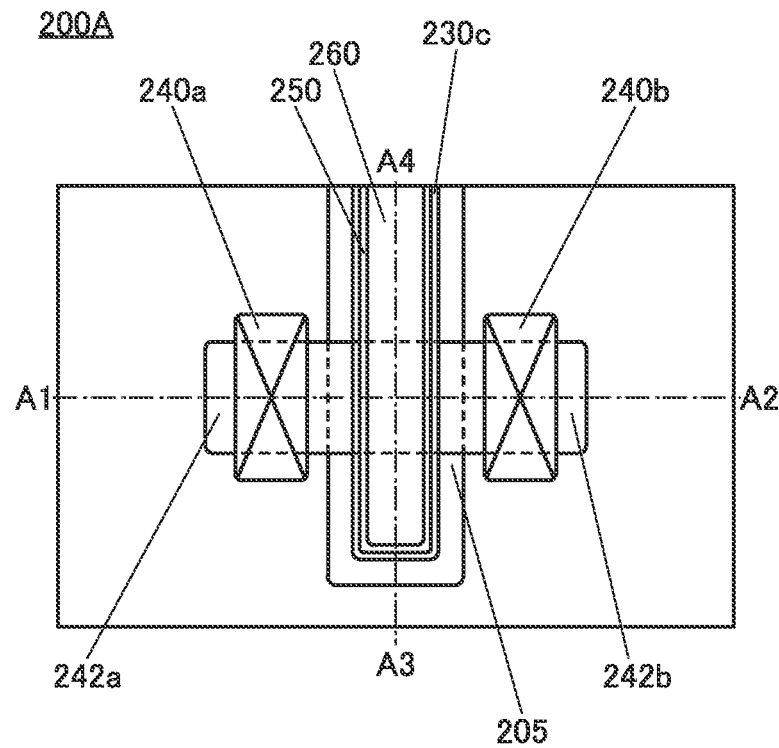
FIG. 22A is a top view illustrating an example of a transistor.
Figure 22C:
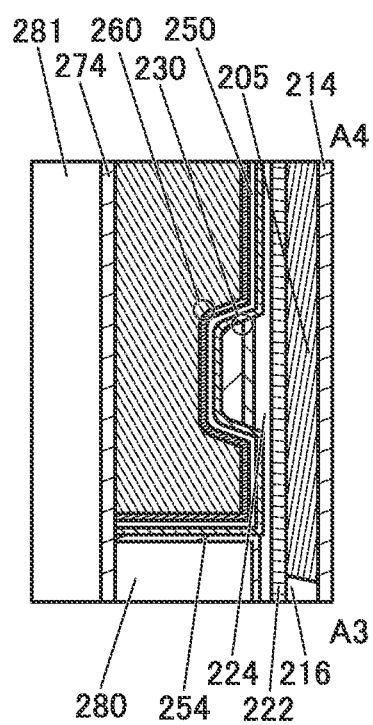
FIG. 22C is a cross-sectional view illustrating an example of a transistor.
Figure 22B:
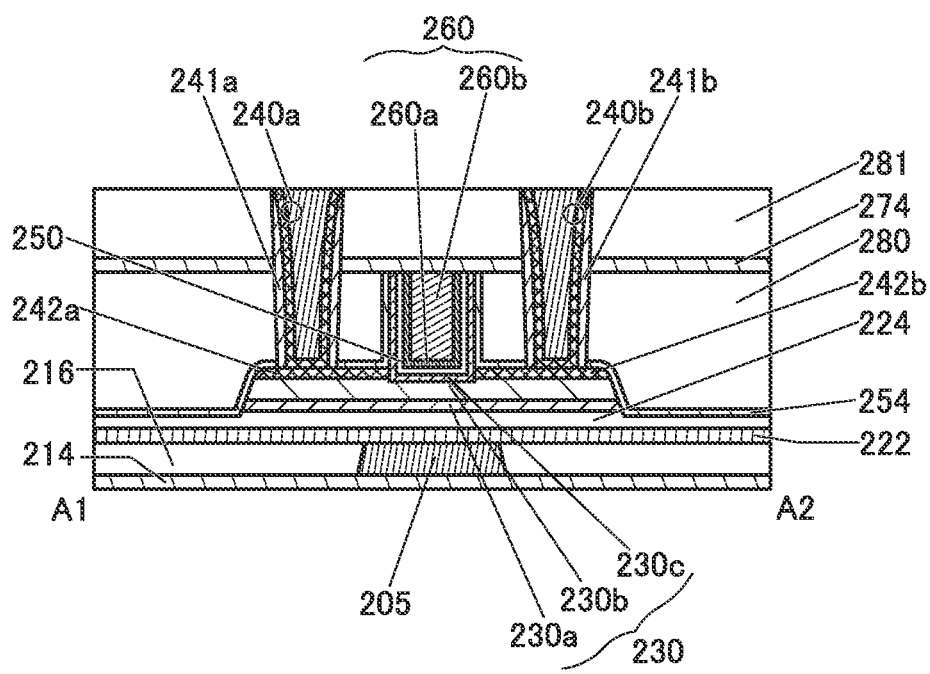
FIG. 22B is a cross-sectional view illustrating an example of a transistor.

FIG. 22A, FIG. 22B, and FIG. 22C are a top view and cross-sectional views of a transistor 200A that can be used in the semiconductor device of one embodiment of the present invention, and the periphery of the transistor 200A. The transistor 200A can be used as the transistors included in the pixel array 33, the gate driver circuit 21, the source driver circuit 22, and the circuit 40.

FIG. 22A is a top view of the transistor 200A. FIG. 22B and FIG. 22C are cross-sectional views of the transistor 200A. Here, FIG. 22B is a cross-sectional view of a portion indicated by the dashed-dotted line A1-A2 in FIG. 22A, and is a cross-sectional view in the channel length direction of the transistor 200A. FIG. 22C is a cross-sectional view of a portion indicated by the dashed-dotted line A3-A4 in FIG. 22A, and is a cross-sectional view in the channel width direction of the transistor 200A. Note that for clarity of the drawing, some components are not illustrated in the top view in FIG. 22A.

As illustrated in FIG. 22, the transistor 200A includes a metal oxide 230a positioned over a substrate (not illustrated); a metal oxide 230b positioned over the metal oxide 230a; a conductor 242a and a conductor 242b that are apart from each other over the metal oxide 230b; the insulator 280 that is positioned over the conductor 242a and the conductor 242b and has an opening between the conductor 242a and the conductor 242b; a conductor 260 positioned in the opening; an insulator 250 positioned between the conductor 260 and the metal oxide 230b, the conductor 242a, the conductor 242b, and the insulator 280; and a metal oxide 230c between the insulator 250 and the metal oxide 230b, the conductor 242a, the conductor 242b, and the insulator 280. Here, as illustrated in FIG. 22B and FIG. 22C, the top surface of the conductor 260 is substantially aligned with the top surfaces of the insulator 250, the insulator 254, the metal oxide 230c, and the insulator 280. Hereinafter, the metal oxide 230a, the metal oxide 230b, and the metal oxide 230c may be collectively referred to as a metal oxide 230. The conductor 242a and the conductor 242b may be collectively referred to as a conductor 242.

In the transistor 200A illustrated in FIG. 22, side surfaces of the conductor 242a and the conductor 242b on the conductor 260 side are substantially perpendicular. Note that the transistor 200A illustrated in FIG. 22 is not limited thereto, and the angle formed between the side surface and the bottom surface of the conductor 242a and the conductor 242b may range from 10° to 80°, preferably from 30° to 60°. The facing side surfaces of the conductor 242a and the conductor 242b may each have a plurality of surfaces.

As illustrated in FIG. 22, the insulator 254 is preferably positioned between the insulator 280 and the insulator 224, the metal oxide 230a, the metal oxide 230b, the conductor 242a, the conductor 242b, and the metal oxide 230c. Here, as illustrated in FIG. 22B and FIG. 22C, the insulator 254 is preferably in contact with a side surface of the metal oxide 230c, a top surface and a side surface of the conductor 242a, a top surface and a side surface of the conductor 242b, side surfaces of the metal oxide 230a and the metal oxide 230b, and a top surface of the insulator 224.

In the transistor 200A, three layers of the metal oxide 230a, the metal oxide 230b, and the metal oxide 230c are stacked in and around a region where the channel is formed (hereinafter also referred to as a channel formation region); however, the present invention is not limited thereto. For example, a two-layer structure of the metal oxide 230b and the metal oxide 230c or a stacked-layer structure of four or more layers may be employed. Although the conductor 260 has a stacked-layer structure of two layers in the transistor 200A, the present invention is not limited thereto. For example, the conductor 260 may have a single-layer structure or a stacked-layer structure of three or more layers. Furthermore, each of the metal oxide 230a, the metal oxide 230b, and the metal oxide 230c may have a stacked-layer structure of two or more layers.

For example, when the metal oxide 230c has a stacked-layer structure including a first metal oxide and a second metal oxide over the first metal oxide, the first metal oxide preferably has a composition similar to that of the metal oxide 230b and the second metal oxide preferably has a composition similar to that of the metal oxide 230a.

Here, the conductor 260 functions as a gate electrode of the transistor, and the conductor 242a and the conductor 242b function as a source electrode and a drain electrode. As described above, the conductor 260 is formed to be embedded in the opening of the insulator 280 and the region between the conductor 242a and the conductor 242b. Here, the positions of the conductor 260, the conductor 242a, and the conductor 242b with respect to the opening of the insulator 280 are selected in a self-aligned manner. That is, the gate electrode can be positioned between the source electrode and the drain electrode in a self-aligned manner in the transistor 200A. Thus, the conductor 260 can be formed without an alignment margin, resulting in a reduction in the footprint of the transistor 200A. Consequently, the semiconductor device can achieve high definition and have a narrow frame.

In addition, as illustrated in FIG. 22, the conductor 260 preferably includes a conductor 260a provided on the inner side of the insulator 250 and a conductor 260b embedded on the inner side of the conductor 260a.

The transistor 200A preferably also includes the insulator 214 positioned over the substrate (not illustrated), the insulator 216 positioned over the insulator 214, a conductor 205 positioned to be embedded in the insulator 216, the insulator 222 positioned over the insulator 216 and the conductor 205, and the insulator 224 positioned over the insulator 222. The metal oxide 230a is preferably positioned over the insulator 224.

The insulator 274 and the insulator 281 functioning as interlayer films are preferably provided over the transistor 200A. Here, the insulator 274 is preferably provided in contact with the top surfaces of the conductor 260, the insulator 250, the insulator 254, the metal oxide 230c, and the insulator 280.

The insulator 222, the insulator 254, and the insulator 274 preferably have a function of inhibiting diffusion of at least one of hydrogen (e.g., hydrogen atoms and hydrogen molecules). For example, the insulator 222, the insulator 254, and the insulator 274 preferably have a lower hydrogen permeability than the insulator 224, the insulator 250, and the insulator 280. Moreover, the insulator 222 and the insulator 254 preferably have a function of inhibiting diffusion of at least one of oxygen (e.g., oxygen atoms and oxygen molecules). For example, the insulator 222 and the insulator 254 preferably have a lower oxygen permeability than the insulator 224, the insulator 250, and the insulator 280.

Here, the insulator 224, the metal oxide 230, and the insulator 250 are separated from the insulator 280 and the insulator 281 by the insulator 254 and the insulator 274. This can inhibit entry of impurities such as hydrogen contained in the insulator 280 and the insulator 281 and excess oxygen into the insulator 224, the metal oxide 230, and the insulator 250.

A conductor 240 (a conductor 240a and a conductor 240b) that is electrically connected to the transistor 200A and functions as a plug is preferably provided. Note that an insulator 241 (an insulator 241a and an insulator 241b) is provided in contact with a side surface of the conductor 240 functioning as a plug. In other words, the insulator 241 is provided in contact with the inner wall of an opening in the insulator 254, the insulator 280, the insulator 274, and the insulator 281. Alternatively, a first conductor of the conductor 240 may be provided in contact with a side surface of the insulator 241 and a second conductor of the conductor 240 may be provided on the inner side of the first conductor. Here, the top surface of the conductor 240 and the top surface of the insulator 281 can be substantially level with each other. Although the first conductor of the conductor 240 and the second conductor of the conductor 240 are stacked in the transistor 200A, the present invention is not limited thereto. For example, the conductor 240 may have a single-layer structure or a stacked-layer structure of three or more layers. In the case where a component has a stacked-layer structure, layers may be distinguished by ordinal numbers corresponding to the formation order.

In the transistor 200A, a metal oxide functioning as an oxide semiconductor (hereinafter also referred to as an oxide semiconductor) is preferably used for the metal oxide 230 including the channel formation region (the metal oxide 230a, the metal oxide 230b, and the metal oxide 230c). For example, as the metal oxide to be the channel formation region of the metal oxide 230, it is preferable to use a metal oxide having a band gap of 2 eV or more, preferably 2.5 eV or more, as described above.

As illustrated in FIG. 22B, the metal oxide 230b may have a smaller thickness in a region that is not overlapped by the conductor 242 than in a region overlapped by the conductor 242. The thin region is formed when part of the top surface of the metal oxide 230b is removed at the time of forming the conductor 242a and the conductor 242b. When a conductive film to be the conductor 242 is formed, a low-resistance region may be formed on the top surface of the metal oxide 230b in the vicinity of the interface with the conductive film. Removal of the low-resistance region positioned between the conductor 242a and the conductor 242b on the top surface of the metal oxide 230b in the above manner can prevent formation of the channel in the region.

According to one embodiment of the present invention, a semiconductor device that includes small-size transistors and has high definition can be provided. A semiconductor device that includes transistors with a high on-state current and achieves high luminance can be provided. A semiconductor device that includes fast transistors and operates at high speed can be provided. A semiconductor device that includes transistors having stable electrical characteristics and is highly reliable can be provided. A semiconductor device that includes transistors with a low off-state current and achieves low power consumption can be provided.

The structure of the transistor 200A that can be used in the semiconductor device of one embodiment of the present invention will be described in detail.

The conductor 205 is placed so as to include a region overlapped by the metal oxide 230 and the conductor 260. Furthermore, the conductor 205 is preferably embedded in the insulator 216. Here, the top surface of the conductor 205 preferably has favorable planarity. For example, the average surface roughness (Ra) of the top surface of the conductor 205 is less than or equal to 1 nm, preferably less than or equal to 0.5 nm, further preferably less than or equal to 0.3 nm. This achieves favorable planarity of the insulator 224 formed over the conductor 205 and increases the crystallinity of the metal oxide 230b and the metal oxide 230c.

The conductor 260 sometimes functions as a first gate (also referred to as top gate) electrode. The conductor 205 sometimes functions as a second gate (also referred to as bottom gate) electrode. In that case, by changing a potential applied to the conductor 205 independently of a potential applied to the conductor 260, $V_{th}$ of the transistor 200A can be controlled. In particular, by applying a negative potential to the conductor 205, $V_{th}$ of the transistor 200A can be higher than 0 V, and its off-state current can be reduced. Thus, a drain current at the time when a potential applied to the conductor 260 is 0 V can be lower in the case where a negative potential is applied to the conductor 205 than in the case where the negative potential is not applied to the conductor 205.

The conductor 205 is preferably larger than the channel formation region of the metal oxide 230. In particular, as illustrated in FIG. 22C, the conductor 205 preferably extends to a region beyond an end portion of the metal oxide 230 that intersects with the channel width direction. That is, the conductor 205 and the conductor 260 preferably overlap each other with the insulator therebetween, beyond the side surface of the metal oxide 230 in the channel width direction.

With the above structure, the channel formation region of the metal oxide 230 can be electrically surrounded by electric fields of the conductor 260 having a function of the first gate electrode and electric fields of the conductor 205 having a function of the second gate electrode.

Furthermore, as illustrated in FIG. 22C, the conductor 205 extends to function as a wiring as well. However, without limitation to this structure, a structure in which a conductor functioning as a wiring is provided below the conductor 205 may be employed.

A conductive material containing tungsten, copper, or aluminum as its main component is preferably used for the conductor 205. Note that the conductor 205 is illustrated as a single layer but may have a stacked-layer structure, for example, a stack of any of the above conductive materials and titanium or titanium nitride.

In addition, a conductor having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (a conductor through which the above impurities are less likely to pass) may be used under the conductor 205. Alternatively, it is preferable to use a conductor having a function of inhibiting diffusion of oxygen (e.g., at least one of an oxygen atom, an oxygen molecule, and the like) (a conductor through which the oxygen is less likely to pass). Note that in this specification, a function of inhibiting diffusion of impurities or oxygen means a function of inhibiting diffusion of any one or all of the above impurities and oxygen.

When a conductor having a function of inhibiting oxygen diffusion is used under the conductor 205, a reduction in conductivity of the conductor 205 due to oxidation can be inhibited. As the conductor having a function of inhibiting oxygen diffusion, tantalum, tantalum nitride, ruthenium, or ruthenium oxide is preferably used, for example. A first conductor of the conductor 205 can therefore be a single layer or a stack of the above conductive materials.

The insulator 214 preferably functions as a barrier insulating film that inhibits entry of impurities such as water or hydrogen into the transistor 200A from the substrate side. Accordingly, for the insulator 214, it is preferable to use an insulating material having a function of inhibiting diffusion of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom (an insulating material through which the above impurities are less likely to pass). Alternatively, it is preferable to use an insulating material having a function of inhibiting diffusion of at least one of oxygen (e.g., oxygen atoms and oxygen molecules) (an insulating material through which the oxygen is less likely to pass).

For example, aluminum oxide or silicon nitride is preferably used for the insulator 214. Accordingly, it is possible to inhibit diffusion of impurities such as water or hydrogen into the transistor 200A side from the substrate side through the insulator 214. It is also possible to inhibit diffusion of oxygen contained in the insulator 224 and the like toward the substrate through the insulator 214.

The permittivity of each of the insulator 216, the insulator 280, and the insulator 281 functioning as an interlayer film is preferably lower than that of the insulator 214. When a material with a low permittivity is used for an interlayer film, parasitic capacitance generated between wirings can be reduced. For example, for the insulator 216, the insulator 280, and the insulator 281, silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or the like is used as appropriate.

The insulator 222 and the insulator 224 have a function of a gate insulator.

Here, it is preferred that the insulator 224 in contact with the metal oxide 230 release oxygen by heating. In this specification, oxygen that is released by heating is referred to as excess oxygen in some cases. For example, silicon oxide or silicon oxynitride can be used as appropriate for the insulator 224. When such an insulator containing oxygen is provided in contact with the metal oxide 230, oxygen vacancies in the metal oxide 230 can be reduced, leading to an improvement in reliability of the transistor 200A.

Specifically, an oxide material that releases part of oxygen by heating is preferably used for the insulator 224. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. Note that the temperature of the film surface in the TDS analysis is preferably in the range of 100° C. to 700° C. or 100° C. to 400° C.

As illustrated in FIG. 22C, the insulator 224 may have a smaller thickness in a region overlapped by neither the insulator 254 nor the metal oxide 230b than in the other regions. In the insulator 224, the region overlapped by neither the insulator 254 nor the metal oxide 230b preferably has a thickness with which released oxygen can be adequately diffused.

Like the insulator 214 and the like, the insulator 222 preferably functions as a barrier insulating film that inhibits entry of impurities such as water or hydrogen into the transistor 200A from the substrate side. For example, the insulator 222 preferably has a lower hydrogen permeability than the insulator 224. When the insulator 224, the metal oxide 230, the insulator 250, and the like are surrounded by the insulator 222, the insulator 254, and the insulator 274, entry of impurities such as water or hydrogen into the transistor 200A from the outside can be inhibited.

Furthermore, the insulator 222 preferably has a function of inhibiting diffusion of at least one of oxygen (e.g., oxygen atoms and oxygen molecules) (it is preferable that oxygen is less likely to pass through the insulator 222). For example, the insulator 222 preferably has a lower oxygen permeability than the insulator 224. The insulator 222 preferably has a function of inhibiting diffusion of oxygen and impurities, in which case oxygen contained in the metal oxide 230 is less likely to diffuse toward the substrate. Moreover, the conductor 205 can be inhibited from reacting with oxygen contained in the insulator 224 and the metal oxide 230.

As the insulator 222, an insulator containing an oxide of one or both of aluminum and hafnium, which is an insulating material, is preferably used. As the insulator containing an oxide of one or both of aluminum and hafnium, aluminum oxide, hafnium oxide, an oxide containing aluminum and hafnium (hafnium aluminate), or the like is preferably used. The insulator 222 formed using such a material functions as a layer inhibiting oxygen release from the metal oxide 230 and entry of impurities such as hydrogen into the metal oxide 230 from the periphery of the transistor 200A.

Alternatively, aluminum oxide, bismuth oxide, germanium oxide, niobium oxide, silicon oxide, titanium oxide, tungsten oxide, yttrium oxide, or zirconium oxide may be added to these insulators, for example. Alternatively, these insulators may be subjected to nitriding treatment. Silicon oxide, silicon oxynitride, or silicon nitride may be stacked over the above insulator.

As another example, the insulator 222 may be a single layer or a stack using an insulator containing a high-k material, such as aluminum oxide, hafnium oxide, tantalum oxide, zirconium oxide, lead zirconate titanate (PZT), strontium titanate ($SrTiO_3$), or $(Ba,Sr)TiO_3$ (BST). As miniaturization and high integration of transistors progress, a problem such as leakage current may arise because of a thinner gate insulator. When a high-k material is used for the insulator functioning as a gate insulator, a gate potential during operation of the transistor can be reduced while the physical thickness of the gate insulator is maintained.

Note that the insulator 222 and the insulator 224 may each have a stacked-layer structure of two or more layers. In such cases, without limitation to a stacked-layer structure formed of the same material, a stacked-layer structure formed of different materials may be employed. For example, an insulator similar to the insulator 224 may be provided under the insulator 222.

The metal oxide 230 includes the metal oxide 230a, the metal oxide 230b over the metal oxide 230a, and the metal oxide 230c over the metal oxide 230b. The metal oxide 230a under the metal oxide 230b can inhibit diffusion of impurities into the metal oxide 230b from the components formed below the metal oxide 230a. The metal oxide 230c over the metal oxide 230b can inhibit diffusion of impurities into the metal oxide 230b from the components formed above the metal oxide 230c.

Note that the metal oxide 230 preferably has a stacked-layer structure of a plurality of oxide layers that differ in the atomic ratio of metal atoms. Specifically, the atomic ratio of an element M to the constituent elements in the metal oxide used as the metal oxide 230a is preferably higher than that in the metal oxide used as the metal oxide 230b. The atomic ratio of the element M to In in the metal oxide used as the metal oxide 230a is preferably higher than that in the metal oxide used as the metal oxide 230b. The atomic ratio of In to the element M in the metal oxide used as the metal oxide 230b is preferably higher than that in the metal oxide used as the metal oxide 230a. The metal oxide 230c can be formed using a metal oxide that can be used as the metal oxide 230a or the metal oxide 230b.

The metal oxide 230a, the metal oxide 230b, and the metal oxide 230c preferably have crystallinity, and in particular, a CAAC-OS is preferably used. An oxide having crystallinity, such as a CAAC-OS, has a dense structure with small amounts of impurities and defects (e.g., oxygen vacancies) and high crystallinity. This reduces oxygen extraction from the metal oxide 230b by the source electrode or the drain electrode. This can reduce oxygen extraction from the metal oxide 230b even when heat treatment is performed; thus, the transistor 200A is stable with respect to high temperatures in a manufacturing process (what is called thermal budget).

The energy of the conduction band minimum of each of the metal oxide 230a and the metal oxide 230c is preferably higher than that of the metal oxide 230b. In other words, the electron affinity of each of the metal oxide 230a and the metal oxide 230c is preferably smaller than that of the metal oxide 230b. In that case, the metal oxide 230c is preferably formed using a metal oxide that can be used as the metal oxide 230a. Specifically, the atomic ratio of the element M to the constituent elements in the metal oxide used as the metal oxide 230c is preferably higher than that in the metal oxide used as the metal oxide 230b. The atomic ratio of the element M to In in the metal oxide used as the metal oxide 230c is preferably higher than that in the metal oxide used as the metal oxide 230b. The atomic ratio of In to the element M in the metal oxide used as the metal oxide 230b is preferably higher than that in the metal oxide used as the metal oxide 230c.

Here, the energy level of the conduction band minimum is gradually varied at a junction portion of each of the metal oxide 230a, the metal oxide 230b, and the metal oxide 230c. In other words, the energy levels of the conduction band minimum at the junction portion of each of the metal oxide 230a, the metal oxide 230b, and the metal oxide 230c continuously vary or are continuously connected. This can be achieved by decrease in the density of defect states in a mixed layer formed at the interface between the metal oxide 230a and the metal oxide 230b and the interface between the metal oxide 230b and the metal oxide 230c.

Specifically, when the metal oxide 230a and the metal oxide 230b or the metal oxide 230b and the metal oxide 230c contain the same element (as a main component) in addition to oxygen, a mixed layer with a low density of defect states can be formed. For example, in the case where the metal oxide 230b is an In—Ga—Zn oxide, it is preferable to use an In—Ga—Zn oxide, a Ga—Zn oxide, gallium oxide, or the like as each of the metal oxide 230a and the metal oxide 230c. The metal oxide 230c may have a stacked-layer structure. For example, the metal oxide 230c can have a stacked-layer structure of an In—Ga—Zn oxide and a Ga—Zn oxide over the In—Ga—Zn oxide, or a stacked-layer structure of an In—Ga—Zn oxide and gallium oxide over the In—Ga—Zn oxide. In other words, the metal oxide 230c may have a stacked-layer structure of an In—Ga—Zn oxide and an oxide that does not contain In.

Specifically, as the metal oxide 230a, a metal oxide with In:Ga:Zn=1:3:4 [atomic ratio] or 1:1:0.5 [atomic ratio] is used. As the metal oxide 230b, a metal oxide with In:Ga:Zn=4:2:3 [atomic ratio] or 3:1:2 [atomic ratio] is used. As the metal oxide 230c, a metal oxide with In:Ga:Zn=1:3:4 [atomic ratio], In:Ga:Zn=4:2:3 [atomic ratio], Ga:Zn=2:1 [atomic ratio], or Ga:Zn=2:5 [atomic ratio] is used. Specific examples of the metal oxide 230c having a stacked-layer structure include a stacked-layer structure of In:Ga:Zn=4:2:3 [atomic ratio] and Ga:Zn=2:1 [atomic ratio], a stacked-layer structure of In:Ga:Zn=4:2:3 [atomic ratio] and Ga:Zn=2:5 [atomic ratio], and a stacked-layer structure of In:Ga:Zn=4:2:3 [atomic ratio] and gallium oxide.

At this time, the metal oxide 230b serves as a main carrier path. When the metal oxide 230a and the metal oxide 230c have the above composition, the density of defect states at the interface between the metal oxide 230a and the metal oxide 230b and the interface between the metal oxide 230b and the metal oxide 230c can be made low. This reduces the influence of interface scattering on carrier conduction, and the transistor 200A can have a high on-state current and high frequency characteristics. Note that in the case where the metal oxide 230c has a stacked-layer structure, not only the above effect of reducing the density of defect state at the interface between the metal oxide 230b and the metal oxide 230c, but also the effect of inhibiting diffusion of the constituent element of the metal oxide 230c toward the insulator 250 is expected. Specifically, the metal oxide 230c has a stacked-layer structure in which the upper layer is an oxide that does not contain In, whereby the amount of In that would diffuse toward the insulator 250 can be reduced. Since the insulator 250 functions as a gate insulator, the transistor would show poor characteristics when In diffuses into the insulator 250. Thus, when the metal oxide 230c has a stacked-layer structure, a highly reliable semiconductor device can be provided.

The metal oxide 230 is preferably formed using a metal oxide functioning as an oxide semiconductor. For example, the metal oxide to be the channel formation region of the metal oxide 230 has a band gap of preferably 2 eV or more, further preferably 2.5 eV or more. With the use of a metal oxide having such a wide band gap, the off-state current of the transistor can be reduced. With the use of such a transistor, a semiconductor device with low power consumption can be provided.

The conductor 242 (the conductor 242a and the conductor 242b) functioning as the source electrode and the drain electrode is provided over the metal oxide 230b. For the conductor 242, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that hold their conductivity even after absorbing oxygen.

When the conductor 242 is provided in contact with the metal oxide 230, the oxygen concentration of the metal oxide 230 in the vicinity of the conductor 242 sometimes decreases. In addition, a metal compound layer that contains the metal contained in the conductor 242 and the component of the metal oxide 230 is sometimes formed in the metal oxide 230 in the vicinity of the conductor 242. In such cases, the carrier density of the region of the metal oxide 230 in the vicinity of the conductor 242 increases, and the region becomes a low-resistance region.

Here, the region between the conductor 242a and the conductor 242b is formed to be overlapped by the opening of the insulator 280. In this manner, the conductor 260 can be formed in a self-aligned manner between the conductor 242a and the conductor 242b.

The insulator 250 functions as a gate insulator. The insulator 250 is preferably positioned in contact with the top surface of the metal oxide 230c. For the insulator 250, silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide can be used. In particular, silicon oxide and silicon oxynitride are preferable because they are thermally stable.

As in the insulator 224, the concentration of impurities such as water or hydrogen in the insulator 250 is preferably reduced. The thickness of the insulator 250 is preferably greater than or equal to 1 nm and less than or equal to 20 nm.

A metal oxide may be provided between the insulator 250 and the conductor 260. The metal oxide preferably inhibits oxygen diffusion from the insulator 250 into the conductor 260. Thus, oxidation of the conductor 260 due to oxygen in the insulator 250 can be inhibited.

The metal oxide has a function of part of the gate insulator in some cases. Therefore, when silicon oxide, silicon oxynitride, or the like is used for the insulator 250, a metal oxide that is a high-k material with a high dielectric constant is preferably used as the metal oxide. The gate insulator having a stacked-layer structure of the insulator 250 and the metal oxide can be thermally stable and have a high dielectric constant. Accordingly, a gate potential applied during operation of the transistor can be lowered while the physical thickness of the gate insulator is maintained. In addition, the equivalent oxide thickness (EOT) of the insulator functioning as the gate insulator can be reduced.

Specifically, a metal oxide containing one kind or two or more kinds selected from hafnium, aluminum, gallium, yttrium, zirconium, tungsten, titanium, tantalum, nickel, germanium, magnesium, and the like can be used. It is particularly preferable to use an insulator containing an oxide of one or both of aluminum and hafnium, such as aluminum oxide, hafnium oxide, or an oxide containing aluminum and hafnium (hafnium aluminate).

Although the conductor 260 has a two-layer structure in FIG. 22, the conductor 260 may have a single-layer structure or a stacked-layer structure of three or more layers.

The conductor 260a is preferably formed using the aforementioned conductor having a function of inhibiting diffusion of impurities such as hydrogen atoms, hydrogen molecules, water molecules, nitrogen atoms, nitrogen molecules, nitrogen oxide molecules (e.g., $N_2O$, NO, and $NO_2$), and copper atoms. Alternatively, the conductor 260a is preferably formed using a conductive material having a function of inhibiting diffusion of at least one of oxygen (e.g., oxygen atoms and oxygen molecules).

When the conductor 260a has a function of inhibiting diffusion of oxygen, it is possible to inhibit a reduction in conductivity of the conductor 260b due to oxidation caused by oxygen contained in the insulator 250. As a conductive material having a function of inhibiting diffusion of oxygen, for example, tantalum, tantalum nitride, ruthenium, or ruthenium oxide is preferably used.

Moreover, a conductive material containing tungsten, copper, or aluminum as its main component is preferably used for the conductor 260b. The conductor 260 also functions as a wiring and thus is preferably formed using a conductor having high conductivity. For example, a conductive material containing tungsten, copper, or aluminum as its main component can be used. The conductor 260b may have a stacked-layer structure; for example, a stacked-layer structure of titanium or titanium nitride and the above conductive material may be employed.

As illustrated in FIG. 22A and FIG. 22C, the side surface of the metal oxide 230 is covered with the conductor 260 in a region where the metal oxide 230b is not overlapped by the conductor 242, that is, the channel formation region of the metal oxide 230. Accordingly, electric fields of the conductor 260 functioning as the first gate electrode are likely to act on the side surface of the metal oxide 230. Thus, the on-state current of the transistor 200A can be increased and the frequency characteristics can be improved.

The insulator 254 as well as the insulator 214 and the like preferably functions as a barrier insulating film that inhibits entry of impurities such as water or hydrogen into the transistor 200A from the insulator 280 side. The insulator 254 preferably has a lower hydrogen permeability than the insulator 224, for example. Furthermore, as illustrated in FIG. 22B and FIG. 22C, the insulator 254 is preferably in contact with the side surface of the metal oxide 230c, the top surface and side surface of the conductor 242a, the top surface and side surface of the conductor 242b, the side surfaces of the metal oxide 230a and the metal oxide 230b, and the top surface of the insulator 224. Such a structure can inhibit entry of hydrogen of the insulator 280 into the metal oxide 230 through the top surfaces or side surfaces of the conductor 242a, the conductor 242b, the metal oxide 230a, the metal oxide 230b, and the insulator 224.

Furthermore, the insulator 254 preferably has a function of inhibiting diffusion of at least one of oxygen (e.g., oxygen atoms and oxygen molecules) (it is preferable that oxygen is less likely to pass through the insulator 254). For example, the insulator 254 preferably has a lower oxygen permeability than the insulator 280 or the insulator 224.

The insulator 254 is preferably deposited by a sputtering method. When the insulator 254 is deposited by a sputtering method in an oxygen-containing atmosphere, oxygen can be added to the vicinity of a region of the insulator 224 that is in contact with the insulator 254. Thus, oxygen can be supplied from the region to the metal oxide 230 through the insulator 224. Here, with the insulator 254 having a function of inhibiting upward oxygen diffusion, oxygen can be prevented from diffusing from the metal oxide 230 into the insulator 280. Moreover, with the insulator 222 having a function of inhibiting downward oxygen diffusion, oxygen can be prevented from diffusing from the metal oxide 230 to the substrate side. In the above manner, oxygen is supplied to the channel formation region of the metal oxide 230. Accordingly, oxygen vacancies in the metal oxide 230 can be reduced, so that the transistor can be prevented from having normally-on characteristics.

As the insulator 254, an insulator containing an oxide of one or both of aluminum and hafnium is deposited, for example. Note that as the insulator containing an oxide of one or both of aluminum and hafnium, aluminum oxide, hafnium oxide, an oxide containing aluminum and hafnium (hafnium aluminate), or the like is preferably used.

The insulator 224, the insulator 250, and the metal oxide 230 are covered with the insulator 254 having a barrier property against hydrogen, whereby the insulator 280 is isolated from the insulator 224, the metal oxide 230, and the insulator 250 by the insulator 254. This can inhibit entry of impurities such as hydrogen from the outside of the transistor 200A, resulting in excellent electrical characteristics and high reliability of the transistor 200A.

The insulator 280 is provided over the insulator 224, the metal oxide 230, and the conductor 242 with the insulator 254 therebetween. The insulator 280 preferably includes, for example, silicon oxide, silicon oxynitride, silicon nitride oxide, silicon oxide to which fluorine is added, silicon oxide to which carbon is added, silicon oxide to which carbon and nitrogen are added, or porous silicon oxide. In particular, silicon oxide and silicon oxynitride, which have thermal stability, are preferable. Materials such as silicon oxide, silicon oxynitride, and porous silicon oxide, in each of which a region containing oxygen released by heating can be easily formed, are particularly preferable.

The concentration of impurities such as water or hydrogen in the insulator 280 is preferably reduced. In addition, the top surface of the insulator 280 may be planarized.

Like the insulator 214 and the like, the insulator 274 preferably functions as a barrier insulating film that inhibits entry of impurities such as water or hydrogen into the insulator 280 from the above. As the insulator 274, for example, an insulator that can be used as the insulator 214, the insulator 254, and the like can be used.

The insulator 281 functioning as an interlayer film is preferably provided over the insulator 274. As in the insulator 224 and the like, the concentration of impurities such as water and hydrogen in the insulator 281 is preferably reduced.

The conductor 240a and the conductor 240b are positioned in openings formed in the insulator 281, the insulator 274, the insulator 280, and the insulator 254. The conductor 240a and the conductor 240b are provided to face each other with the conductor 260 therebetween. Note that the top surfaces of the conductor 240a and the conductor 240b may be level with the top surface of the insulator 281.

The insulator 241a is provided in contact with the inner wall of the opening in the insulator 281, the insulator 274, the insulator 280, and the insulator 254, and the first conductor of the conductor 240a is formed in contact with the side surface of the insulator 241a, The conductor 242a is positioned on at least part of the bottom portion of the opening, and the conductor 240a is in contact with the conductor 242a. Similarly, the insulator 241b is provided in contact with the inner wall of another opening in the insulator 281, the insulator 274, the insulator 280, and the insulator 254, and the first conductor of the conductor 240b is formed in contact with the side surface of the insulator 241b. The conductor 242b is positioned on at least part of the bottom portion of the opening, and the conductor 240b is in contact with the conductor 242b.

The conductor 240a and the conductor 240b are preferably formed using a conductive material containing tungsten, copper, or aluminum as its main component. The conductor 240a and the conductor 240b may have a stacked-layer structure.

When the conductor 240 has a stacked-layer structure, the aforementioned conductor having a function of inhibiting diffusion of impurities such as water or hydrogen is preferably used for the conductor in contact with the metal oxide 230a, the metal oxide 230b, the conductor 242, the insulator 254, the insulator 280, the insulator 274, and the insulator 281. For example, tantalum, tantalum nitride, titanium, titanium nitride, ruthenium, or ruthenium oxide is preferably used. The conductive material having a function of inhibiting diffusion of impurities such as water or hydrogen can be used as a single layer or stacked layers. The use of the conductive material can prevent oxygen added to the insulator 280 from being absorbed by the conductor 240a and the conductor 240b. Moreover, entry of impurities such as water or hydrogen into the metal oxide 230 through the conductor 240a and the conductor 240b from a layer above the insulator 281 can be inhibited.

The insulator 241a and the insulator 241b are formed using any of the insulators that can be used for the insulator 254, for example. Since the insulator 241a and the insulator 241b are provided in contact with the insulator 254, entry of impurities such as water or hydrogen into the metal oxide 230 through the conductor 240a and the conductor 240b from the insulator 280 or the like can be inhibited. Furthermore, oxygen contained in the insulator 280 can be prevented from being absorbed by the conductor 240a and the conductor 240b.

Although not illustrated, a conductor functioning as a wiring may be provided in contact with the top surface of the conductor 240a and the top surface of the conductor 240b. The conductor functioning as a wiring is preferably formed using a conductive material containing tungsten, copper, or aluminum as its main component. The conductor may have a stacked-layer structure and may be a stack of titanium or titanium nitride and any of the above conductive materials, for example. The conductor may be formed to be embedded in an opening provided in an insulator.

<Transistor Structure Example 2>

Figure 23A:
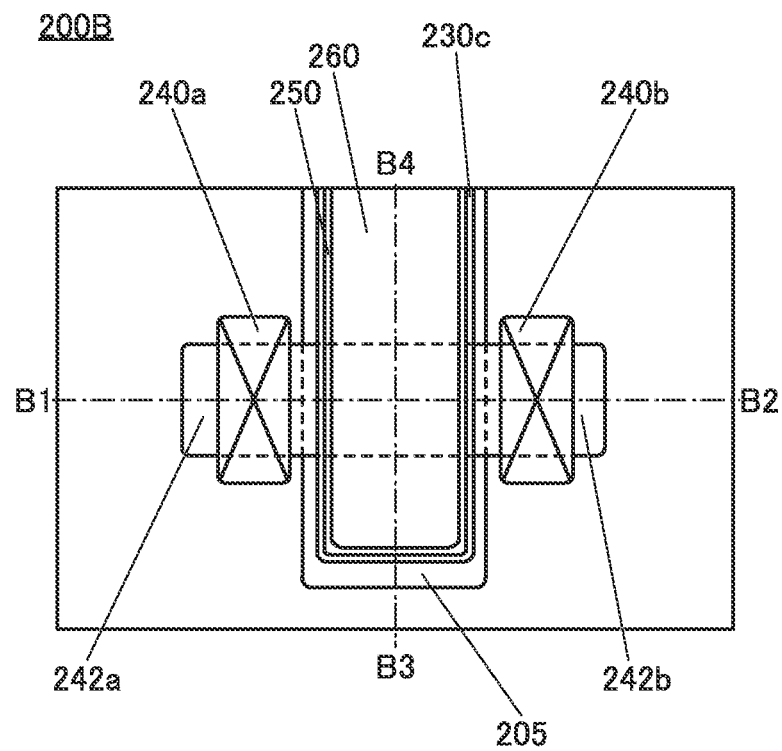
FIG. 23A is a top view illustrating an example of a transistor.
Figure 23C:
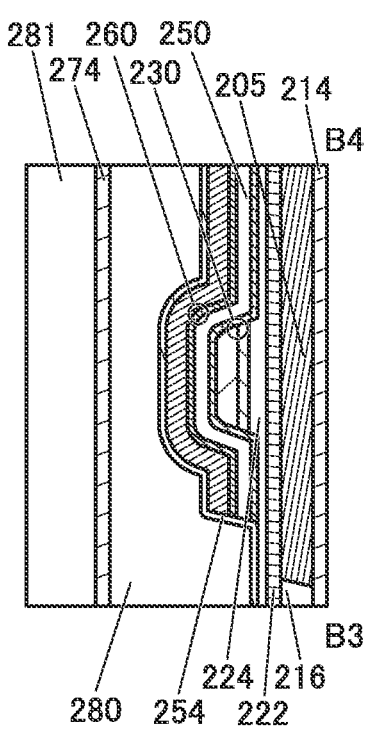
FIG. 23C is a cross-sectional view illustrating an example of a transistor.
Figure 23B:
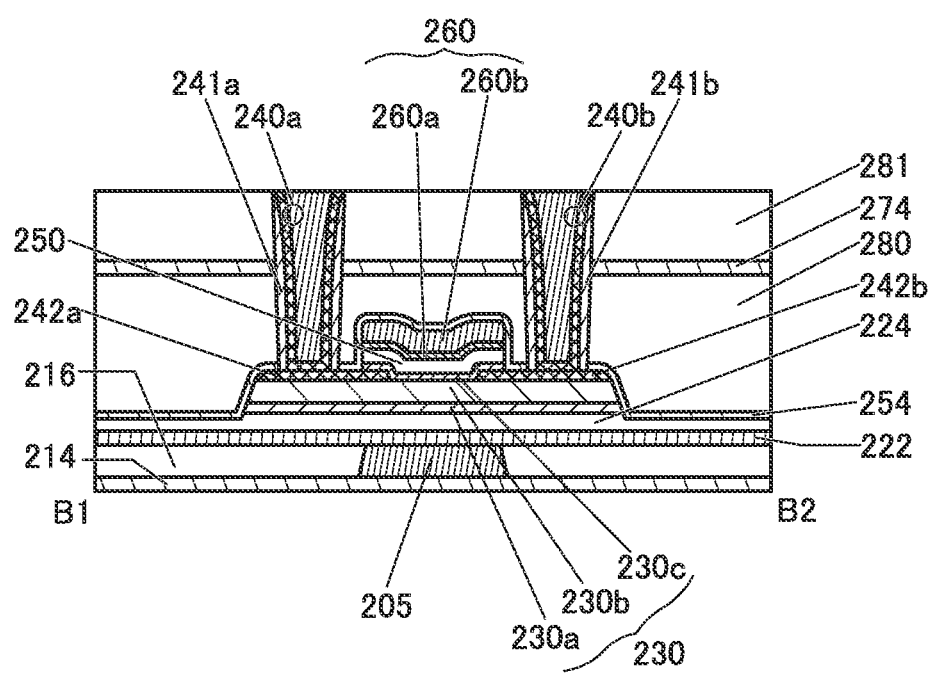
FIG. 23B is a cross-sectional view illustrating an example of a transistor.

FIG. 23A, FIG. 23B, and FIG. 23C are a top view and cross-sectional views of a transistor 200B that can be used in the semiconductor device of one embodiment of the present invention, and the periphery of the transistor 200B. The transistor 200B is a modification example of the transistor 200A.

FIG. 23A is a top view of the transistor 200B. FIG. 23B and FIG. 23C are cross-sectional views of the transistor 200B. Here, FIG. 23B is a cross-sectional view of a portion indicated by the dashed-dotted line B1-B2 in FIG. 23A, and is a cross-sectional view in the channel length direction of the transistor 200B. FIG. 23C is a cross-sectional view of a portion indicated by the dashed-dotted line B3-B4 in FIG. 23A, and is a cross-sectional view in the channel width direction of the transistor 200B. Note that for clarity of the drawing, some components are not illustrated in the top view in FIG. 23A.

In the transistor 200B, the conductor 242a and the conductor 242b each have a region overlapped by the metal oxide 230c, the insulator 250, and the conductor 260. Thus, the transistor 200B can have a high on-state current. In addition, the transistor 200B can be a transistor that is easy to control.

The conductor 260 functioning as a gate electrode includes the conductor 260a and the conductor 260b over the conductor 260a. The conductor 260a is preferably formed using a conductive material having a function of inhibiting diffusion of impurities such as a hydrogen atom, a hydrogen molecule, a water molecule, and a copper atom. Alternatively, it is preferable to use a conductive material having a function of inhibiting diffusion of oxygen (e.g., at least one of an oxygen atom, an oxygen molecule, and the like).

When the conductor 260a has a function of inhibiting oxygen diffusion, the range of choices for the material of the conductor 260b can be expanded. That is, the conductor 260a inhibits oxidation of the conductor 260b, thereby preventing the decrease in conductivity.

The insulator 254 is preferably provided to cover the top surface and the side surface of the conductor 260, the side surface of the insulator 250, and the side surface of the metal oxide 230c. Note that the insulator 254 is preferably formed using an insulating material having a function of inhibiting diffusion of oxygen and impurities such as water or hydrogen.

The insulator 254 can inhibit oxidation of the conductor 260. Moreover, the insulator 254 can inhibit diffusion of impurities such as water and hydrogen contained in the insulator 280 into the transistor 200B.

<Transistor Structure Example 3>

Figure 24A:
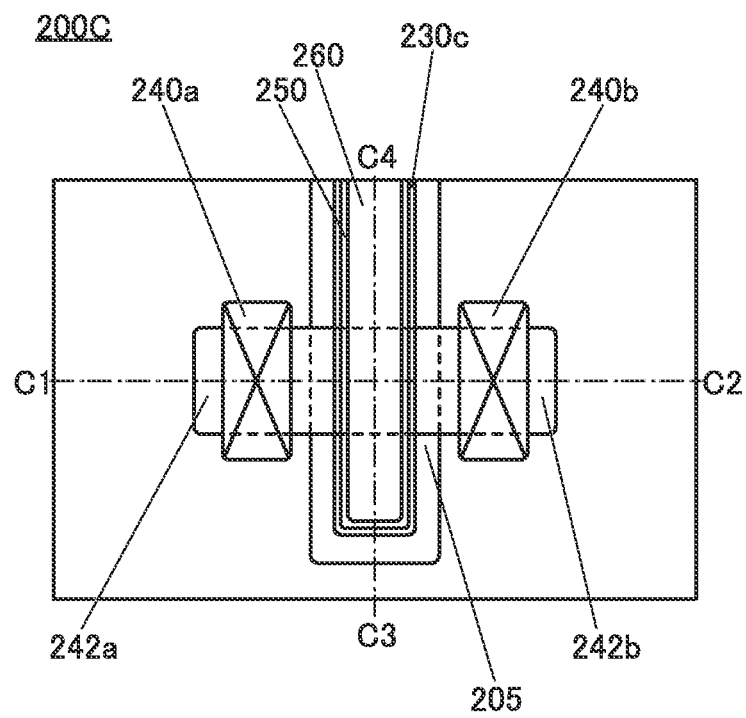
FIG. 24A is a top view illustrating an example of a transistor.
Figure 24C:
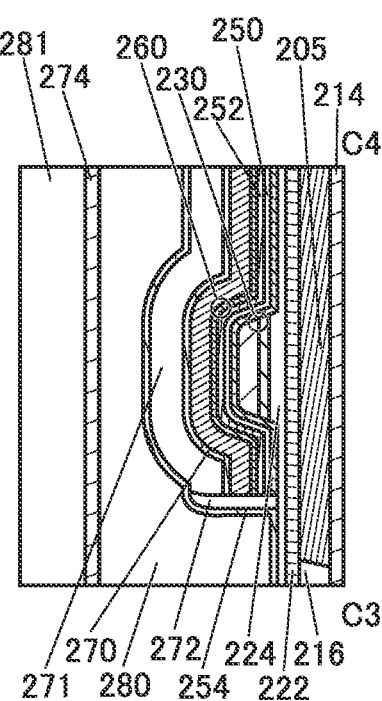
FIG. 24C is a cross-sectional view illustrating an example of a transistor.
Figure 24B:
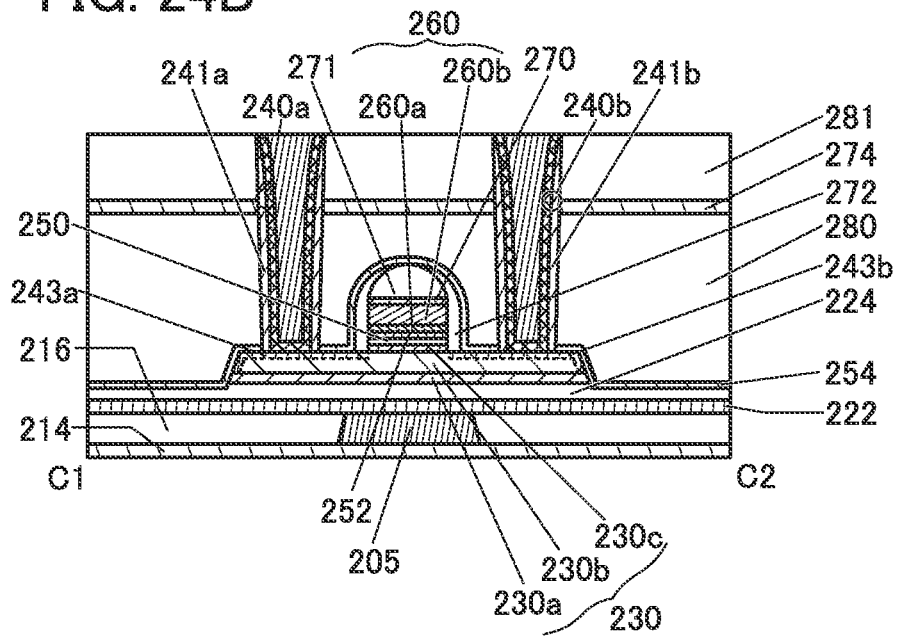
FIG. 24B is a cross-sectional view illustrating an example of a transistor.

FIG. 24A, FIG. 24B, and FIG. 24C are a top view and cross-sectional views of a transistor 200C that can be used in the semiconductor device of one embodiment of the present invention, and the periphery of the transistor 200C. The transistor 200C is a modification example of the transistor 200A.

FIG. 24A is a top view of the transistor 200C. FIG. 24B and FIG. 24C are cross-sectional views of the transistor 200C. Here, FIG. 24B is a cross-sectional view of a portion indicated by the dashed-dotted line C1-C2 in FIG. 24A, and is a cross-sectional view in the channel length direction of the transistor 200C. FIG. 24C is a cross-sectional view of a portion indicated by the dashed-dotted line C3-C4 in FIG. 24A, and is a cross-sectional view in the channel width direction of the transistor 200C. Note that for clarity of the drawing, some components are not illustrated in the top view in FIG. 24A.

The transistor 200C includes the insulator 250 over the metal oxide 230c, and a metal oxide 252 over the insulator 250. The conductor 260 is provided over the metal oxide 252, and an insulator 270 is provided over the conductor 260. An insulator 271 is provided over the insulator 270.

The metal oxide 252 preferably has a function of inhibiting diffusion of oxygen. When the metal oxide 252 that inhibits oxygen diffusion is provided between the insulator 250 and the conductor 260, diffusion of oxygen into the conductor 260 is inhibited. That is, the reduction in the amount of oxygen supplied to the metal oxide 230 can be inhibited. Moreover, oxidation of the conductor 260 due to oxygen can be suppressed.

Note that the metal oxide 252 may have a function of part of a gate electrode. For example, an oxide semiconductor that can be used for the metal oxide 230 can be used for the metal oxide 252. In this case, when the conductor 260 is deposited by a sputtering method, the metal oxide 252 can have a reduced electric resistance and become a conductor. Such a conductor can be referred to as an OC (Oxide Conductor) electrode.

The metal oxide 252 may have a function of part of a gate insulator. Thus, when silicon oxide, silicon oxynitride, or the like is used for the insulator 250, a metal oxide that is a high-k material with a high dielectric constant is preferably used for the metal oxide 252. Such a stacked-layer structure can be thermally stable and can have a high dielectric constant. Consequently, a gate potential that is applied when the transistor operates can be lowered while the physical thickness is maintained. In addition, the equivalent oxide thickness (EOT) of the insulating layer functioning as the gate insulator can be reduced.

Although the metal oxide 252 in the transistor 200C is shown as a single layer, a stacked-layer structure of two or more layers may be employed. For example, a metal oxide functioning as part of a gate electrode and a metal oxide functioning as part of a gate insulator may be stacked.

With the metal oxide 252 functioning as a gate electrode, the on-state current of the transistor 200C can be increased without a reduction in the influence of electric fields from the conductor 260. With the metal oxide 252 functioning as a gate insulator, the distance between the conductor 260 and the metal oxide 230 is kept by the physical thicknesses of the insulator 250 and the metal oxide 252, so that leakage current between the conductor 260 and the metal oxide 230 can be reduced. Consequently, with the stacked-layer structure of the insulator 250 and the metal oxide 252, it is easy to adjust the physical distance between the conductor 260 and the metal oxide 230 and the intensity of electric fields applied from the conductor 260 to the metal oxide 230.

Specifically, for the metal oxide 252, a material obtained by lowering the resistance of an oxide semiconductor that can be used for the metal oxide 230 can be used. Alternatively, a metal oxide containing one kind or two or more kinds selected from hafnium, aluminum, gallium, yttrium, zirconium, tungsten, titanium, tantalum, nickel, germanium, magnesium, and the like can be used.

It is particularly preferable to use an insulating layer containing an oxide of one or both of aluminum and hafnium, such as aluminum oxide, hafnium oxide, or an oxide containing aluminum and hafnium (hafnium aluminate). In particular, hafnium aluminate has higher heat resistance than a hafnium oxide film. Therefore, hafnium aluminate is preferable because it is unlikely to be crystallized by heat treatment in a later step. Note that the metal oxide 252 is not an essential component. Design is appropriately set in consideration of required transistor characteristics.

The insulator 270 is preferably formed using an insulating material having a function of inhibiting the passage of oxygen and impurities such as water or hydrogen. For example, aluminum oxide or hafnium oxide is preferably used. Thus, oxidation of the conductor 260 due to oxygen from above the insulator 270 can be inhibited. Moreover, entry of impurities such as water or hydrogen from above the insulator 270 into the metal oxide 230 through the conductor 260 and the insulator 250 can be inhibited.

The insulator 271 functions as a hard mask. By providing the insulator 271, the conductor 260 can be processed to have a side surface that is substantially vertical. Specifically, the angle formed by the side surface of the conductor 260 and the surface of the substrate can be greater than or equal to 75° and less than or equal to 100°, preferably greater than or equal to 80° and less than or equal to 95°.

The insulator 271 may be formed using an insulating material having a function of inhibiting the passage of oxygen and impurities such as water or hydrogen so that the insulator 271 also functions as a barrier layer. In that case, the insulator 270 is not necessarily provided.

The insulator 270, the conductor 260, the metal oxide 252, the insulator 250, and the metal oxide 230c are selectively removed using the insulator 271 as a hard mask, whereby their side surfaces can be substantially aligned with each other and the surface of the metal oxide 230b can be partly exposed.

The transistor 200C includes a region 243a and a region 243b on part of the exposed surface of the metal oxide 230b. One of the region 243a and the region 243b functions as a source region, and the other of the region 243a and the region 243b functions as a drain region.

The region 243a and the region 243b can be formed by introducing an impurity element such as phosphorus or boron to the exposed surface of the metal oxide 230b by an ion implantation method, an ion doping method, a plasma immersion ion implantation method, or plasma treatment, for example. Note that in this embodiment and the like, an "impurity element" refers to an element other than main constituent elements.

Alternatively, the region 243a and the region 243b can be formed in such manner that, after part of the surface of the metal oxide 230b is exposed, a metal film is formed and then heat treatment is performed so that the element contained in the metal film is diffused into the metal oxide 230b.

The electrical resistivity of the regions of the metal oxide 230b to which the impurity element is added decreases. For that reason, the region 243a and the region 243b are sometimes referred to as "impurity regions" or "low-resistance regions".

The region 243a and the region 243b can be formed in a self-aligned manner by using the insulator 271 and/or the conductor 260 as a mask. Accordingly, the conductor 260 does not overlap the region 243a and/or the region 243b, so that the parasitic capacitance can be reduced. Moreover, an offset region is not formed between the channel formation region and the source/drain region (the region 243a or the region 243b). The formation of the region 243a and the region 243b in a self-aligned manner achieves an increase in the on-state current, a reduction in the threshold voltage, and an improvement in the operating frequency, for example.

The transistor 200C includes an insulator 272 on the side surfaces of the insulator 271, the insulator 270, the conductor 260, the metal oxide 252, the insulator 250, and the metal oxide 230c. The insulator 272 is preferably an insulator having a low dielectric constant. The insulator 272 is preferably silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin, for example. In particular, silicon oxide, silicon oxynitride, silicon nitride oxide, and porous silicon oxide are preferable because an excess oxygen region can be easily formed in the insulator 272 in a later step. Silicon oxide and silicon oxynitride are preferable because of their thermal stability. The insulator 272 preferably has a function of diffusing oxygen.

Note that an offset region may be provided between the channel formation region and the source/drain region in order to further reduce the off-state current. The offset region is a region where the electrical resistivity is high and the impurity element is not added. The offset region can be formed by addition of the impurity element after the formation of the insulator 272. In this case, the insulator 272 functions as a mask like the insulator 271 or the like. Thus, the impurity element is not added to the region of the metal oxide 230b overlapped by the insulator 272, so that the electrical resistivity of the region can be kept high.

The transistor 200C also includes the insulator 254 over the insulator 272 and the metal oxide 230. The insulator 254 is preferably deposited by a sputtering method. The insulator formed by a sputtering method can be an insulator containing few impurities such as water or hydrogen.

Note that an oxide film obtained by a sputtering method may extract hydrogen from the component over which the oxide film is deposited. For that reason, the hydrogen concentration in the metal oxide 230 and the insulator 272 can be reduced when the insulator 254 absorbs hydrogen and water from the metal oxide 230 and the insulator 272.

<Materials for Transistor>

Materials that can be used for the transistor will be described.

«Substrate»

As the substrate where the transistors 200A, 200B, and 200C and the like are formed, an insulator substrate, a semiconductor substrate, or a conductor substrate is used, for example. Examples of the insulator substrate include a glass substrate, a quartz substrate, a sapphire substrate, a stabilized zirconia substrate (an yttria-stabilized zirconia substrate or the like), and a resin substrate. Examples of the semiconductor substrate include a semiconductor substrate of silicon, germanium, or the like and a compound semiconductor substrate of silicon carbide, silicon germanium, gallium arsenide, indium phosphide, zinc oxide, or gallium oxide. Another example is a semiconductor substrate in which an insulator region is included in the semiconductor substrate, e.g., an SOI (Silicon On Insulator) substrate. Examples of the conductor substrate include a graphite substrate, a metal substrate, an alloy substrate, and a conductive resin substrate. Other examples include a substrate including a metal nitride and a substrate including a metal oxide. Other examples include an insulator substrate provided with a conductor or a semiconductor, a semiconductor substrate provided with a conductor or an insulator, and a conductor substrate provided with a semiconductor or an insulator. Alternatively, these substrates provided with elements may be used. Examples of the element provided for the substrate include a capacitor, a resistor, a switching element, a light-emitting element, and a memory element.

«Insulator»

Examples of an insulator include an oxide, a nitride, an oxynitride, a nitride oxide, a metal oxide, a metal oxynitride, and a metal nitride oxide, each of which has an insulating property.

As miniaturization and high integration of transistors progress, for example, a problem such as leakage current may arise because of a thinner gate insulator. When a high-k material is used for the insulator functioning as a gate insulator, the voltage during operation of the transistor can be lowered while the physical thickness of the gate insulator is maintained. In contrast, when a material with a low dielectric constant is used for the insulator functioning as an interlayer film, parasitic capacitance generated between wirings can be reduced. Thus, a material is preferably selected depending on the function of the insulator.

Examples of the insulator having a high dielectric constant include gallium oxide, hafnium oxide, zirconium oxide, an oxide containing aluminum and hafnium, an oxynitride containing aluminum and hafnium, an oxide containing silicon and hafnium, an oxynitride containing silicon and hafnium, and a nitride containing silicon and hafnium.

Examples of the insulator having a low dielectric constant include silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, and a resin.

When a transistor using an oxide semiconductor is surrounded by insulators having a function of inhibiting transmission of oxygen and impurities such as hydrogen (e.g., the insulator 214, the insulator 222, the insulator 254, and the insulator 274), the electrical characteristics of the transistor can be stable. As the insulator having a function of inhibiting transmission of oxygen and impurities such as hydrogen, a single layer or stacked layers of an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum are used. Specifically, as the insulator having a function of inhibiting transmission of oxygen and impurities such as hydrogen, a metal oxide such as aluminum oxide, magnesium oxide, gallium oxide, germanium oxide, yttrium oxide, zirconium oxide, lanthanum oxide, neodymium oxide, hafnium oxide, or tantalum oxide or a metal nitride such as aluminum nitride, aluminum titanium nitride, titanium nitride, silicon nitride oxide, or silicon nitride can be used.

The insulator functioning as a gate insulator is preferably an insulator including a region containing oxygen released by heating. For example, when silicon oxide or silicon oxynitride that includes a region containing oxygen released by heating is provided in contact with the metal oxide 230, oxygen vacancies included in the metal oxide 230 can be filled.

«Conductor»

For a conductor, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, lanthanum, and the like; an alloy containing any of the above metal elements; an alloy containing a combination of the above metal elements; or the like. For example, it is preferable to use tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that hold their conductivity even after absorbing oxygen. A semiconductor having high electrical conductivity, typified by polycrystalline silicon containing an impurity element such as phosphorus, or silicide such as nickel silicide may be used.

Conductors formed using any of the above materials may be stacked. For example, a stacked-layer structure combining a material containing the above metal element and a conductive material containing oxygen may be employed. A stacked-layer structure combining a material containing the above metal element and a conductive material containing nitrogen may be employed. A stacked-layer structure combining a material containing the above metal element, a conductive material containing oxygen, and a conductive material containing nitrogen may be employed.

When a metal oxide is used for the channel formation region of the transistor, the conductor functioning as the gate electrode preferably employs a stacked-layer structure using a material containing the above metal element and a conductive material containing oxygen. In this case, the conductive material containing oxygen is preferably provided on the channel formation region side. When the conductive material containing oxygen is provided on the channel formation region side, oxygen released from the conductive material is easily supplied to the channel formation region.

For the conductor functioning as the gate electrode, it is particularly preferable to use a conductive material containing oxygen and a metal element contained in a metal oxide where the channel is formed. A conductive material containing the above metal element and nitrogen may be used. For example, a conductive material containing nitrogen, such as titanium nitride or tantalum nitride, may be used. Indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With the use of such a material, hydrogen contained in the metal oxide where the channel is formed can be captured in some cases. Alternatively, hydrogen entering from a surrounding insulator or the like can be captured in some cases.

«Metal Oxide»

A metal oxide preferably contains at least indium or zinc. In particular, indium and zinc are preferably contained. Furthermore, aluminum, gallium, yttrium, tin, or the like is preferably contained in addition to them. Moreover, one or more kinds selected from boron, titanium, iron, nickel, germanium, zirconium, molybdenum, lanthanum, cerium, neodymium, hafnium, tantalum, tungsten, magnesium, and the like may be contained.

Here, the case where the metal oxide is an In-M-Zn oxide containing indium, an element M, and zinc is considered. Note that the element M is aluminum, gallium, yttrium, tin, or the like. Other examples of elements that can be used as the element M include boron, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also collectively referred to as a metal oxide in some cases. A metal oxide containing nitrogen may be referred to as a metal oxynitride.

[Structure of Metal Oxide]

Oxide semiconductors (metal oxides) are classified into a single crystal oxide semiconductor and a non-single-crystal oxide semiconductor. Examples of a non-single-crystal oxide semiconductor include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

[Impurities]

Here, the influence of each impurity in the metal oxide is described.

When the metal oxide contains an alkali metal or an alkaline earth metal, defect states are formed and carriers are generated in some cases. Thus, a transistor using a metal oxide containing an alkali metal or an alkaline earth metal in a channel formation region tends to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS (the concentration obtained by secondary ion mass spectrometry (SIMS)) is lower than or equal to $1\times10^{18}$ atoms/cm$^3$, preferably lower than or equal to $2\times10^{16}$ atoms/cm$^3$.

Hydrogen contained in a metal oxide reacts with oxygen bonded to a metal atom to be water, and thus forms an oxygen vacancy in some cases. When hydrogen enters the oxygen vacancy, an electron which is a carrier is generated in some cases. Furthermore, bonding of part of hydrogen to oxygen bonded to a metal atom may cause generation of an electron serving as a carrier. Thus, a transistor using a metal oxide that contains hydrogen is likely to have normally-on characteristics.

Accordingly, hydrogen in the metal oxide is preferably reduced as much as possible. Specifically, the hydrogen concentration of the metal oxide obtained by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$. When a metal oxide in which impurities are sufficiently reduced is used in a channel formation region of a transistor, stable electrical characteristics can be given.

Note that as a metal oxide used as a semiconductor of a transistor, a thin film having high crystallinity is preferably used. With the thin film, the stability or reliability of the transistor can be improved. As the thin film, a thin film of a single crystal metal oxide or a thin film of a polycrystalline metal oxide can be used, for example. However, a high-temperature process or a laser heating process is required to form the thin film of a single crystal metal oxide or the thin film of a polycrystalline metal oxide over a substrate. Thus, manufacturing cost is increased, and throughput is decreased.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments described in this specification as appropriate.

Embodiment 3

In this embodiment, electronic devices each including the semiconductor device of one embodiment of the present invention will be described.

Figure 25A:
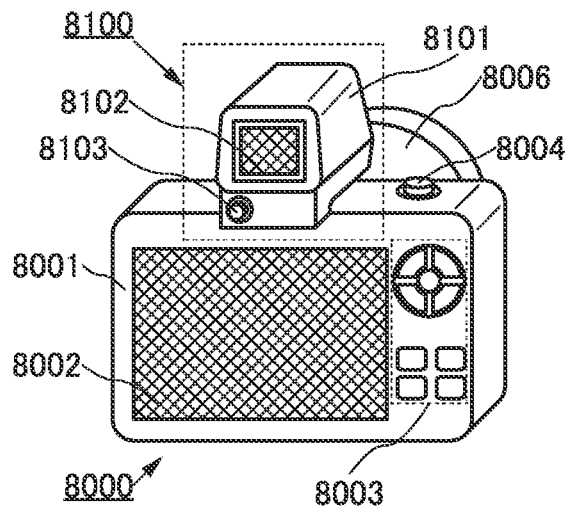
FIG. 25A, FIG. 25B, FIG. 25C, FIG. 25D, and FIG. 25E are diagrams illustrating examples of electronic devices.

FIG. 25A is a diagram showing the appearance of a camera 8000 to which a finder 8100 is attached. The camera 8000 is provided with an imaging device. The camera 8000 can be a digital camera, for example. Note that although the camera 8000 and the finder 8100 are separate and detachable electronic devices in FIG. 25A, a finder including a semiconductor device may be incorporated in a housing 8001 of the camera 8000.

The camera 8000 includes the housing 8001, a display portion 8002, operation buttons 8003, a shutter button 8004, and the like. A detachable lens 8006 is attached to the camera 8000.

Although the lens 8006 of the camera 8000 here is detachable from the housing 8001 for replacement, the lens 8006 may be integrated with the housing.

The camera 8000 can take images at the press of the shutter button 8004. The display portion 8002 has a function of a touch panel, and images can also be taken at the touch of the display portion 8002.

The housing 8001 of the camera 8000 includes a mount including an electrode, so that the finder 8100, a stroboscope, or the like can be connected to the housing.

The finder 8100 includes a housing 8101, a display portion 8102, a button 8103, and the like. The finder 8100 can be an electronic viewfinder.

The housing 8101 includes a mount for engagement with the mount of the camera 8000 so that the finder 8100 can be attached to the camera 8000. The mount includes an electrode, and an image or the like received from the camera 8000 through the electrode can be displayed on the display portion 8102.

The button 8103 has a function of a power button. The on/off state of the display portion 8102 can be switched with the button 8103.

The semiconductor device of one embodiment of the present invention can be used in the display portion 8002 of the camera 8000 and the display portion 8102 of the finder 8100. The semiconductor device of one embodiment of the present invention has extremely high definition; thus, even when the display portion 8002 or the display portion 8102 is close to the user, the user does not perceive pixels, and a more realistic image can be displayed on the display portion 8002 or the display portion 8102. In particular, an image displayed on the display portion 8102 provided in the finder 8100 is perceived when the user brings his/her eyes closer to the eyepiece of the finder 8100; hence, the distance between the user and the display portion 8102 becomes very short. Thus, the semiconductor device of one embodiment of the present invention is particularly preferably used in the display portion 8102. Note that in the case where the semiconductor device of one embodiment of the present invention is used in the display portion 8102, the resolution of images that can be displayed on the display portion 8102 can be 4K, 5K, or higher.

Note that the resolution of an image that can be taken by the imaging device provided in the camera 8000 is preferably the same as or higher than the resolution of an image that can be displayed on the display portion 8002 or the display portion 8102. For example, in the case where an image having a resolution of 4K can be displayed on the display portion 8102, the camera 8000 is preferably provided with an imaging device that can take an image of 4K or higher. As another example, in the case where an image having a resolution of 5K can be displayed on the display portion 8102, the camera 8000 is preferably provided with an imaging device that can take an image of 5K or higher.

Figure 25B:
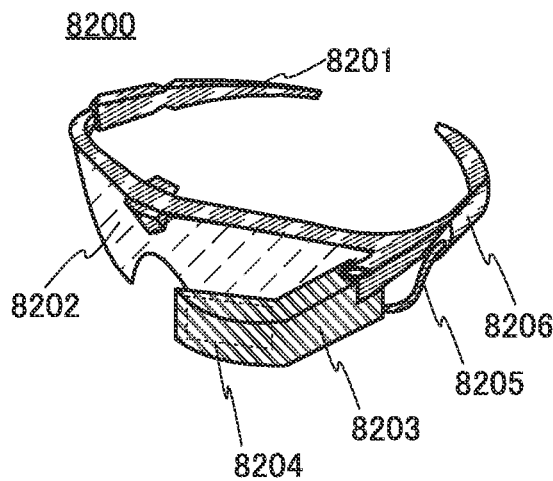

FIG. 25B is a diagram showing the appearance of a head-mounted display 8200.

The head-mounted display 8200 includes a mounting portion 8201, a lens 8202, a main body 8203, a display portion 8204, a cable 8205, and the like. A battery 8206 is incorporated in the mounting portion 8201.

The cable 8205 supplies electric power from the battery 8206 to the main body 8203. The main body 8203 includes a wireless receiver or the like and can display an image corresponding to the received image data or the like on the display portion 8204. The movement of the eyeball and the eyelid of the user is captured by a camera provided in the main body 8203, and the coordinates of the sight line of the user are calculated using the information to utilize the sight line of the user as an input means.

A plurality of electrodes may be provided in the mounting portion 8201 at positions in contact with the user. The main body 8203 may have a function of recognizing the user's sight line by sensing a current that flows through the electrodes in accordance with the movement of the user's eyeball. The main body 8203 may have a function of monitoring the user's pulse by sensing a current flowing through the electrodes. The mounting portion 8201 may include various sensors such as a temperature sensor, a pressure sensor, and an acceleration sensor and may have a function of displaying the user's biological information on the display portion 8204. The main body 8203 may sense the movement of the user's head or the like to change an image displayed on the display portion 8204 in synchronization with the movement.

The semiconductor device of one embodiment of the present invention can be used in the display portion 8204. Accordingly, the head-mounted display 8200 can have a narrower frame, a high-quality image can be displayed on the display portion 8204, and a more realistic image can be displayed.

Figure 25C:
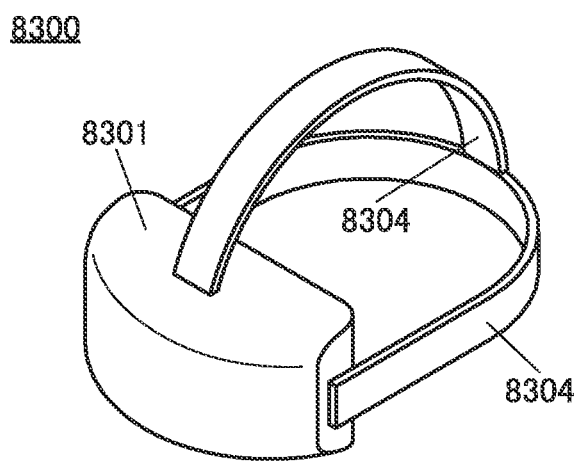
Figure 25D:
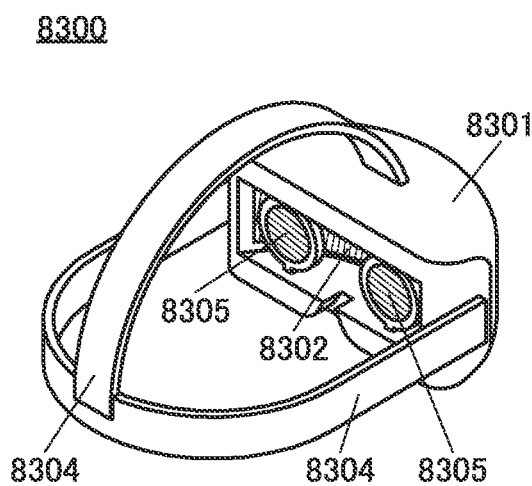
Figure 25E:
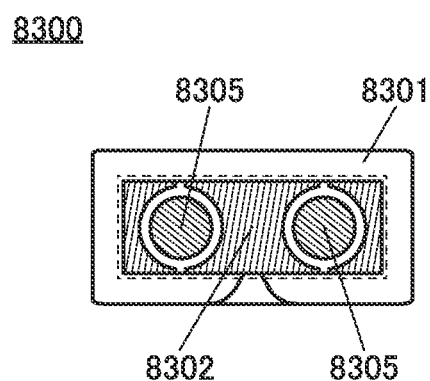

FIG. 25C, FIG. 25D, and FIG. 25E are diagrams showing the appearance of a head-mounted display 8300. The head-mounted display 8300 includes a housing 8301, a display portion 8302, a band-shaped fixing unit 8304, and a pair of lenses 8305.

The user can see display on the display portion 8302 through the lenses 8305. Note that the display portion 8302 is preferably arranged to be curved. When the display portion 8302 is arranged to be curved, the user can feel a high realistic sensation. Note that although the structure in which one display portion 8302 is provided is described in this embodiment as an example, the structure is not limited thereto, and two display portions 8302 may be provided, for example. In that case, one display portion is placed for one eye of the user, so that three-dimensional display using parallax or the like is possible.

Note that the semiconductor device of one embodiment of the present invention can be used in the display portion 8302. The semiconductor device of one embodiment of the present invention has extremely high definition; thus, even when an image is magnified using the lenses 8305 as in FIG. 25E, the user does not perceive pixels, and a more realistic image can be displayed.

Next, FIG. 26A to FIG. 26G illustrate examples of electronic devices that are different from the electronic devices illustrated in FIG. 25A to FIG. 25E.

The electronic devices illustrated in FIG. 26A to FIG. 26G include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 26A to FIG. 26G have a variety of functions. Examples include a function of displaying a variety of information (a still image, a moving image, a text image, and the like) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a memory medium and displaying it on the display portion. Note that functions that the electronic devices shown in FIG. 26A to FIG. 26G can have are not limited to those, and the electronic devices can have a variety of functions. Although not illustrated in FIG. 26A to FIG. 26G, the electronic devices may each include a plurality of display portions. The electronic devices may each include a camera and the like and have a function of taking a still image, a function of taking a moving image, a function of storing the taken image in a memory medium (external or incorporated in the camera), a function of displaying the taken image on the display portion, or the like.

The details of the electronic devices illustrated in FIG. 26A to FIG. 26G will be described below.

Figure 26A:
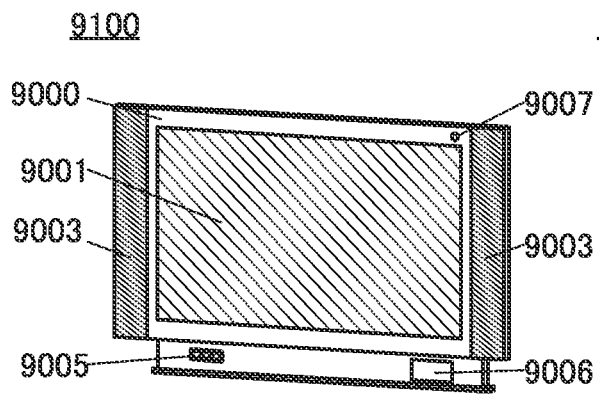
FIG. 26A, FIG. 26B, FIG. 26C, FIG. 26D, FIG. 26E, FIG. 26F, and FIG. 26G are diagrams illustrating examples of electronic devices.

FIG. 26A is a perspective view showing a television 9100. The television 9100 can include the display portion 9001 having a large screen size of, for example, 50 inches or more, or 100 inches or more.

The semiconductor device of one embodiment of the present invention can be used in the display portion 9001 included in the television 9100. Accordingly, the television 9100 can have a narrower frame, a high-quality image can be displayed on the display portion 9001, and a more realistic image can be displayed.

Figure 26D:
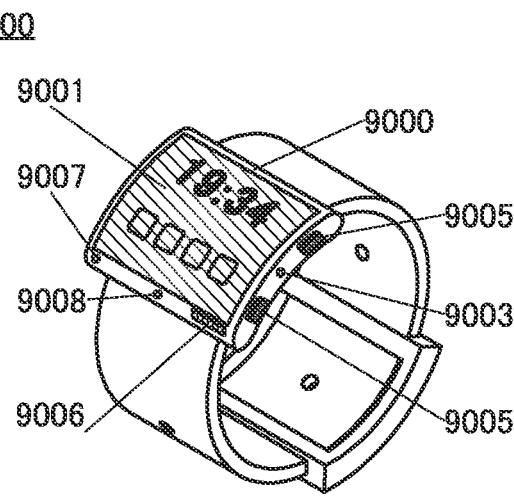
Figure 26B:
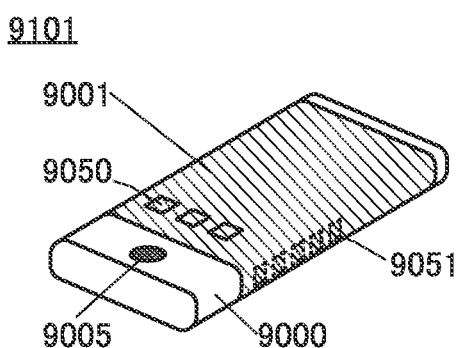

FIG. 26B is a perspective view showing a portable information terminal 9101. The portable information terminal 9101 functions as, for example, one or more selected from a telephone set, a notebook, an information browsing device, and the like. Specifically, the portable information terminal can be used as a smartphone. Note that the portable information terminal 9101 may be provided with the speaker 9003, the connection terminal 9006, the sensor 9007, or the like. The portable information terminal 9101 can display letters and images on its plurality of surfaces. For example, three operation buttons 9050 (also referred to as operation icons, or simply as icons) can be displayed on one surface of the display portion 9001. Information 9051 indicated by dashed rectangles can be displayed on another surface of the display portion 9001. Note that examples of the information 9051 include display indicating reception of an e-mail, an SNS (social networking service), a telephone call, and the like, the title of an e-mail, an SNS, or the like, the sender of an e-mail, an SNS, or the like, date, time, remaining battery, and reception strength of an antenna. Alternatively, the operation buttons 9050 or the like may be displayed on the position where the information 9051 is displayed, in place of the information 9051.

The semiconductor device of one embodiment of the present invention can be used in the display portion 9001 included in the portable information terminal 9101. Accordingly, the size of the portable information terminal 9101 can be reduced, a high-quality image can be displayed on the display portion 9001, and a more realistic image can be displayed.

Figure 26E:
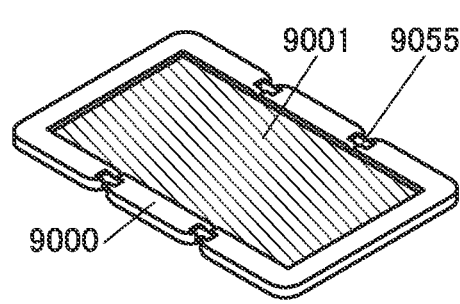
Figure 26C:
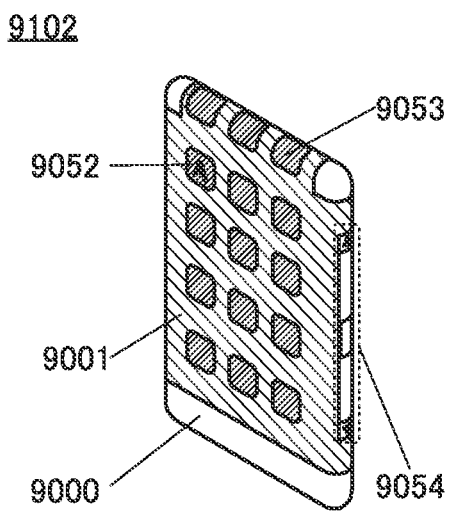

FIG. 26C is a perspective view showing a portable information terminal 9102. The portable information terminal 9102 has a function of displaying information on three or more surfaces of the display portion 9001. Here, an example in which information 9052, information 9053, and information 9054 are displayed on different surfaces is shown. For example, the user of the portable information terminal 9102 can see the display (here, the information 9053) with the portable information terminal 9102 put in a breast pocket of the clothes. Specifically, a caller's phone number, name, or the like of an incoming call is displayed in a position that can be seen from above the portable information terminal 9102. The user can see the display without taking out the portable information terminal 9102 from the pocket and decide whether to answer the call.

The semiconductor device of one embodiment of the present invention can be used in the display portion 9001 of the portable information terminal 9102. Accordingly, the size of the portable information terminal 9102 can be reduced, a high-quality image can be displayed on the display portion 9001, and a more realistic image can be displayed.

FIG. 26D is a perspective view showing a watch-type portable information terminal 9200. The portable information terminal 9200 is capable of executing a variety of applications such as mobile phone calls, e-mailing, reading and editing texts, music reproduction, Internet communication, and computer games. The display surface of the display portion 9001 is arranged to be curved, and display can be performed along the curved display surface. The portable information terminal 9200 can perform near field communication conformable to a communication standard. For example, mutual communication with a headset capable of wireless communication enables hands-free calling. The portable information terminal 9200 includes the connection terminal 9006, and data can be directly transmitted to and received from another information terminal via a connector. Power charging through the connection terminal 9006 is also possible. Note that the charging operation may be performed by wireless power feeding without through the connection terminal 9006.

The semiconductor device of one embodiment of the present invention can be used in the display portion 9001 of the portable information terminal 9200. Accordingly, the portable information terminal 9200 can have a narrower frame, a high-quality image can be displayed on the display portion 9001, and a more realistic image can be displayed.

Figure 26F:
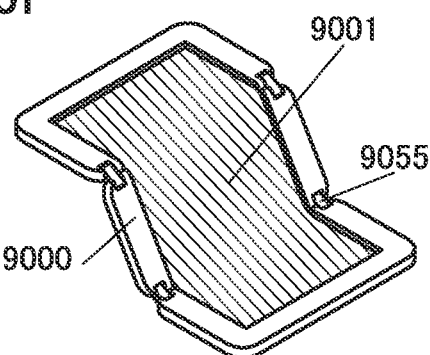
Figure 26G:
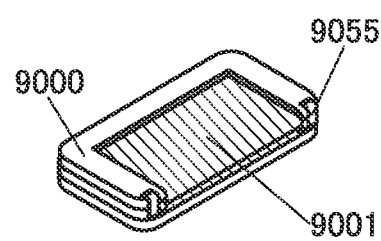

FIG. 26E, FIG. 26F, and (G) are perspective views showing a foldable portable information terminal 9201. FIG. 26E is a perspective view of the portable information terminal 9201 in the opened state, FIG. 26F is a perspective view of the portable information terminal 9201 that is shifted from one of the opened state and the folded state to the other, and FIG. 26G is a perspective view of the portable information terminal 9201 in the folded state. The portable information terminal 9201 is highly portable in the folded state and is highly browsable in the opened state because of a seamless large display region. The display portion 9001 included in the portable information terminal 9201 is supported by three housings 9000 joined by hinges 9055. By being folded at the hinges 9055 between two housings 9000, the portable information terminal 9201 can be reversibly changed in shape from the opened state to the folded state. For example, the portable information terminal 9201 can be bent with a radius of curvature of greater than or equal to 1 mm and less than or equal to 150 mm.

The semiconductor device of one embodiment of the present invention can be used in the display portion 9001 of the portable information terminal 9201. Accordingly, the portable information terminal 9201 can have a narrower frame, a high-quality image can be displayed on the display portion 9001, and a more realistic image can be displayed.

At least part of the structure examples, the drawings corresponding thereto, and the like described in this embodiment can be implemented in combination with the other structure examples, the other drawings, and the like as appropriate.

At least part of this embodiment can be implemented in combination with the other embodiments described in this specification as appropriate.

REFERENCE NUMERALS

AD1: analog-to-digital converter circuit, AM1: amplifier circuit, b11: data, b12: data, b21: data, b22: data, C1: capacitance, CLK: signal, CP1: comparator, CU1: current generator circuit, D: image data, DA1: digital-to-analog converter circuit, DA2: digital-to-analog converter circuit, Dat1: signal, DO1: signal, DR1: register, FO: signal, GL_0: signal, GL_1: signal, GO1: signal, IN1: terminal, IS: image signal, LB1: circuit, LC1: logic circuit, LIN: signal, MU1: multiplexer, MU2: demultiplexer, Mux1: signal, ND1: node, ND2: node, PWC: signal, R1: resistance, RES: signal, SE1: sensing circuit, SP: signal, SR: shift register circuit, SROUT: signal, Sw1: signal, SWC1: switch, UB1: circuit, x1: distance, 10: semiconductor device, 12: block, 12_y: block, 12_1: block, 12_2: block, 12_3: block, 12_4: block, 12_5: block, 12_6: block, 14: current adjustment portion, 16: circuit, 18: NAND circuit, 20: layer, 21: gate driver circuit, 22: source driver circuit, 22_x: source driver circuit, 22_1: source driver circuit, 22_2: source driver circuit, 22_3: source driver circuit, 22_4: source driver circuit, 22_5: source driver circuit, 30: layer, 31: wiring, 32: wiring, 33: pixel array, 34: pixel, 35: wiring, 35a: wiring, 35b: wiring, 37: region, 38: region, 40: circuit, 41: receiver circuit, 42: serial-to-parallel converter circuit, 43: buffer circuit, 44: shift register circuit, 45: latch circuit, 46: digital-to-analog converter circuit, 46a: potential generator circuit, 46b: logic circuit, 48: resistor, 49: pass transistor, 51: transistor, 52: transistor, 53: transistor, 54: transistor, 55: transistor, 56: transistor, 57: transistor, 58: transistor, 59: transistor, 60: transistor, 61: transistor, 62: transistor, 63: transistor, 64: capacitor, 65: capacitor, 66: capacitor, 67: source follower circuit, 200A: transistor, 200B: transistor, 200C: transistor, 205: conductor, 214: insulator, 216: insulator, 222: insulator, 224: insulator, 230: metal oxide, 230a: metal oxide, 230b: metal oxide, 230c: metal oxide, 240: conductor, 240a: conductor, 240b: conductor, 241: insulator, 241a: insulator, 241b: insulator, 242: conductor, 242a: conductor, 242b: conductor, 243a: region, 243b: region, 244: insulator, 250: insulator, 252: metal oxide, 254: insulator, 260: conductor, 260a: conductor, 260b: conductor, 270: insulator, 271: insulator, 272: insulator, 274: insulator, 280: insulator, 281: insulator, 301a: conductor, 301b: conductor, 305: conductor, 311: conductor, 313: conductor, 317: conductor, 321: lower electrode, 323: insulator, 325: upper electrode, 331: conductor, 333: conductor, 335: conductor, 337: conductor, 341: conductor, 343: conductor, 347: conductor, 351: conductor, 353: conductor, 355: conductor, 357: conductor, 361: insulator, 363: insulator, 403: element isolation layer, 405: insulator, 407: insulator, 409: insulator, 411: insulator, 413: insulator, 415: insulator, 417: insulator, 419: insulator, 421: insulator, 441: transistor, 443: conductor, 445: insulator, 447: semiconductor region, 449a: low-resistance region, 449b: low-resistance region, 451: conductor, 453: conductor, 455: conductor, 457: conductor, 459: conductor, 461: conductor, 463: conductor, 465: conductor, 467: conductor, 469: conductor, 471: conductor, 501: insulator, 503: insulator, 505: insulator, 507: insulator, 509: insulator, 550: transistor, 552: transistor, 554: transistor, 560: capacitor, 562: capacitor, 570: liquid crystal element, 572: light-emitting element, 601: transistor, 602: transistor, 603: transistor, 613: insulator, 614: insulator, 616: insulator, 622: insulator, 624: insulator, 644: insulator, 654: insulator, 674: insulator, 680: insulator, 681: insulator, 701: substrate, 705: substrate, 712: sealant, 716: FPC, 721: hole-injection layer, 722: hole-transport layer, 723: light-emitting layer, 724: electron-transport layer, 725: electron-injection layer, 730: insulator, 732: sealing layer, 734: insulator, 736: coloring layer, 738: light-blocking layer, 750: transistor, 760: connection electrode, 772: conductor, 774: conductor, 775: liquid crystal element, 776: liquid crystal layer, 778: component, 780: anisotropic conductor, 782: light-emitting element, 786: EL layer, 786a: EL layer, 786b: EL layer, 786c: EL layer, 788: conductor, 790: capacitor, 792: charge generation layer, 8000: camera, 8001: housing, 8002: display portion, 8003: operation button, 8004: shutter button, 8006: lens, 8100: finder, 8101: housing, 8102: display portion, 8103: button, 8200: head-mounted display, 8201: mounting portion, 8202: lens, 8203: main body, 8204: display portion, 8205: cable, 8206: battery, 8300: head-mounted display, 8301: housing, 8302: display portion, 8304: fixing unit, 8305: lens, 9000: housing, 9001: display portion, 9003: speaker, 9005: operation key, 9006: connection terminal, 9007: sensor, 9008: microphone, 9050: operation button, 9051: information, 9052: information, 9053: information, 9054: information, 9055: hinge, 9100: television, 9101: portable information terminal, 9102: portable information terminal, 9200: portable information terminal, 9201: portable information terminal

The invention claimed is:

1. A semiconductor device comprising:
a signal line comprising a first node and a second node;
a plurality of pixels electrically connected to the signal line and positioned between the first node and the second node;
an analog-to-digital converter circuit electrically connected to the first node and the second node;
a sensing circuit electrically connected to the analog-to-digital converter circuit; and
an amplifier circuit electrically connected to the first node and supplied with an image signal,
wherein the analog-to-digital converter circuit is configured to convert a potential of the first node into a first signal, and to convert a potential of the second node into a second signal,
wherein the sensing circuit is configured to generate a third signal by a comparison result of the first signal and the second signal, and
wherein the amplifier circuit is configured to amplify the image signal in accordance with the third signal, and to output an amplified image signal to the first node.

2. The semiconductor device according to claim 1,
wherein each of the plurality of pixels comprises a transistor comprising a metal oxide in a channel formation region, and
wherein the metal oxide comprises an element M and Zn; where M is Al, Ga, Y, or Sn.

3. The semiconductor device according to claim 1,
wherein each of the plurality of pixels comprises a display element.

4. The semiconductor device according to claim 1,
wherein at least one of the analog-to-digital converter circuit, the sensing circuit, and the amplifier circuit comprises a transistor comprising silicon in a channel formation region.

5. The semiconductor device according to claim 1,
wherein at least one of the analog-to-digital converter circuit, the sensing circuit, and the amplifier circuit comprises a region overlapping with at least one of the plurality of pixels.

6. The semiconductor device according to claim 1,
wherein a first input terminal of the analog-to-digital converter circuit is electrically connected to the first node,
wherein a second input terminal of the analog-to-digital converter circuit is electrically connected to the second node, and
wherein an output terminal of the analog-to-digital converter circuit is electrically connected to the sensing circuit.

7. The semiconductor device according to claim 1,
wherein a first input terminal of the amplifier circuit is supplied with the image signal,
wherein a second input terminal of the amplifier circuit is supplied with the third signal, and
wherein an output terminal of the amplifier circuit is electrically connected to the first node.

\* \* \* \* \*